US012811100B2

(12) United States Patent
Nagashima et al.

(10) Patent No.: US 12,811,100 B2
(45) Date of Patent: Nov. 24, 2026

(54) PLASMA PROCESSING APPARATUS

(71) Applicant: Tokyo Electron Limited, Tokyo (JP)

(72) Inventors: Nozomu Nagashima, Miyagi (JP); Daisuke Yoshikoshi, Miyagi (JP); Kunihiko Yamagata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 19 days.

(21) Appl. No.: 19/003,264

(22) Filed: Dec. 27, 2024

(65) Prior Publication Data

US 2025/0149308 A1 May 8, 2025

Related U.S. Application Data

(63) Continuation of application No. PCT/JP2023/017795, filed on May 11, 2023.

(Continued)

(51) Int. Cl.
*H01J 37/32* (2006.01)

(52) U.S. Cl.
CPC .. *H01J 37/32174* (2013.01); *H01J 37/32091* (2013.01); *H01J 37/3211* (2013.01);
(Continued)

(58) Field of Classification Search
CPC ........... H01J 37/32174; H01J 37/32091; H01J 37/3211; H01J 37/32146; H01J 37/32568; H01J 37/32651; H01J 2237/334; H01J 37/321; H01J 37/32577; H01J 37/32; H01J 37/32183; H01J 37/32697; H01J 37/32724; H01J 37/32715; H05H 1/46; H10P 14/60; H10P 50/00; H02J 7/90; H02J 50/10
See application file for complete search history.

(56) References Cited

U.S. PATENT DOCUMENTS

| | | | | |
|---|---|---|---|---|
| 2015/0138031 A1 | 5/2015 | Van Gils et al. | | |
| 2021/0118706 A1* | 4/2021 | Morita | .............. | H01J 37/32715 |
| 2025/0232956 A1* | 7/2025 | Nagashima | ....... | H01J 37/32183 |

FOREIGN PATENT DOCUMENTS

| | | | | |
|---|---|---|---|---|
| CN | 201754646 U * | 3/2011 | | |
| JP | 2001118700 A * | 4/2001 | ........ | H01J 37/32174 |

(Continued)

OTHER PUBLICATIONS

International Search Report and Written Opinion mailed on Jun. 27, 2023, received for PCT Application PCT/JP2023/017795, filed on May 11, 2023, 9 pages including English Translation.

*Primary Examiner* — Adam D Houston
(74) *Attorney, Agent, or Firm* — XSENSUS LLP

(57) ABSTRACT

A plasma processing apparatus comprises a plasma processing chamber, a substrate support, a high frequency power supply, an electrode or an antenna, a power consuming member, an electricity storage unit, a power transmitting coil, a power receiving coil and at least one driving system. The power transmitting coil is provided outside the plasma processing chamber. The power receiving coil is electrically connected to the electricity storage unit and capable of receiving power from the power transmitting coil by electromagnetic induction coupling. The at least one driving system is configured to change a distance between the power transmitting coil and the power receiving coil by moving at least one of the power transmitting coil and the power receiving coil.

19 Claims, 80 Drawing Sheets

Related U.S. Application Data

(60) Provisional application No. 63/356,713, filed on Jun. 29, 2022.

(52) U.S. Cl.
CPC .. *H01J 37/32146* (2013.01); *H01J 37/32568* (2013.01); *H01J 37/32651* (2013.01); *H01J 2237/334* (2013.01)

(56) References Cited

FOREIGN PATENT DOCUMENTS

| | | | | | |
|---|---|---|---|---|---|
| JP | 2013055129 | A | | 3/2013 | |
| JP | 2015-173027 | A | | 10/2015 | |
| JP | 2017054646 | A | * | 3/2017 | |
| KR | 102924247 | B1 | * | 2/2026 | ............... H01Q 1/26 |
| TW | 202549422 | A | * | 12/2025 | ............... H05H 1/46 |
| WO | 2014132518 | A1 | | 9/2014 | |
| WO | WO-2024070848 | A1 | * | 4/2024 | ........ H01J 37/32174 |
| WO | WO-2024102229 | A1 | * | 5/2024 | .......... H01J 37/3299 |
| WO | WO-2025126436 | A1 | * | 6/2025 | ............... H05H 1/46 |
| WO | WO-2025126437 | A1 | * | 6/2025 | ............... H05H 1/46 |
| WO | WO-2025126437 | A9 | * | 8/2025 | ............... H05H 1/46 |

* cited by examiner

PLASMA PROCESSING APPARATUS

CROSS-REFERENCE TO RELATED APPLICATIONS

This application is a bypass continuation application of International Application No. PCT/JP2023/017795 having an international filing date of May 11, 2023 and designating the United States, the International Application being based upon and claiming the benefit of priority from the U.S. Provisional Patent Application No. 63/356,713 filed on Jun. 29, 2022, the entire contents of each are incorporated herein by reference.

TECHNICAL FIELD

An exemplary embodiment of the present disclosure relates to a plasma processing apparatus.

BACKGROUND

The plasma processing apparatus is used in the plasma processing. The plasma processing apparatus includes a chamber and a substrate support (mounting table) disposed within the chamber. The substrate support has a base (lower electrode) and an electrostatic chuck that holds a substrate. A temperature adjustment element (for example, a heater) for adjusting the temperature of the substrate is provided inside the electrostatic chuck. In addition, a filter is provided between the temperature adjustment element and a power supply for the temperature adjustment element to attenuate or block high frequency noise entering lines such as power-feeding lines and/or signal wires from high frequency electrodes and/or other electrical members within the chamber. One type of such plasma processing apparatus is disclosed in Japanese Laid-open Patent Publication No. 2015-173027.

SUMMARY

An exemplary embodiment of the present disclosure provides a technology capable of improving the efficiency of power transmission between a power transmitting coil and a power receiving coil and suppressing high frequency noise.

According to an exemplary embodiment, a plasma processing apparatus is provided. The plasma processing apparatus comprises a plasma processing chamber, a substrate support, a high frequency power supply, an electrode or an antenna, a power consuming member, an electricity storage unit, a power transmitting coil, a power receiving coil and at least one driving system. The substrate support is disposed within the plasma processing chamber. The high frequency power supply is configured to generate high frequency power. The electrode or the antenna is electrically connected to the high frequency power supply to receive the high frequency power so as to generate plasma from gas within the plasma processing chamber. The power consuming member is disposed within the plasma processing chamber or the substrate support. The electricity storage unit is electrically connected to the power consuming member. The power transmitting coil is provided outside the plasma processing chamber. The power receiving coil is electrically connected to the electricity storage unit and capable of receiving power from the power transmitting coil by electromagnetic induction coupling. The at least one driving system is configured to change a distance between the power transmitting coil and the power receiving coil by moving at least one of the power transmitting coil and the power receiving coil.

Figure 23A:
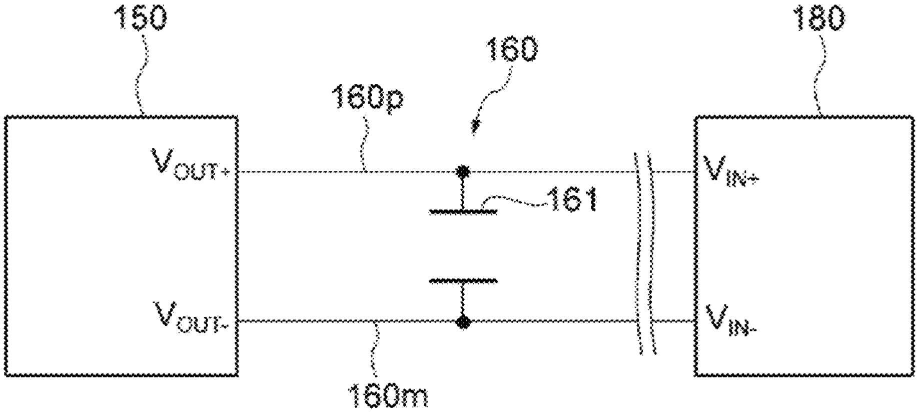
Figure 23B:
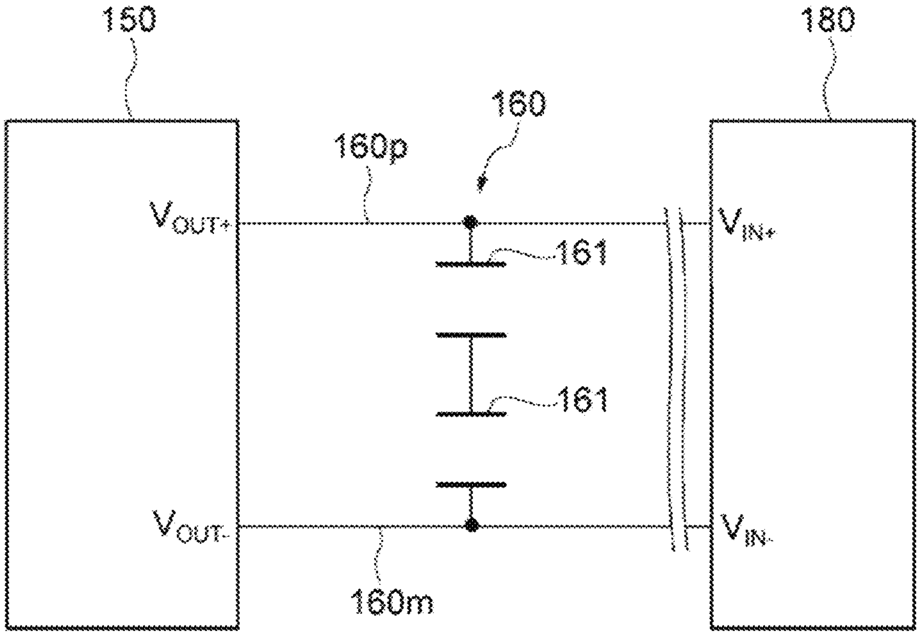

Each of FIGS. 23A and 23B is a diagram illustrating an electricity storage unit according to one exemplary embodiment.

Figure 24:
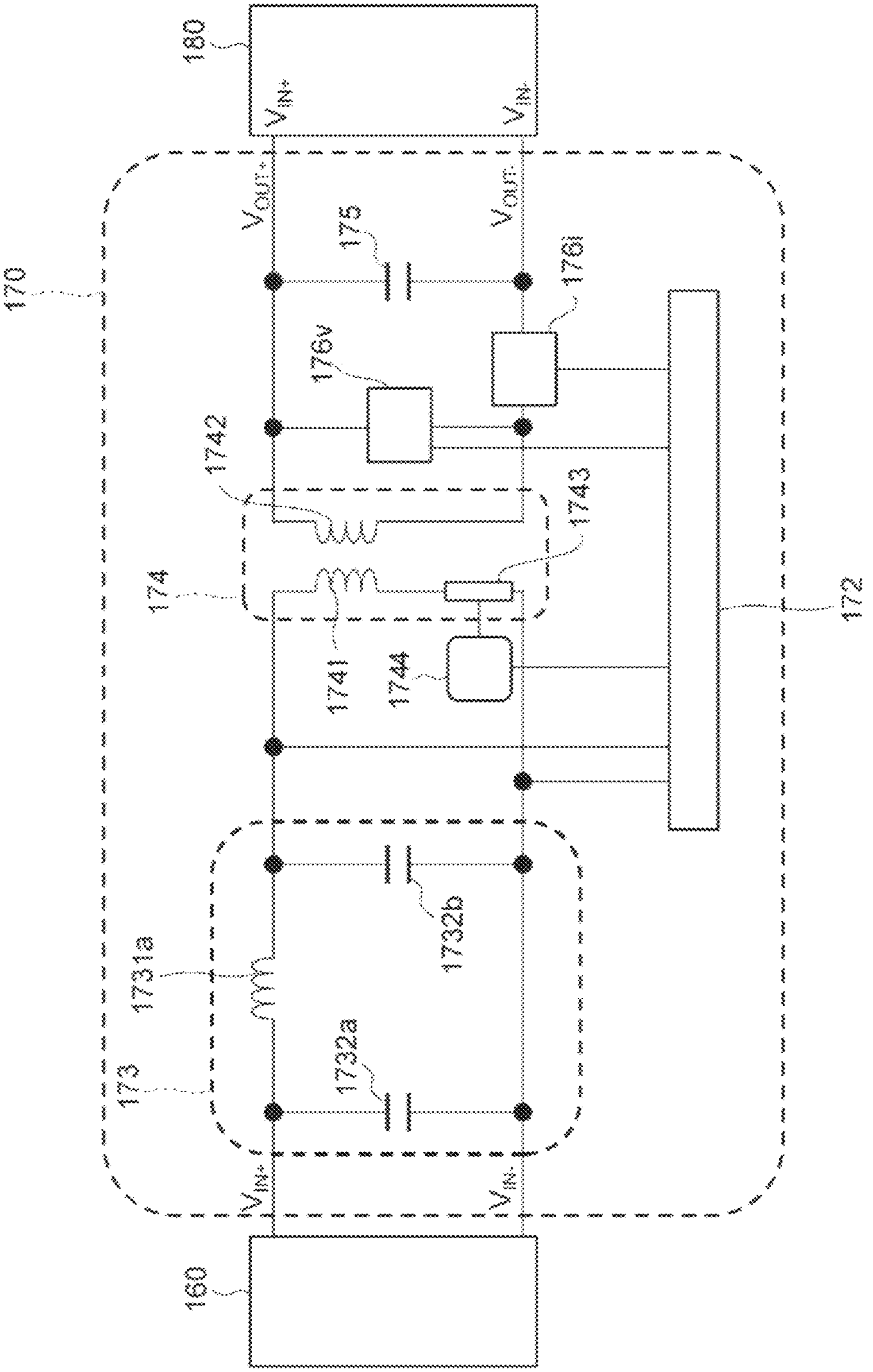

FIG. 24 is a diagram illustrating a voltage control converter according to one exemplary embodiment.

Figure 25:
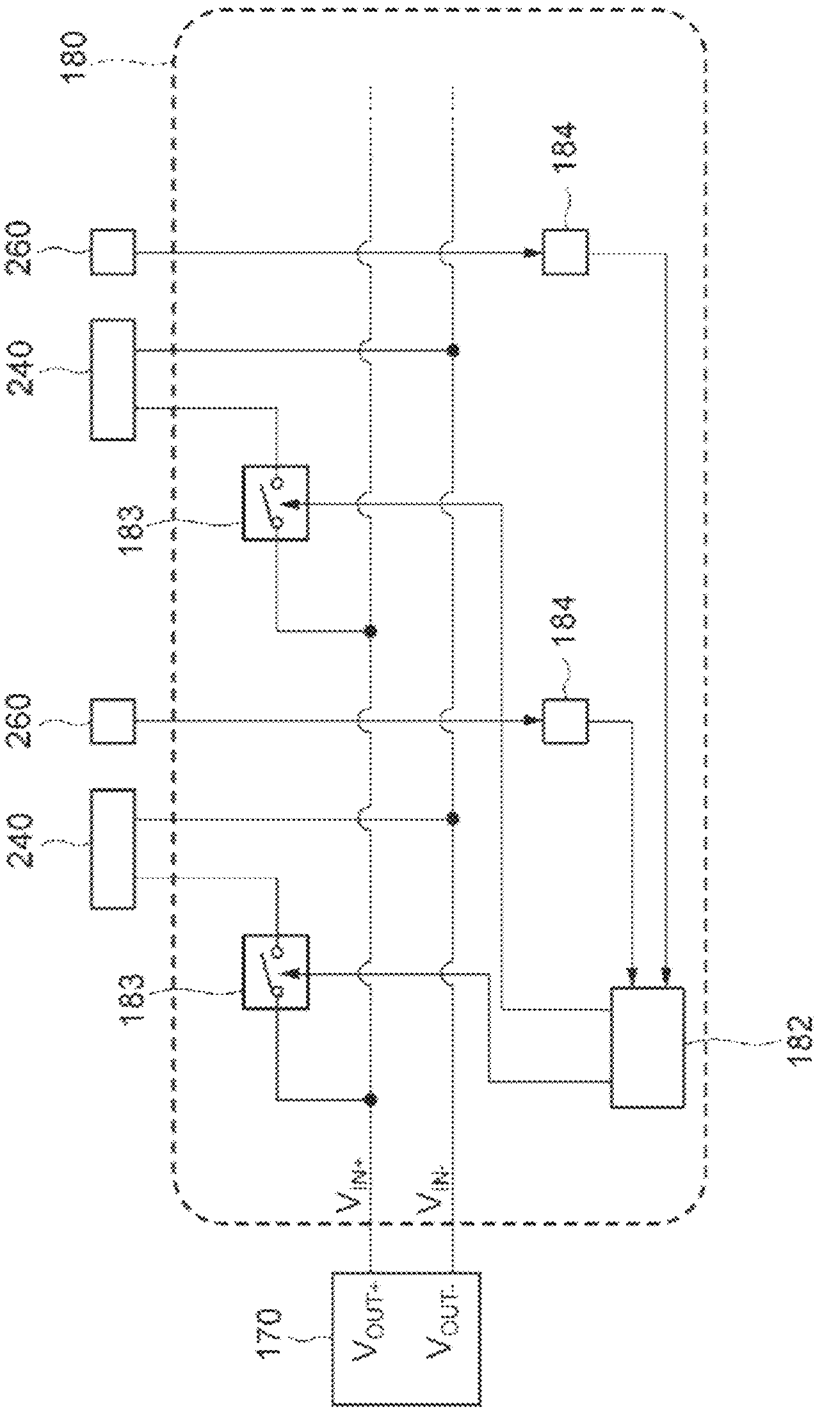

FIG. 25 is a diagram illustrating a constant voltage controller according to one exemplary embodiment.

Figure 26:
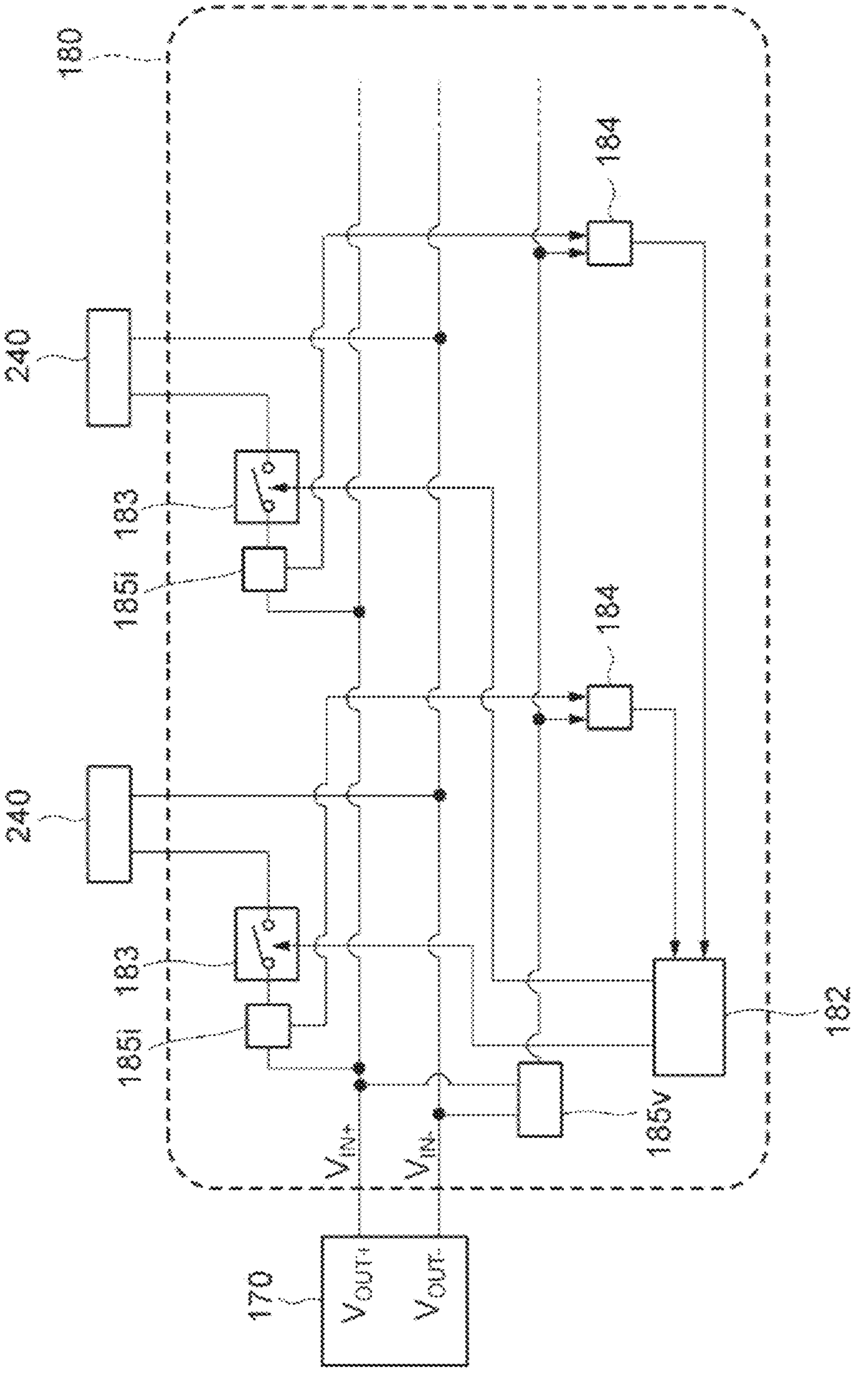

FIG. 26 is a diagram illustrating a constant voltage controller according to another exemplary embodiment.

Figure 27:
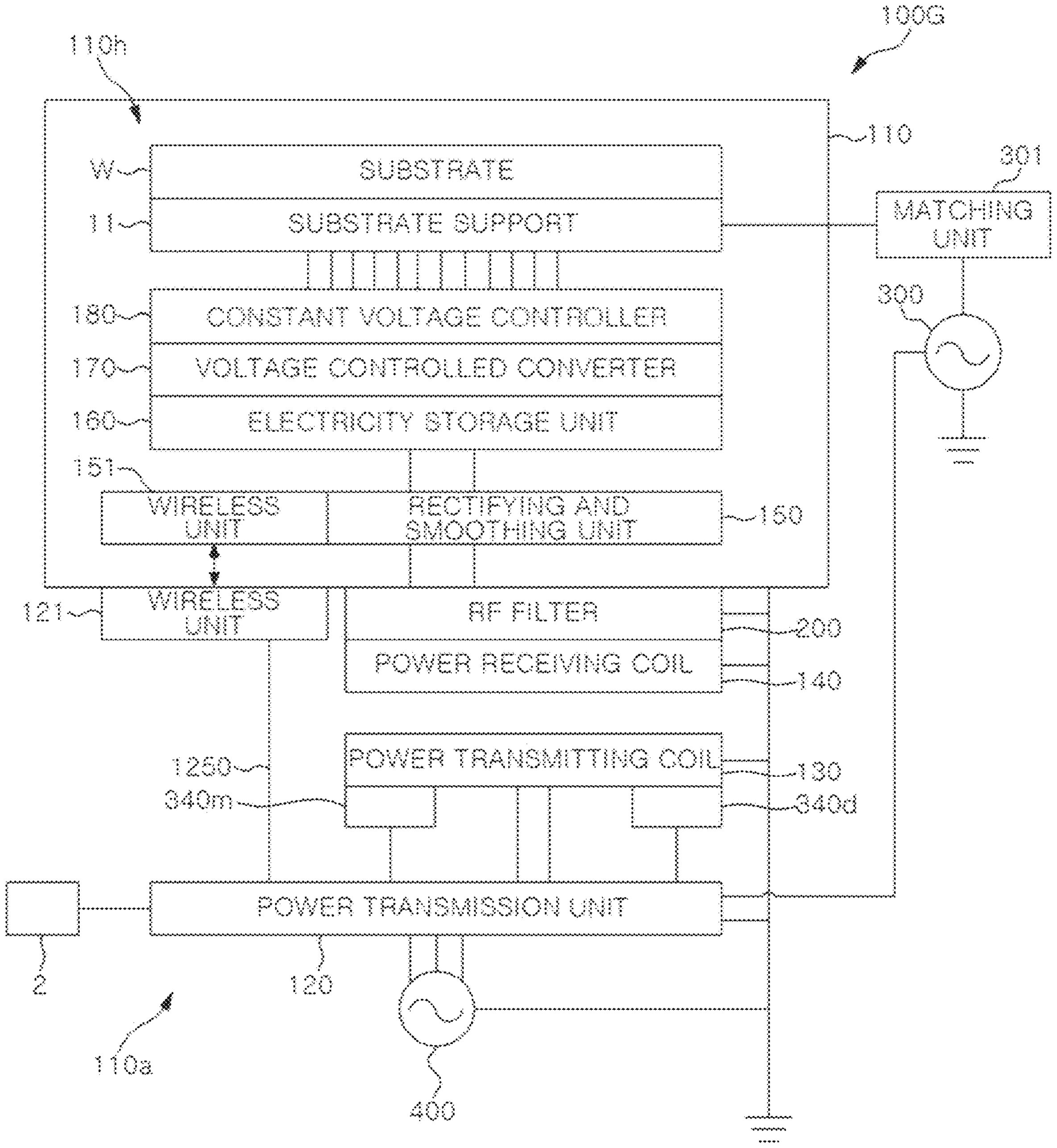

FIG. 27 is a diagram schematically illustrating a plasma processing apparatus according to yet another exemplary embodiment.

Figure 28:
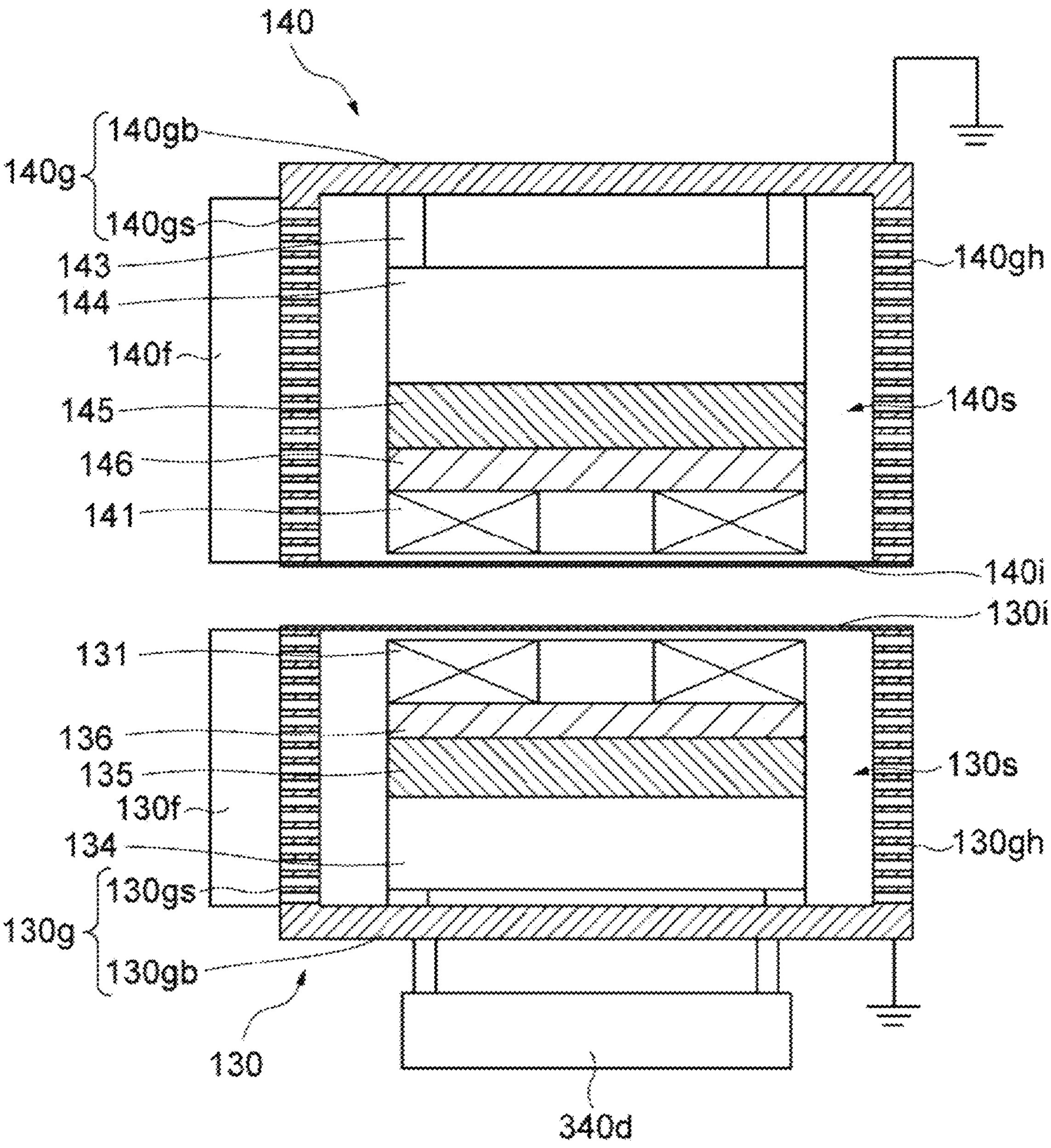

FIG. 28 is a diagram illustrating a power transmitting coil unit and a power receiving coil unit according to another exemplary embodiment.

Figure 29:
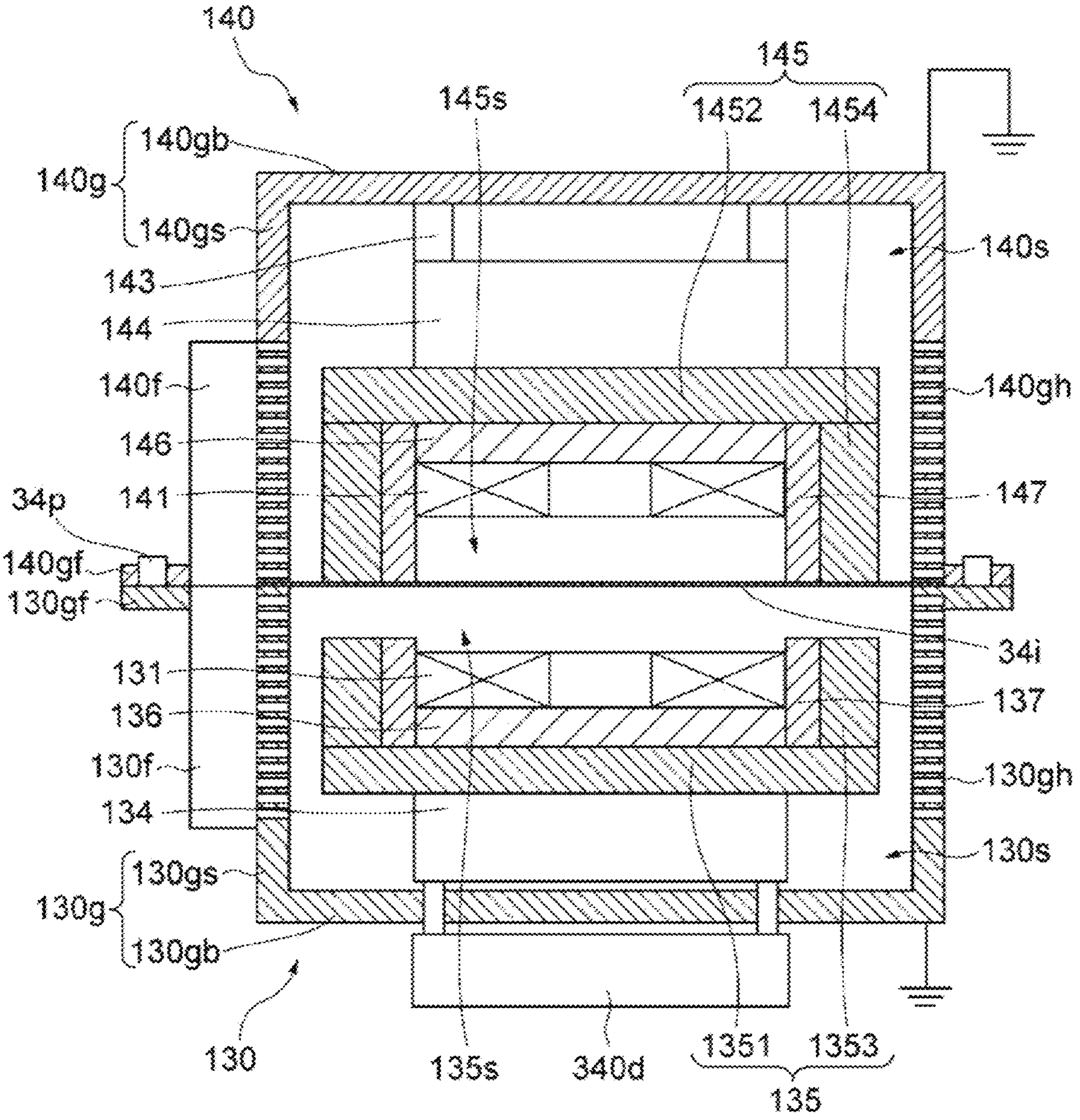

FIG. 29 is a diagram illustrating a power transmitting coil unit and a power receiving coil unit according to yet another exemplary embodiment.

Figure 30:
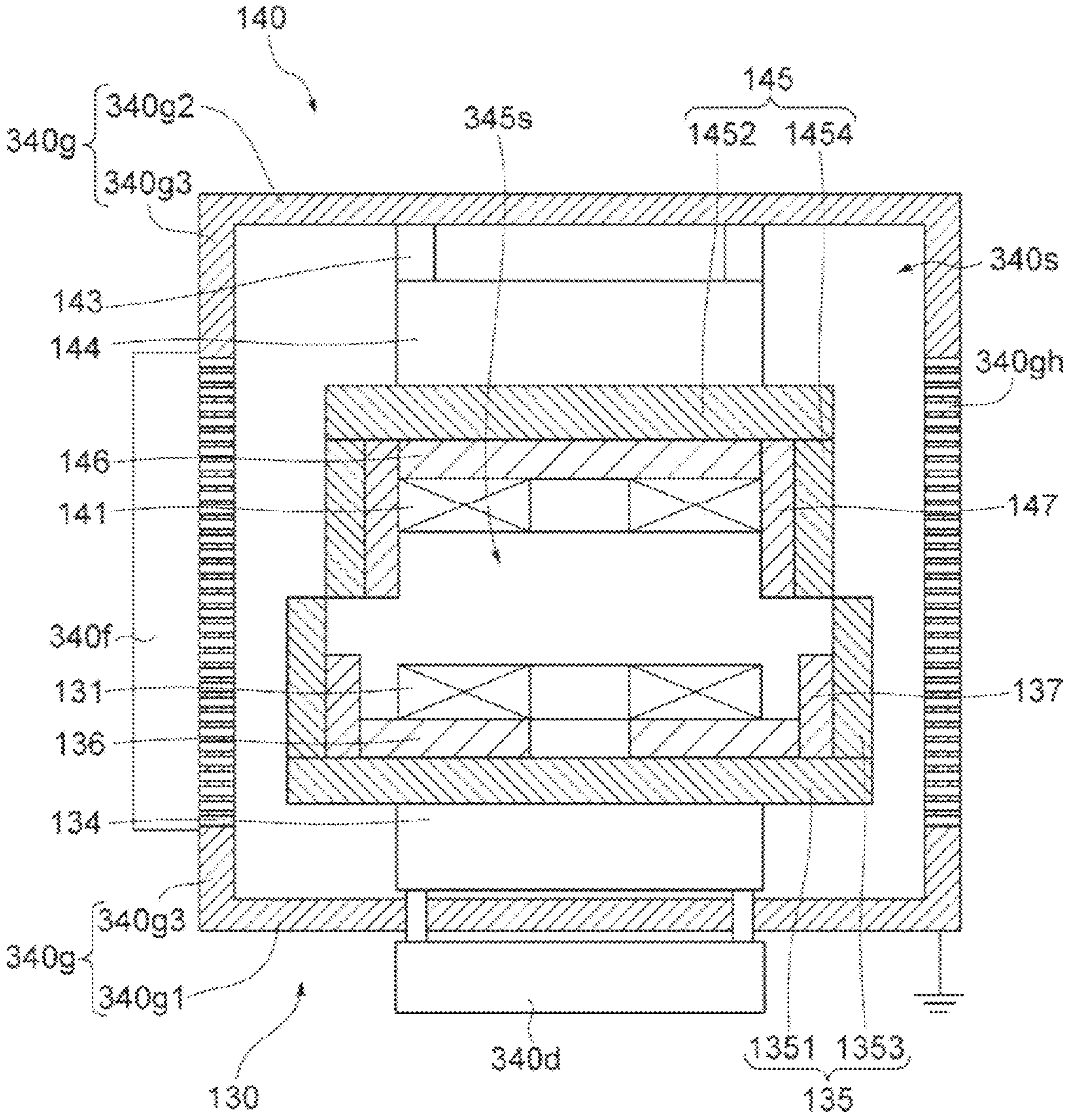

FIG. 30 is a diagram illustrating a power transmitting coil unit and a power receiving coil unit according to yet another exemplary embodiment.

Figure 31:
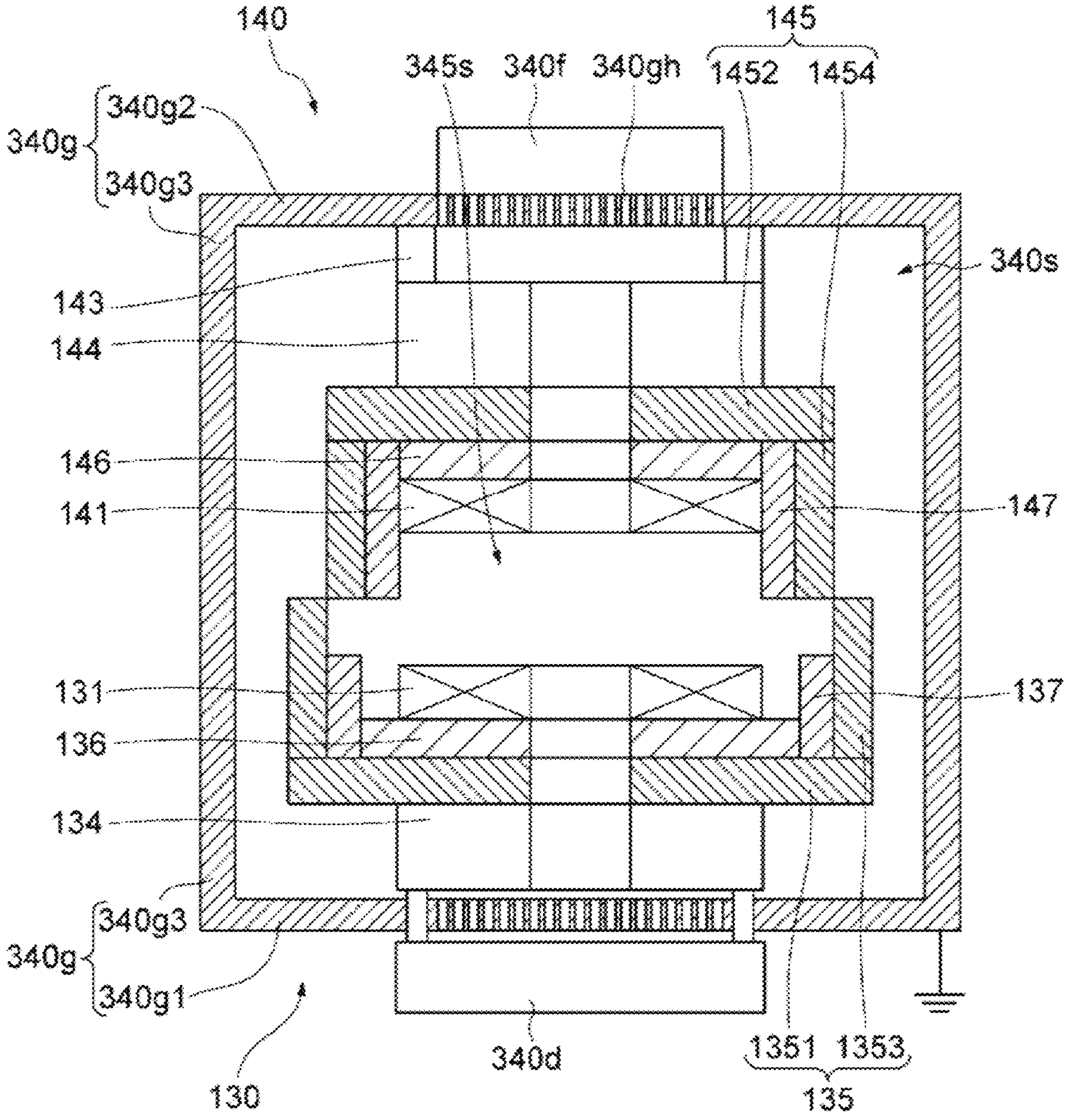

FIG. 31 is a diagram illustrating a power transmitting coil unit and a power receiving coil unit according to yet another exemplary embodiment.

Figure 32:
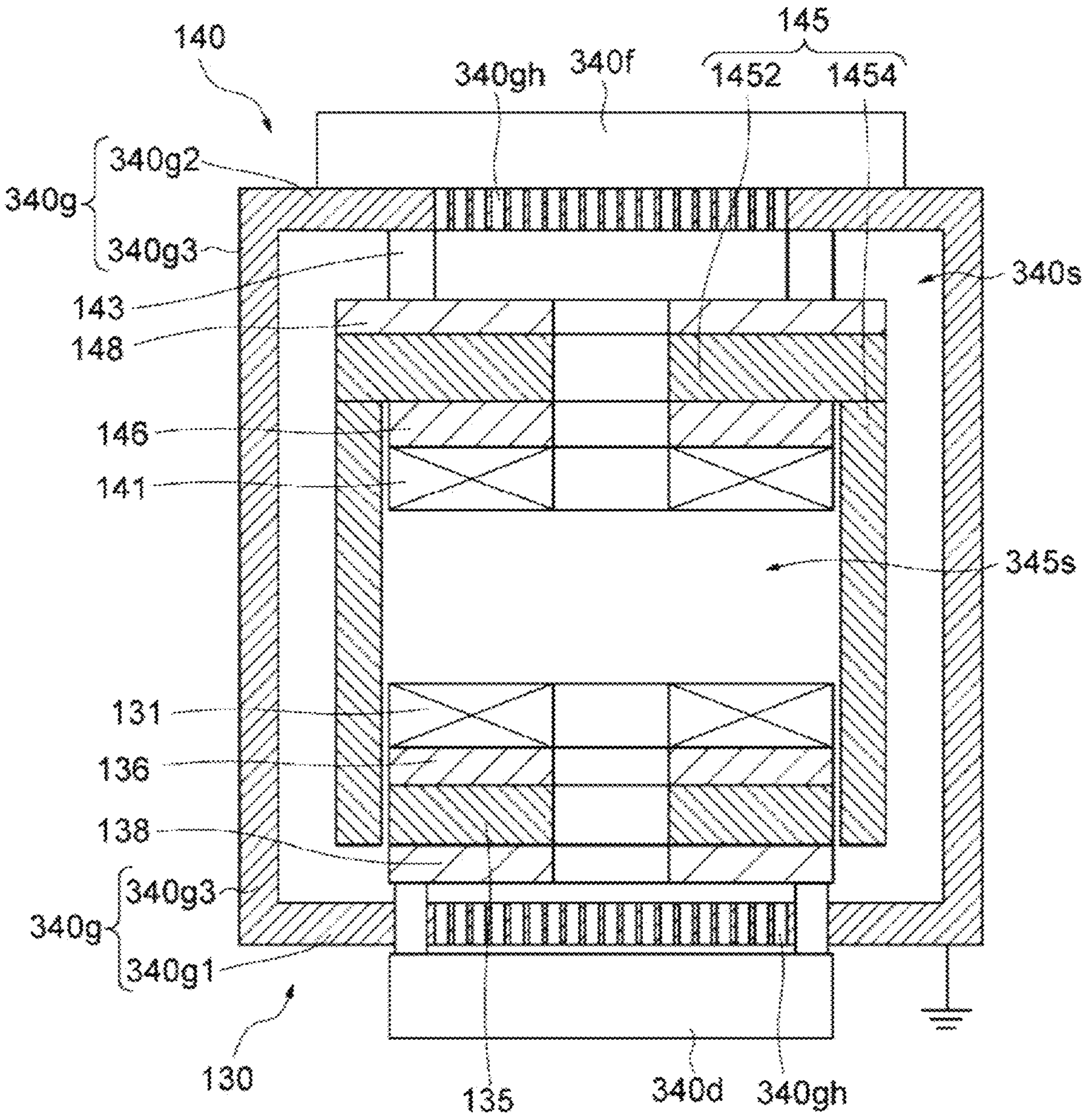

FIG. 32 is a diagram illustrating a power transmitting coil unit and a power receiving coil unit according to yet another exemplary embodiment.

Figure 33:
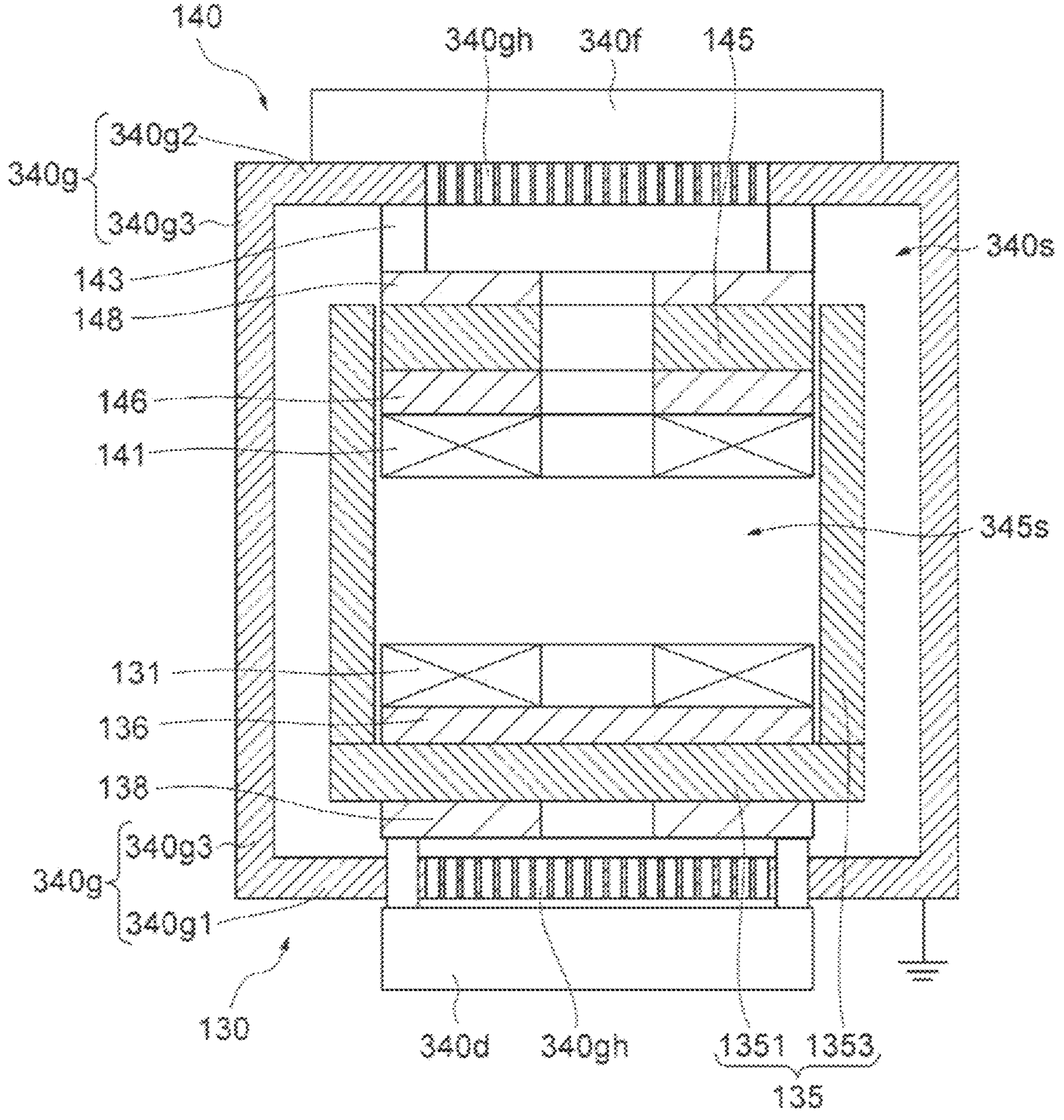

FIG. 33 is a diagram illustrating a power transmitting coil unit and a power receiving coil unit according to yet another exemplary embodiment.

Figure 34:
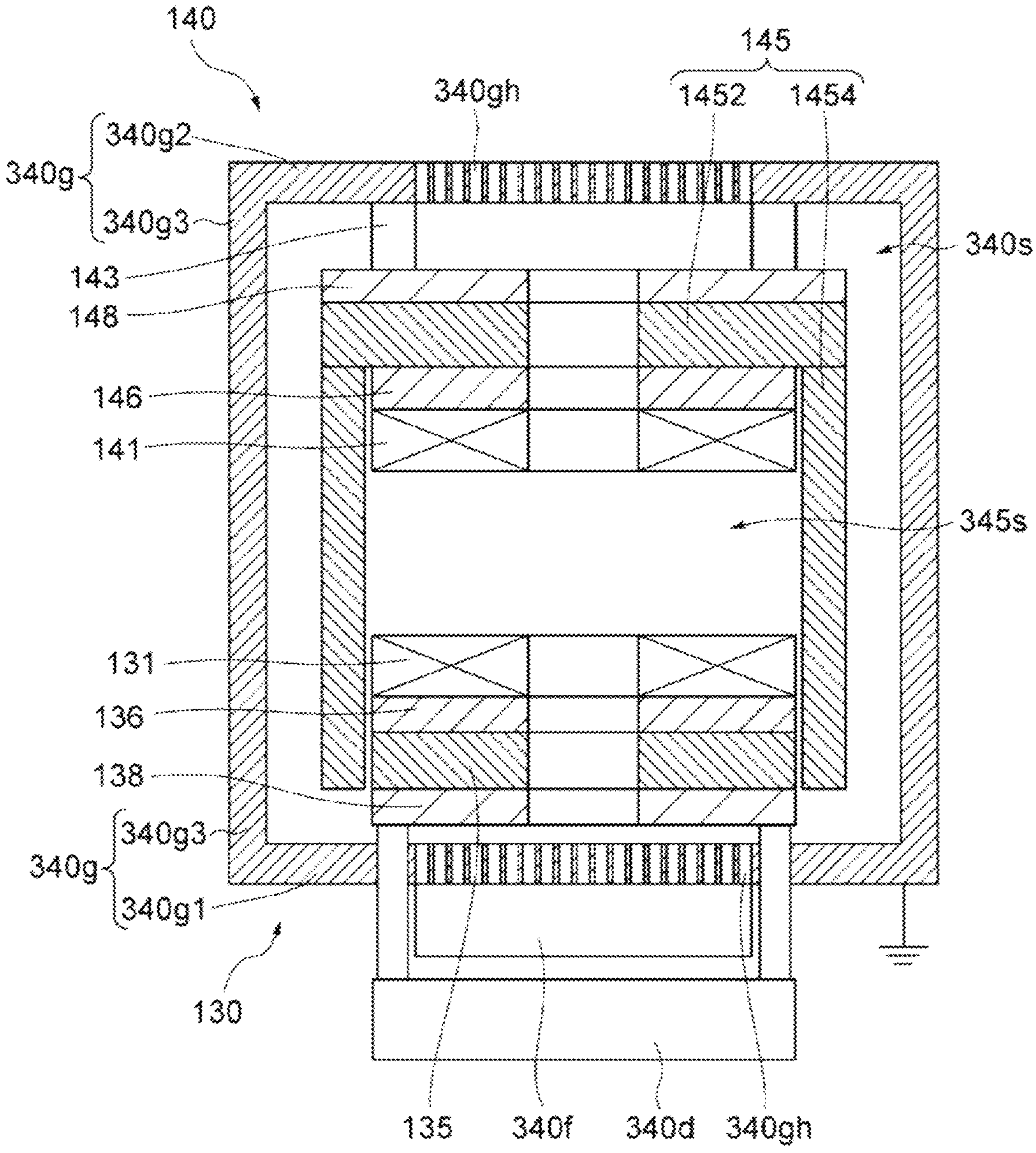

FIG. 34 is a diagram illustrating a power transmitting coil unit and a power receiving coil unit according to yet another exemplary embodiment.

Figure 35:
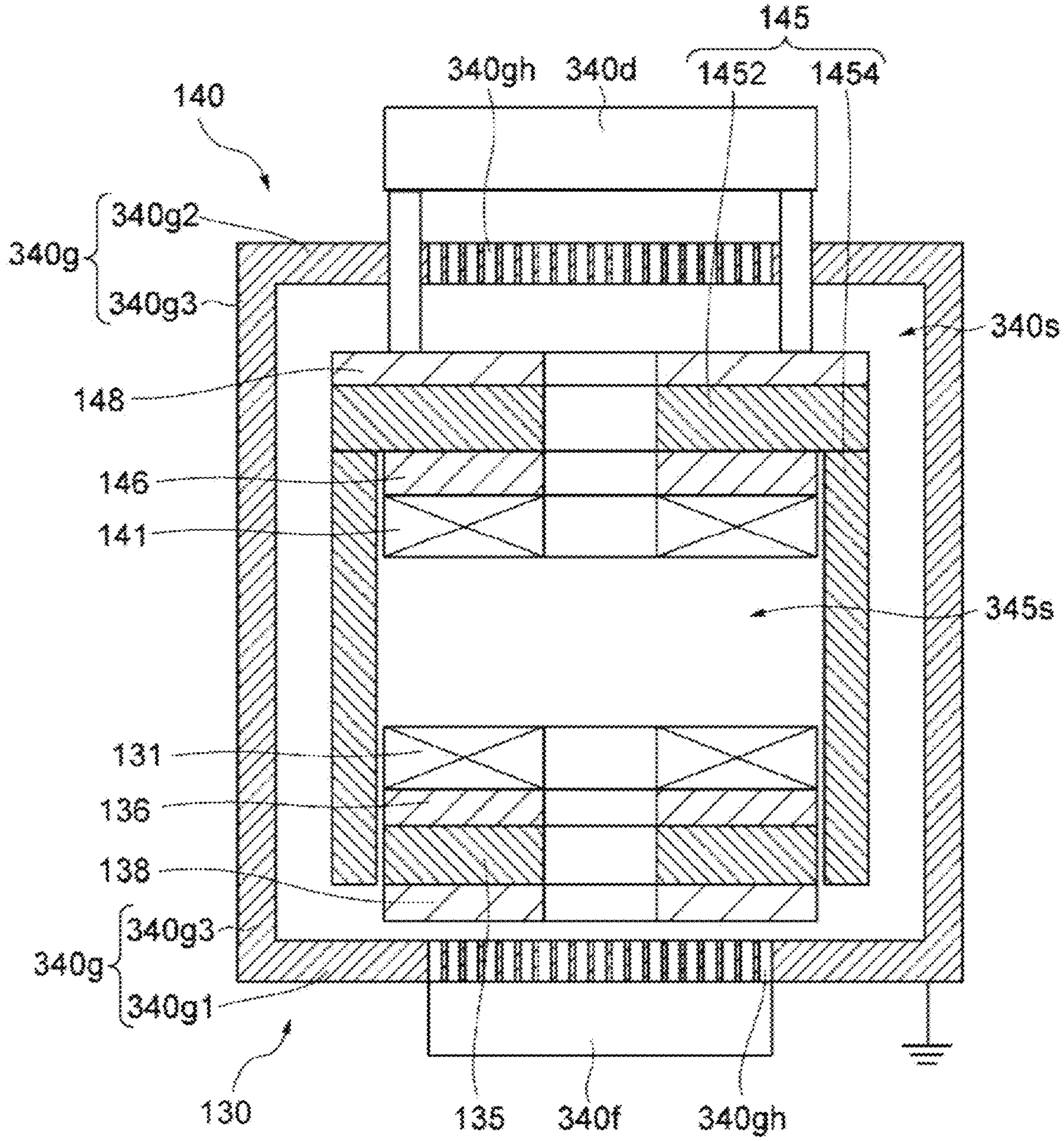

FIG. 35 is a diagram illustrating a power transmitting coil unit and a power receiving coil unit according to yet another exemplary embodiment.

Figure 36:
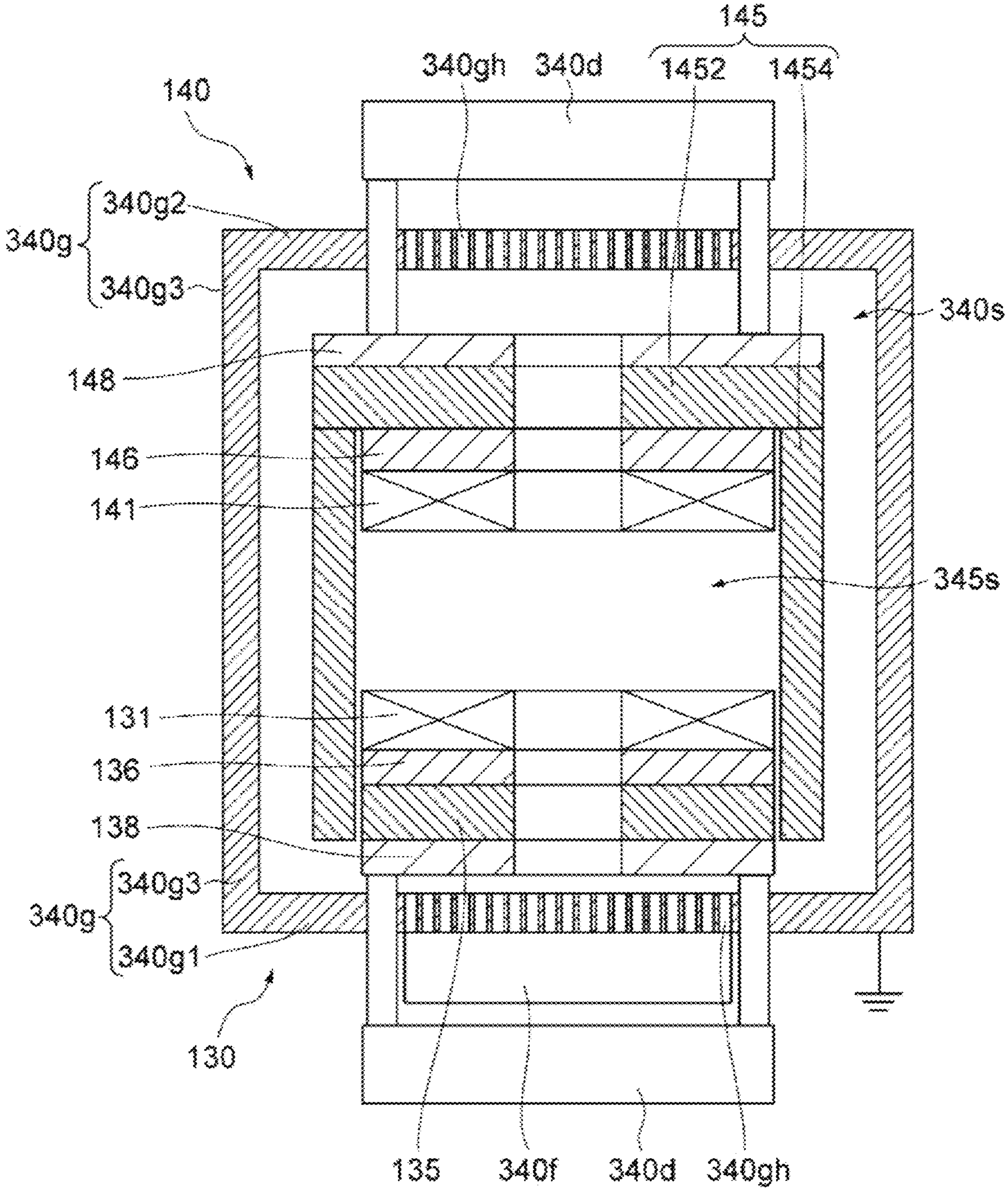

FIG. 36 is a diagram illustrating a power transmitting coil unit and a power receiving coil unit according to yet another exemplary embodiment.

Figure 37:
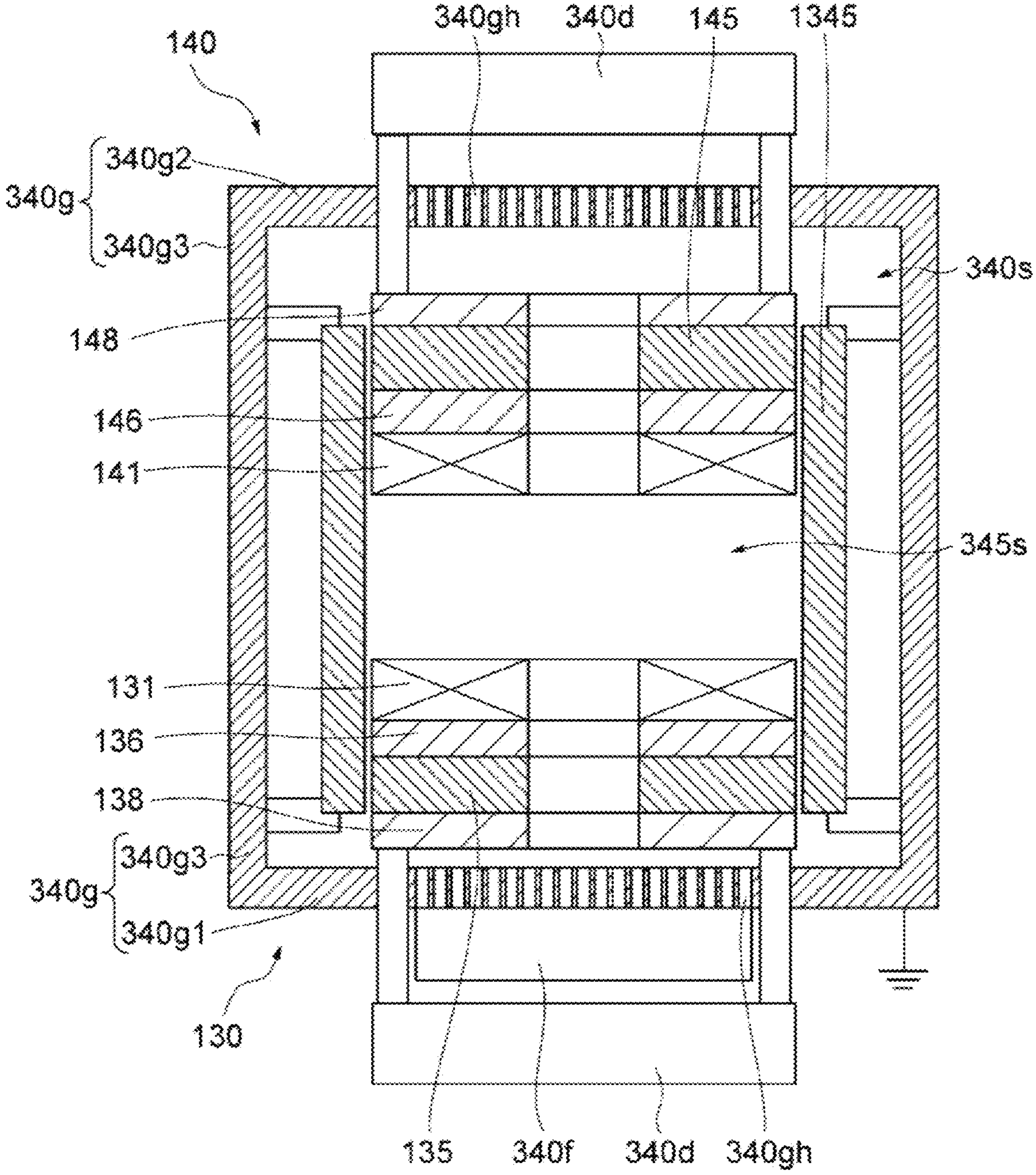

FIG. 37 is a diagram illustrating a power transmitting coil unit and a power receiving coil unit according to yet another exemplary embodiment.

Figure 38:
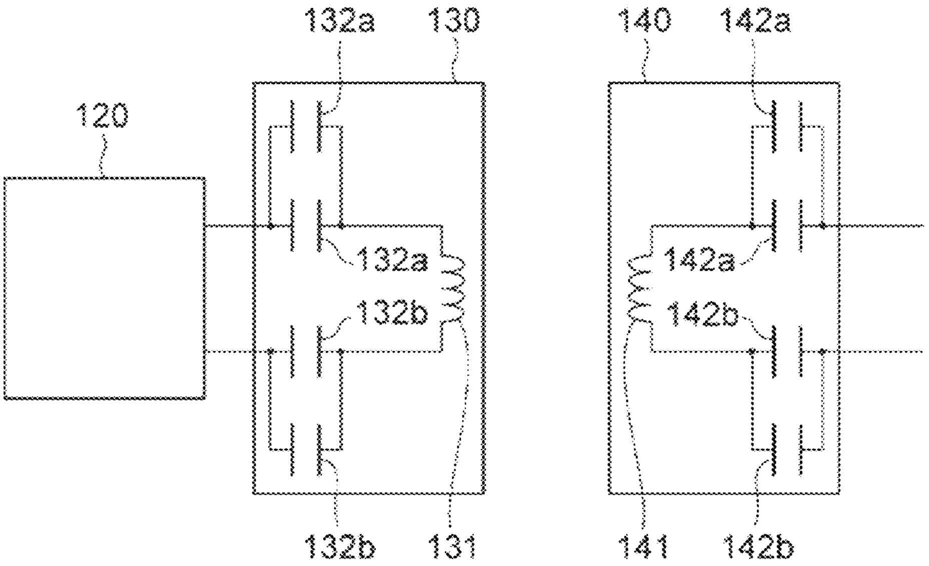

FIG. 38 is a diagram illustrating a power transmitting coil unit and a power receiving coil unit according to yet another exemplary embodiment.

Figure 39A:
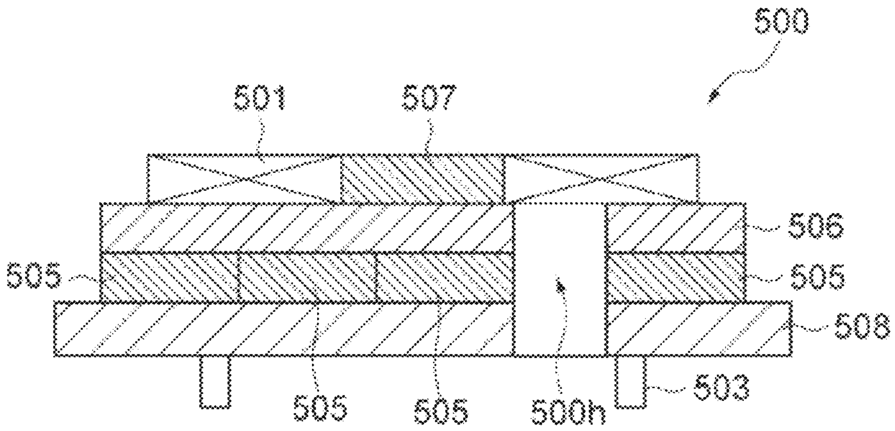
Figure 39B:
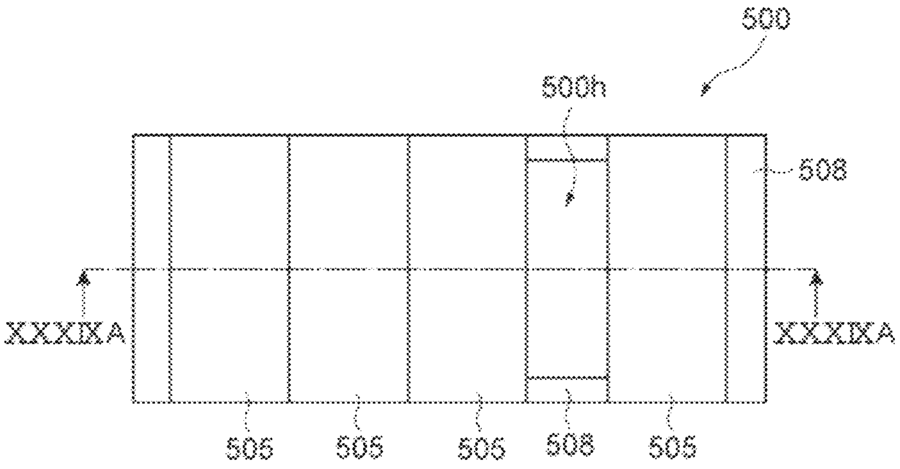

FIG. 39A is a sectional view of a coil unit according to one exemplary embodiment, and FIG. 39B is a plan view illustrating a plurality of ferrite materials provided between a base plate and a thermally conductive sheet in the coil unit illustrated in FIG. 39A.

Figure 40A:
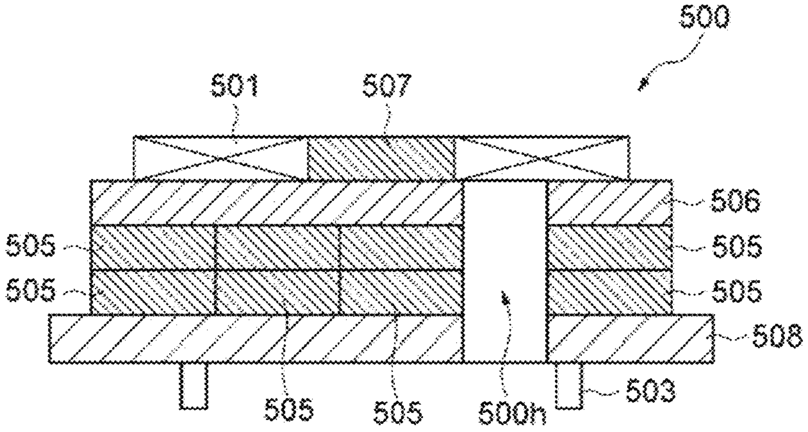
Figure 40B:
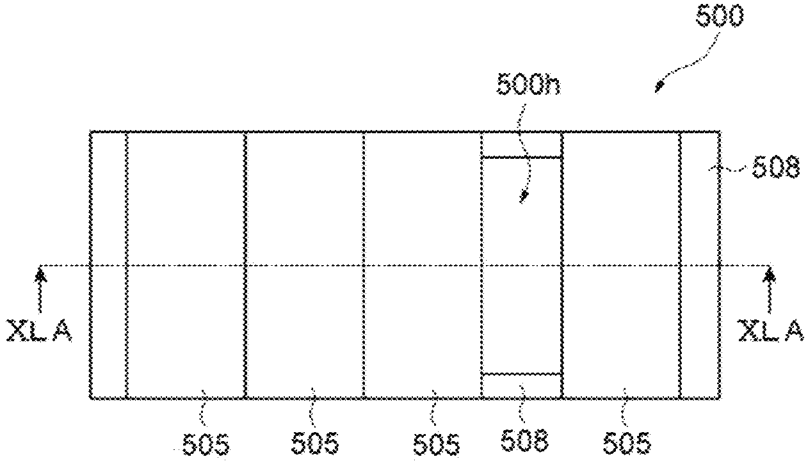

FIG. 40A is a sectional view of a coil unit according to another exemplary embodiment, and FIG. 40B is a plan view illustrating a plurality of ferrite materials provided between a base plate and a thermally conductive sheet in the coil unit illustrated in FIG. 40A.

Figure 41A:
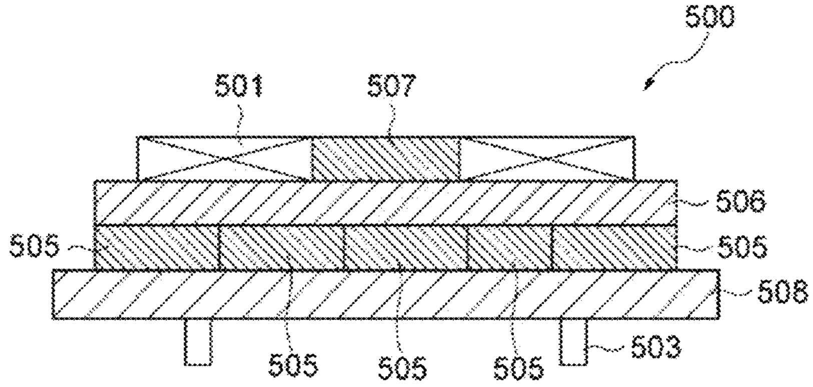
Figure 41B:
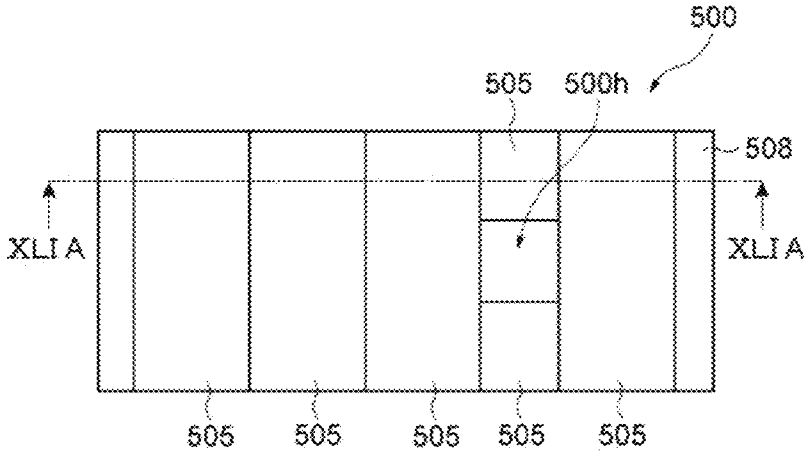

FIG. 41A is a sectional view of a coil unit according to yet another exemplary embodiment, and FIG. 41B is a plan view illustrating a plurality of ferrite materials provided between a base plate and a thermally conductive sheet in the coil unit illustrated in FIG. 41A.

Figure 42A:
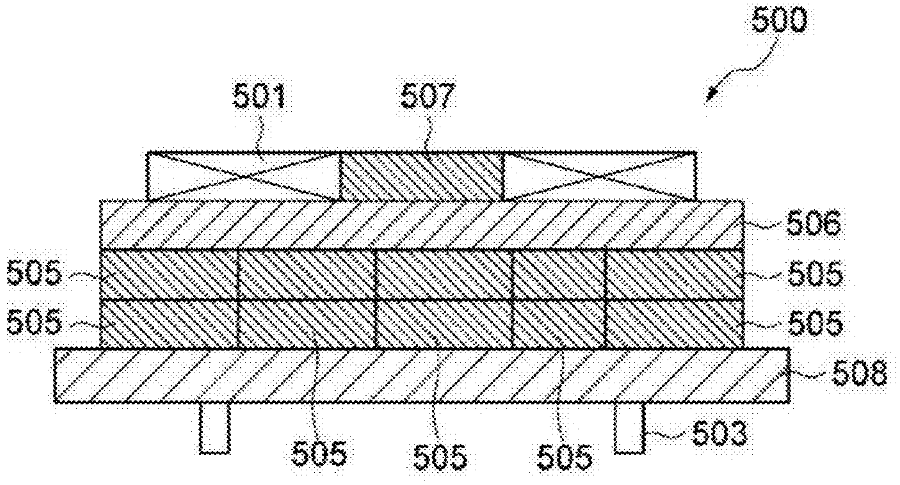
Figure 42B:
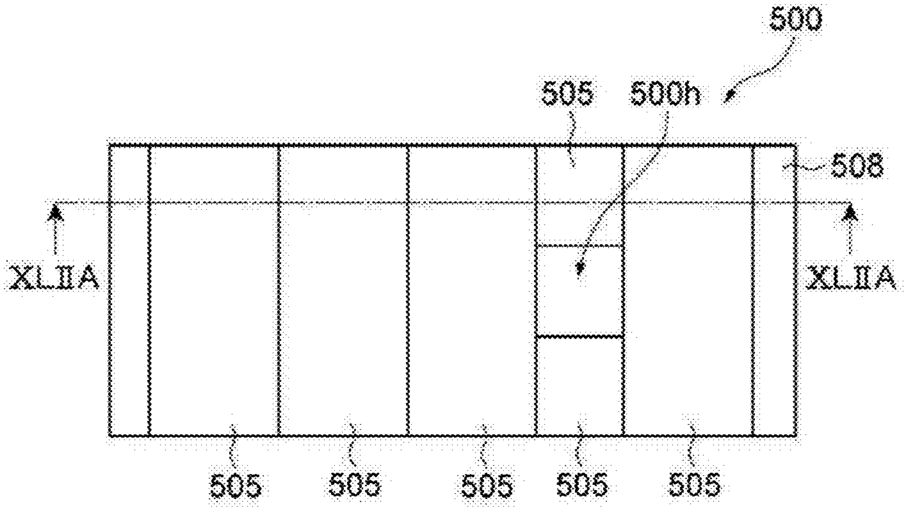

FIG. 42A is a sectional view of a coil unit according to yet another exemplary embodiment, and FIG. 42B is a plan view illustrating a plurality of ferrite materials provided between a base plate and a thermally conductive sheet in the coil unit illustrated in FIG. 42A.

Figure 43:
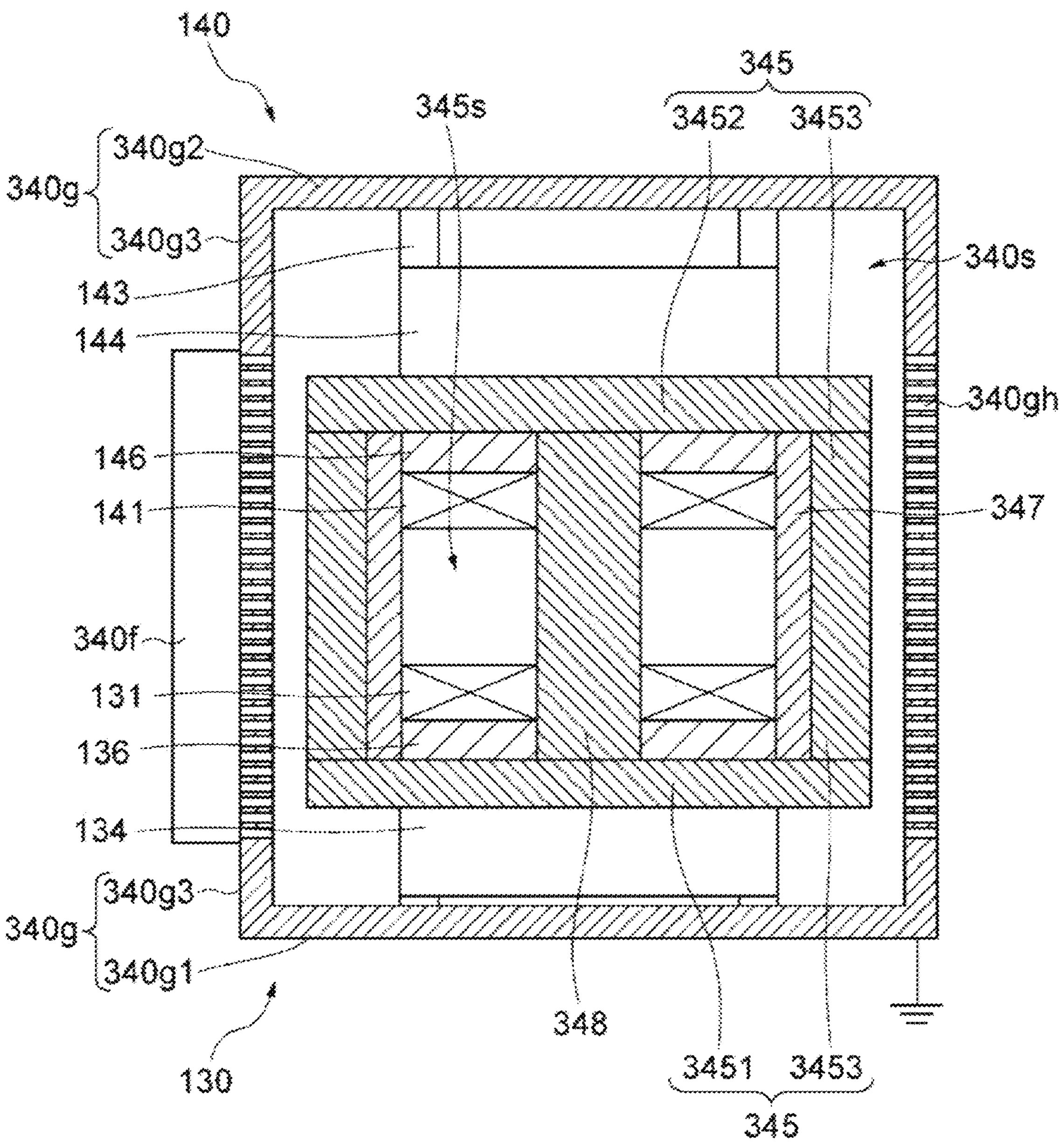

FIG. 43 is a diagram illustrating a power transmitting coil unit and a power receiving coil unit according to yet another exemplary embodiment.

Figure 44:
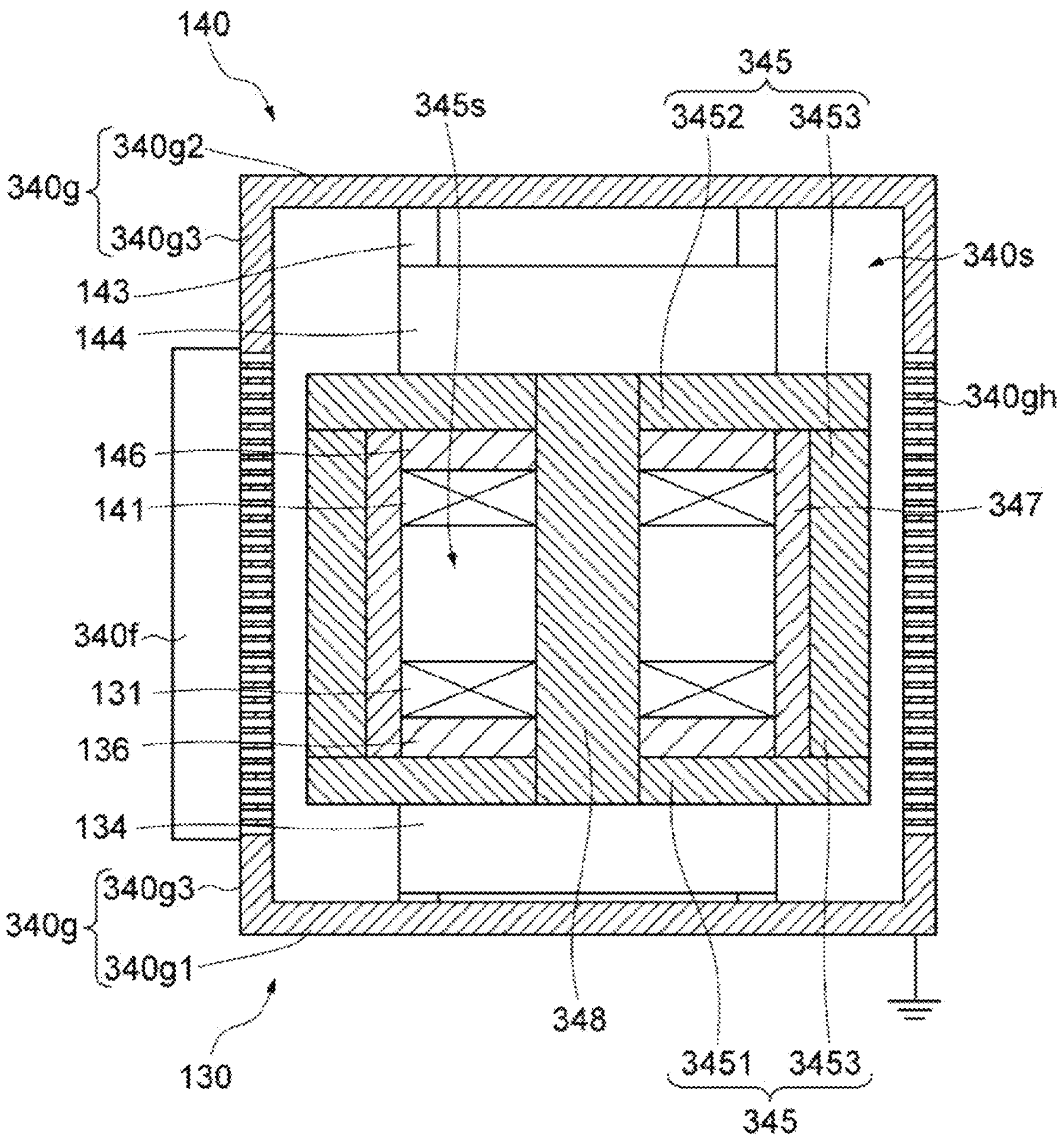

FIG. 44 is a diagram illustrating a power transmitting coil unit and a power receiving coil unit according to yet another exemplary embodiment.

Figure 45:
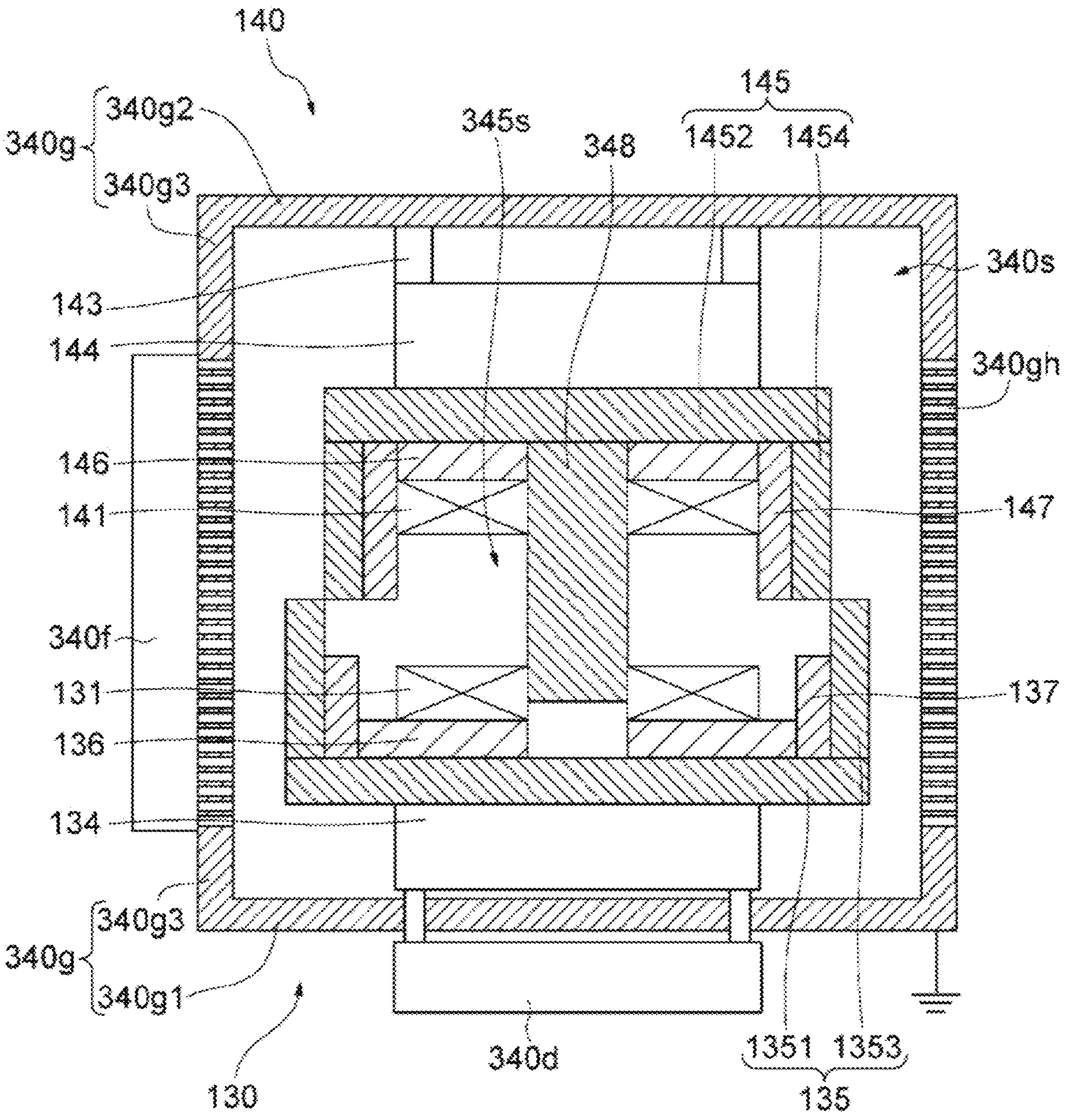

FIG. 45 is a diagram illustrating a power transmitting coil unit and a power receiving coil unit according to yet another exemplary embodiment.

Figure 46:
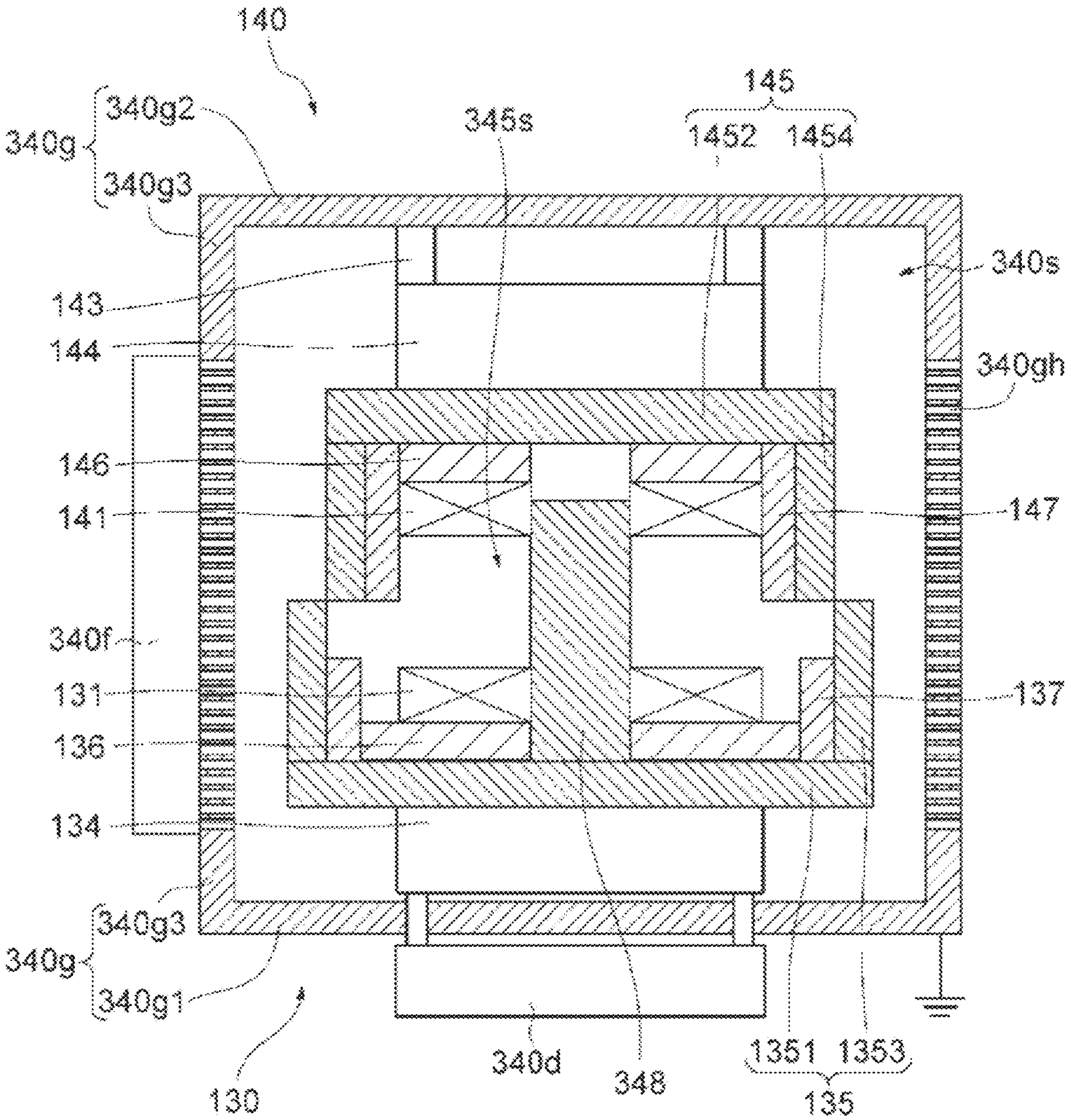

FIG. 46 is a diagram illustrating a power transmitting coil unit and a power receiving coil unit according to yet another exemplary embodiment.

Figure 47:
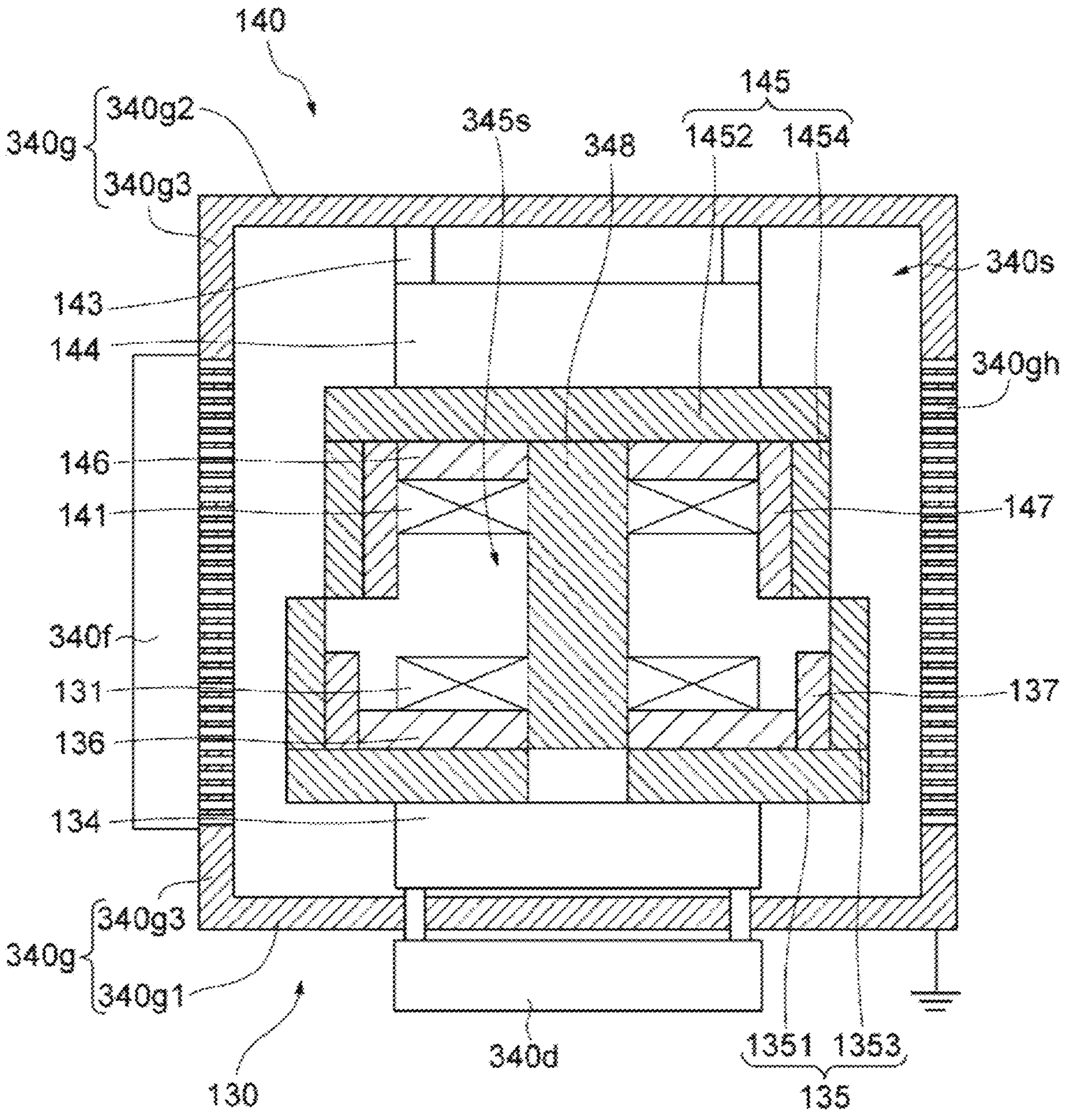

FIG. 47 is a diagram illustrating a power transmitting coil unit and a power receiving coil unit according to yet another exemplary embodiment.

Figure 48:
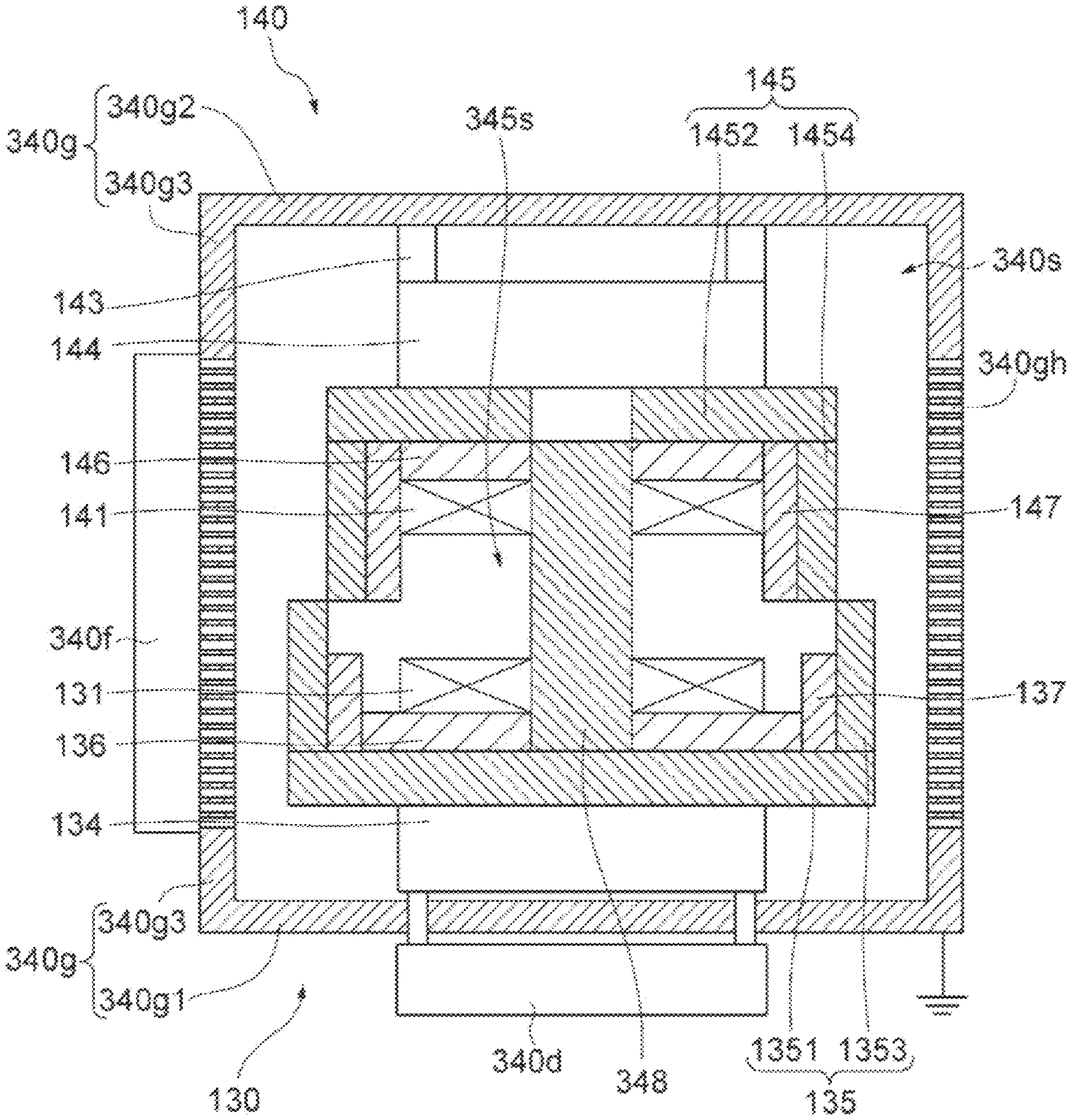

FIG. 48 is a diagram illustrating a power transmitting coil unit and a power receiving coil unit according to yet another exemplary embodiment.

Figure 49:
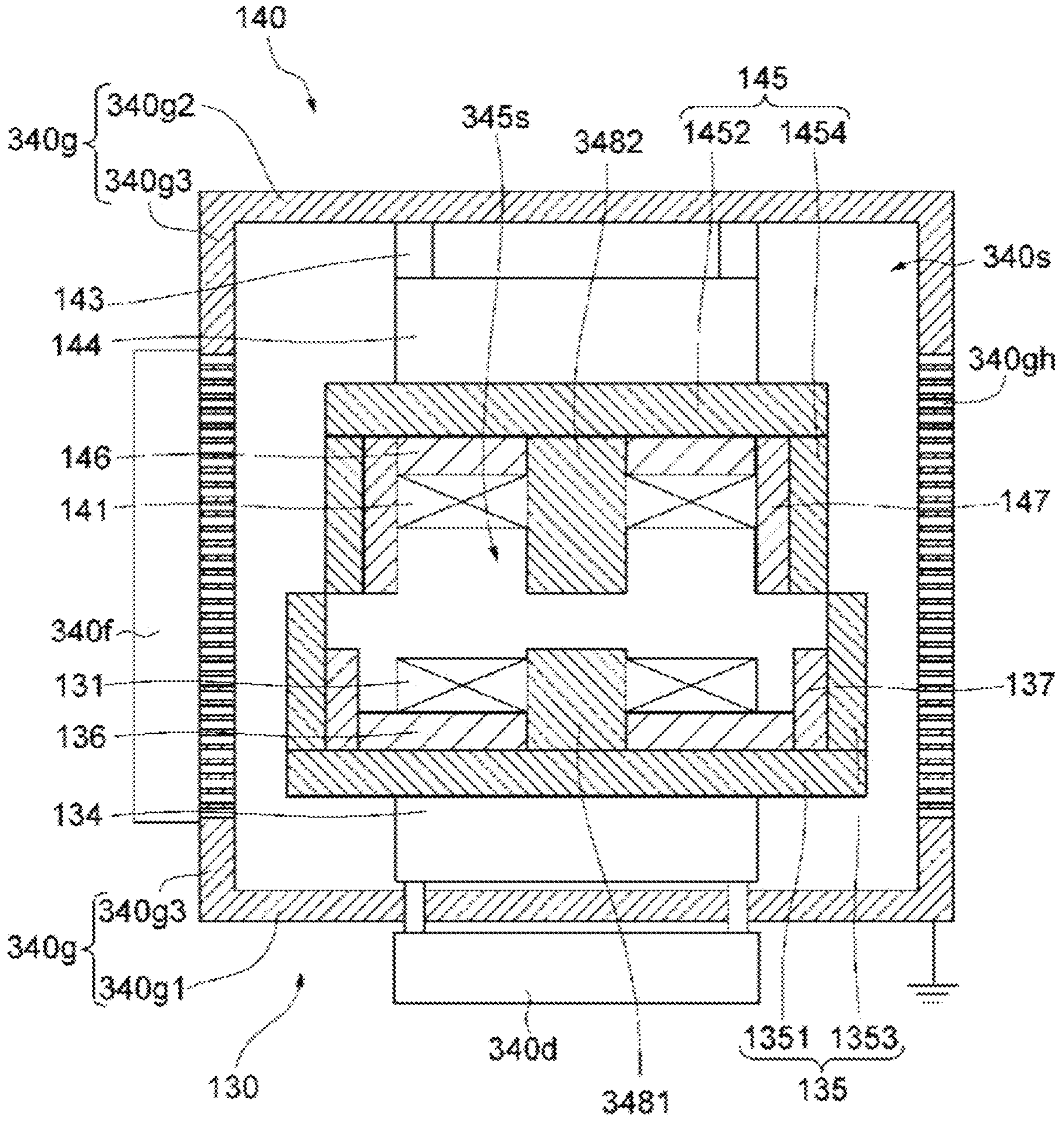

FIG. 49 is a diagram illustrating a power transmitting coil unit and a power receiving coil unit according to yet another exemplary embodiment.

Figure 50:
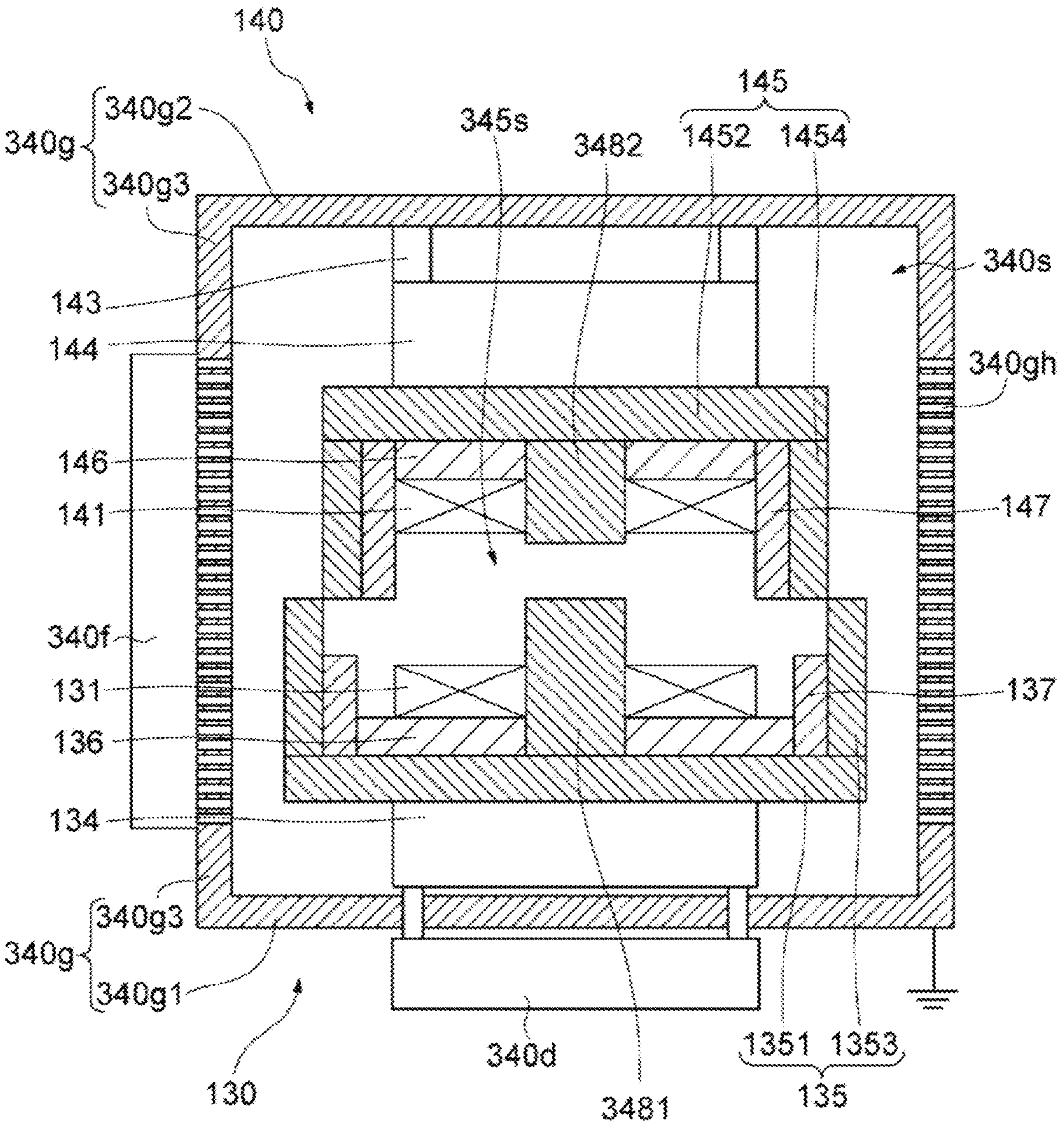

FIG. 50 is a diagram illustrating a power transmitting coil unit and a power receiving coil unit according to yet another exemplary embodiment.

Figure 51:
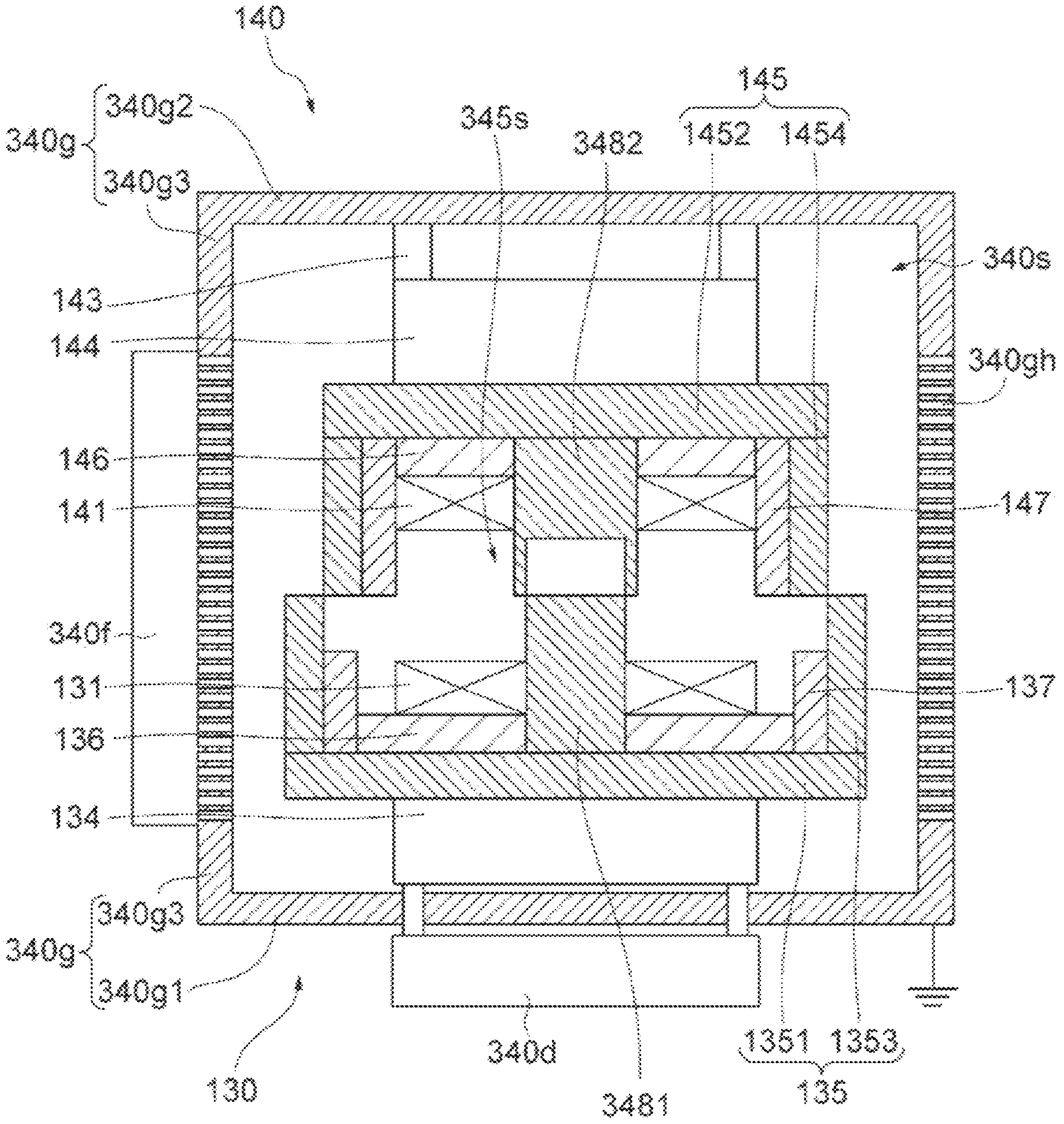

FIG. 51 is a diagram illustrating a power transmitting coil unit and a power receiving coil unit according to yet another exemplary embodiment.

Figure 52:
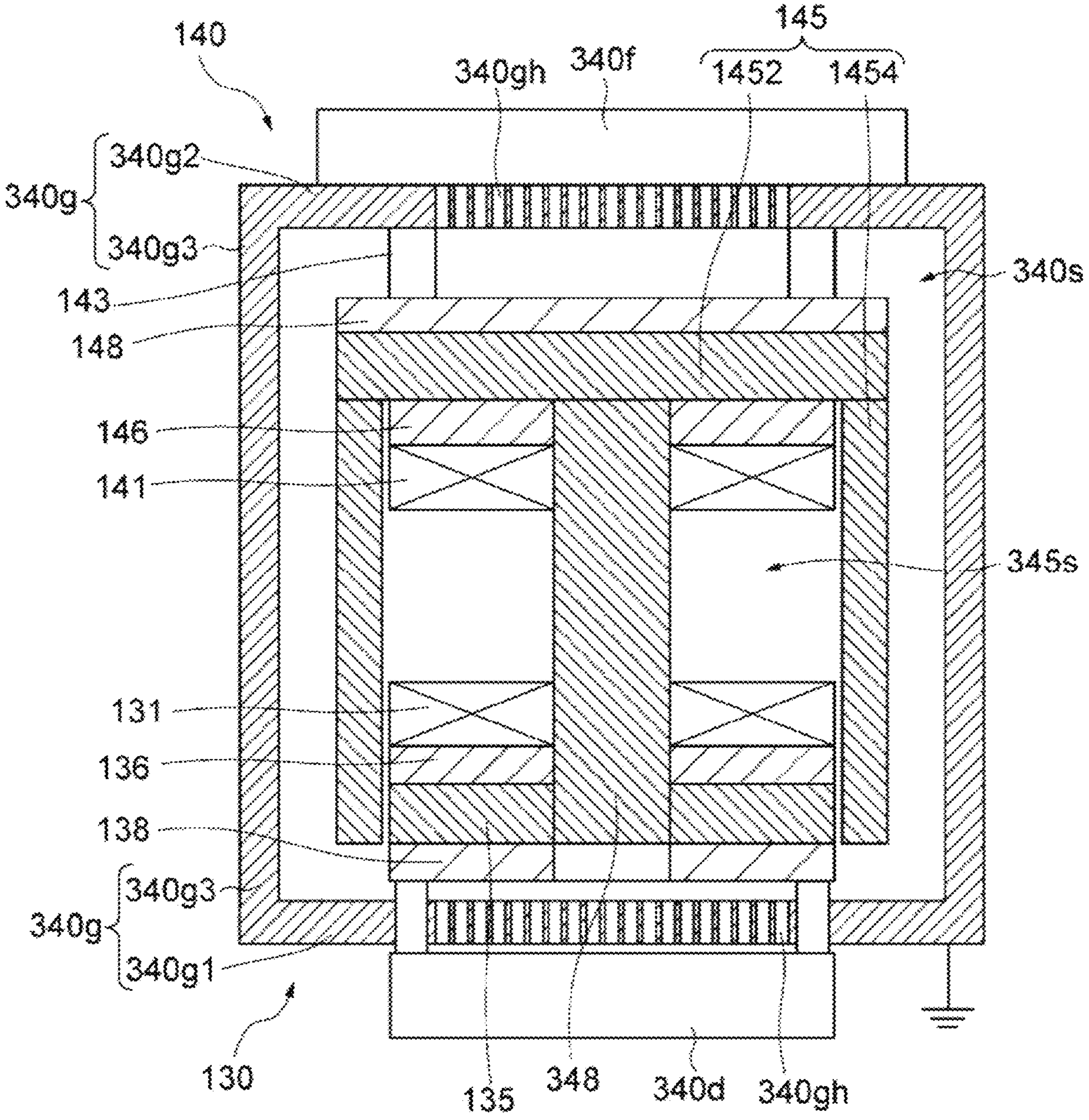

FIG. 52 is a diagram illustrating a power transmitting coil unit and a power receiving coil unit according to yet another exemplary embodiment.

Figure 53A:
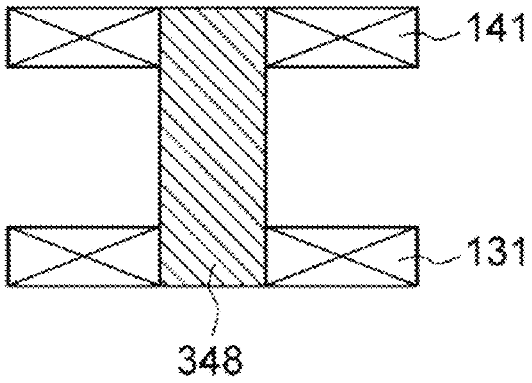
Figure 53B:
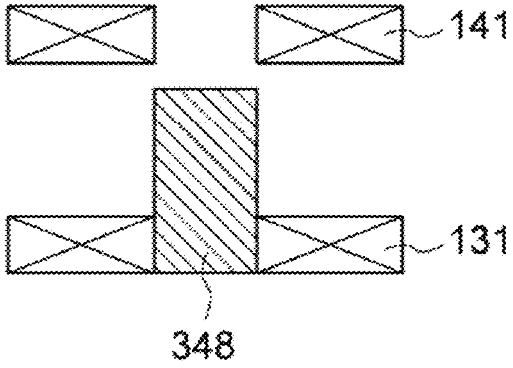
Figure 53C:
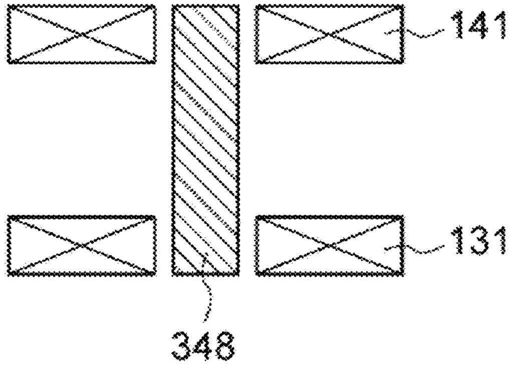

Each of FIGS. 53A, 53B, and 53C is a diagram illustrating an example of a positional relationship between each of the power transmitting coil and power receiving coil and an inner ferrite material.

FIGS. 54A to 54E are diagrams illustrating several examples of inner ferrite materials.

Figure 55A:
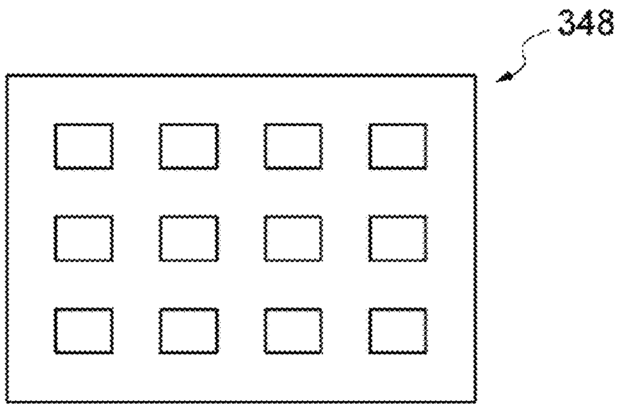
Figure 55B:
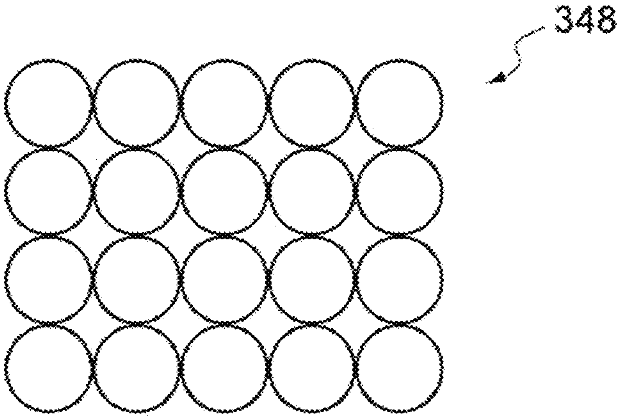
Figure 55C:
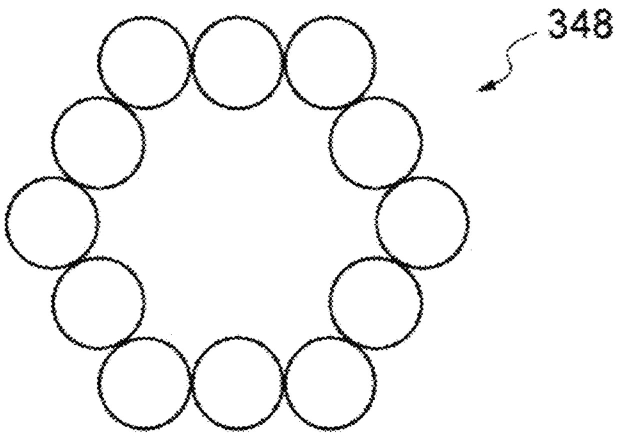

FIGS. 55A to 55C are diagrams illustrating several examples of inner ferrite materials.

Figure 56A:
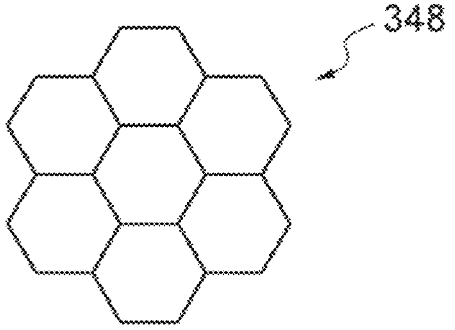
Figure 56B:
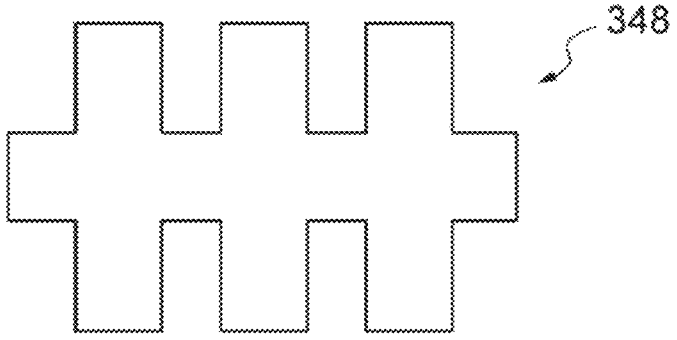

FIGS. 56A and 56B are diagrams illustrating several examples of inner ferrite materials.

Figure 57A:
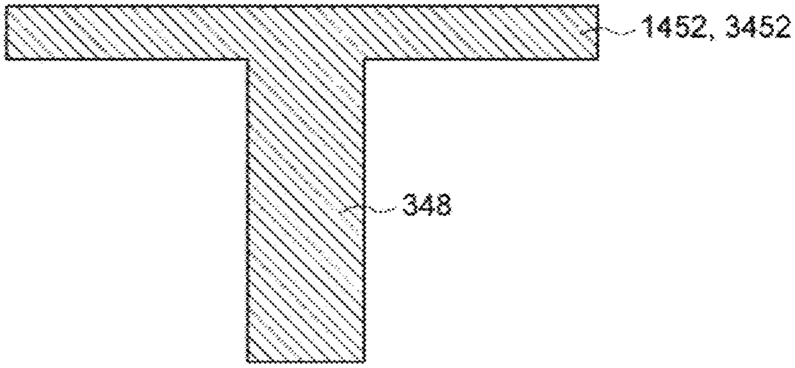
Figure 57B:
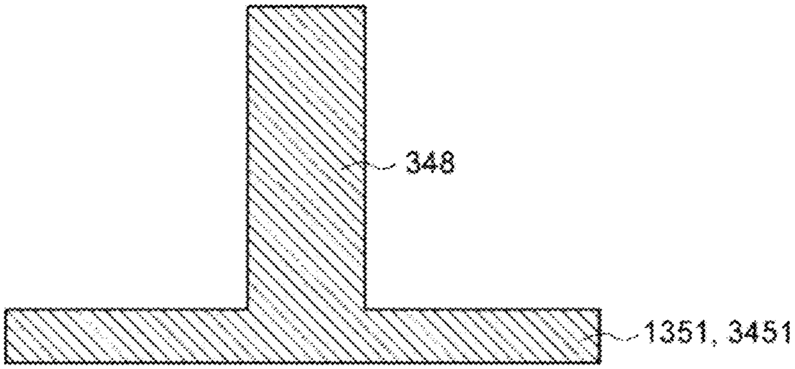
Figure 57C:
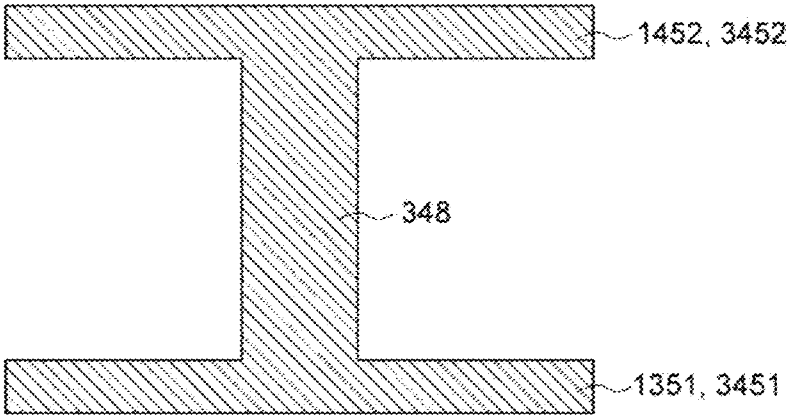

FIGS. 57A to 57C are diagrams illustrating several examples of ferrite materials in a power transmitting coil unit and a power receiving coil unit.

Figure 58A:
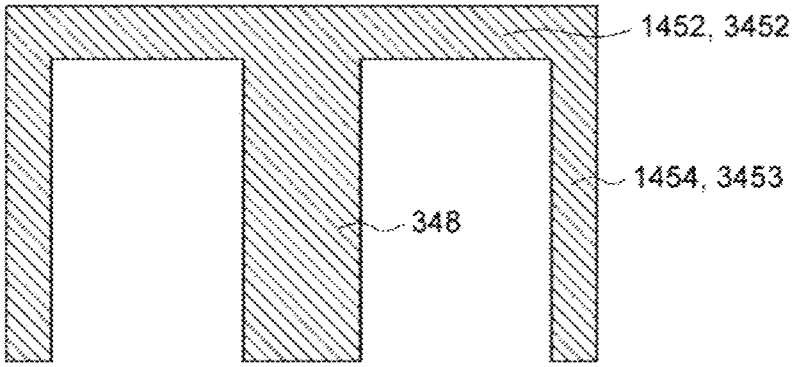
Figure 58B:
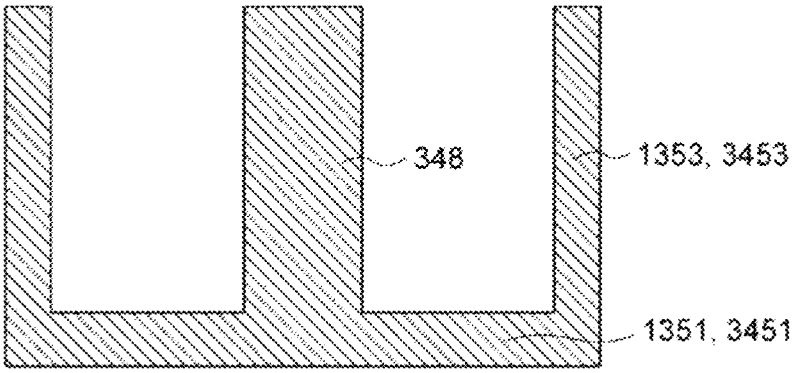

FIGS. 58A and 58B are diagrams illustrating several examples of ferrite materials in a power transmitting coil unit and a power receiving coil unit.

Figure 59:
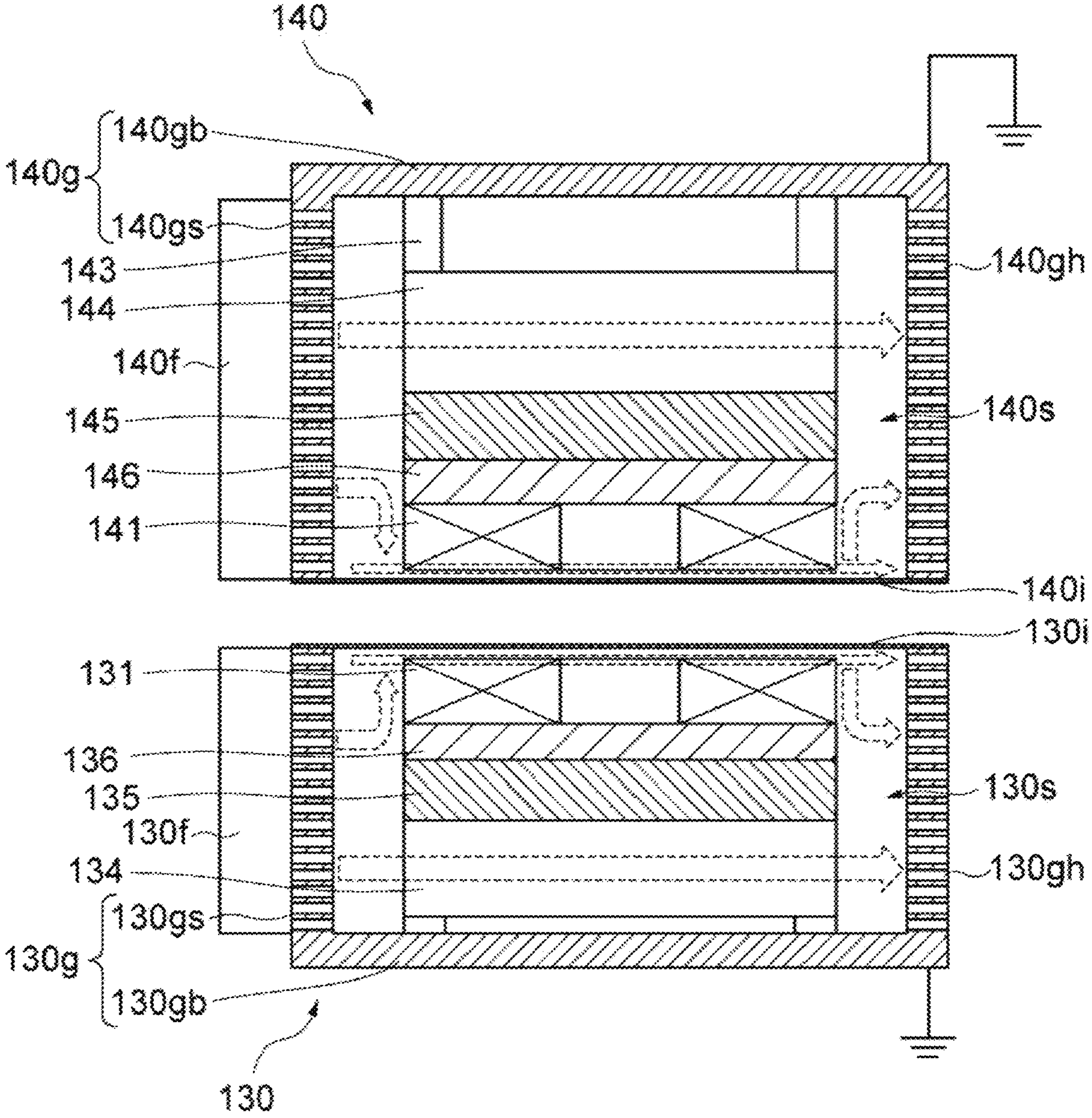

FIG. 59 is a diagram illustrating a power transmitting coil unit and a power receiving coil unit according to yet another exemplary embodiment.

Figure 60A:
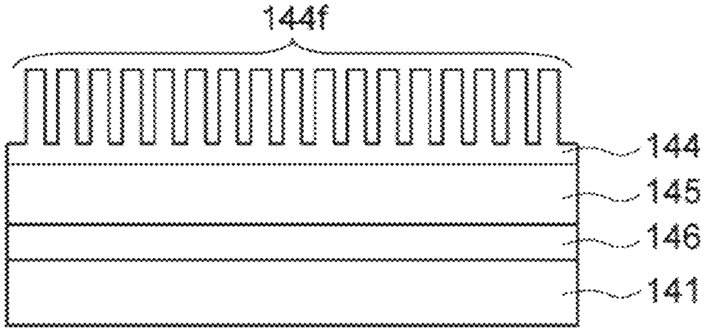
Figure 60B:
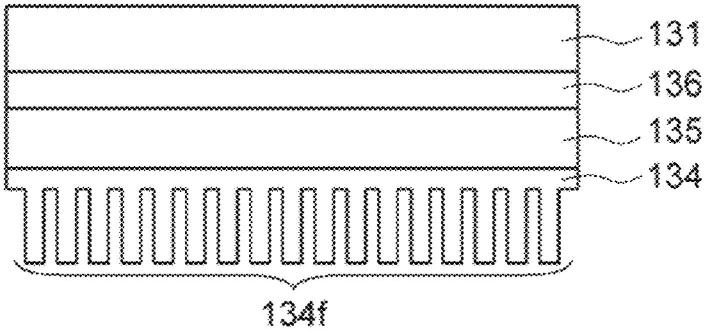

FIG. 60A is a diagram illustrating an example of a heat sink of the power receiving coil unit shown in FIG. 59, and FIG. 60B is a diagram illustrating an example of a heat sink of the power transmitting coil unit shown in FIG. 59.

Figure 61:
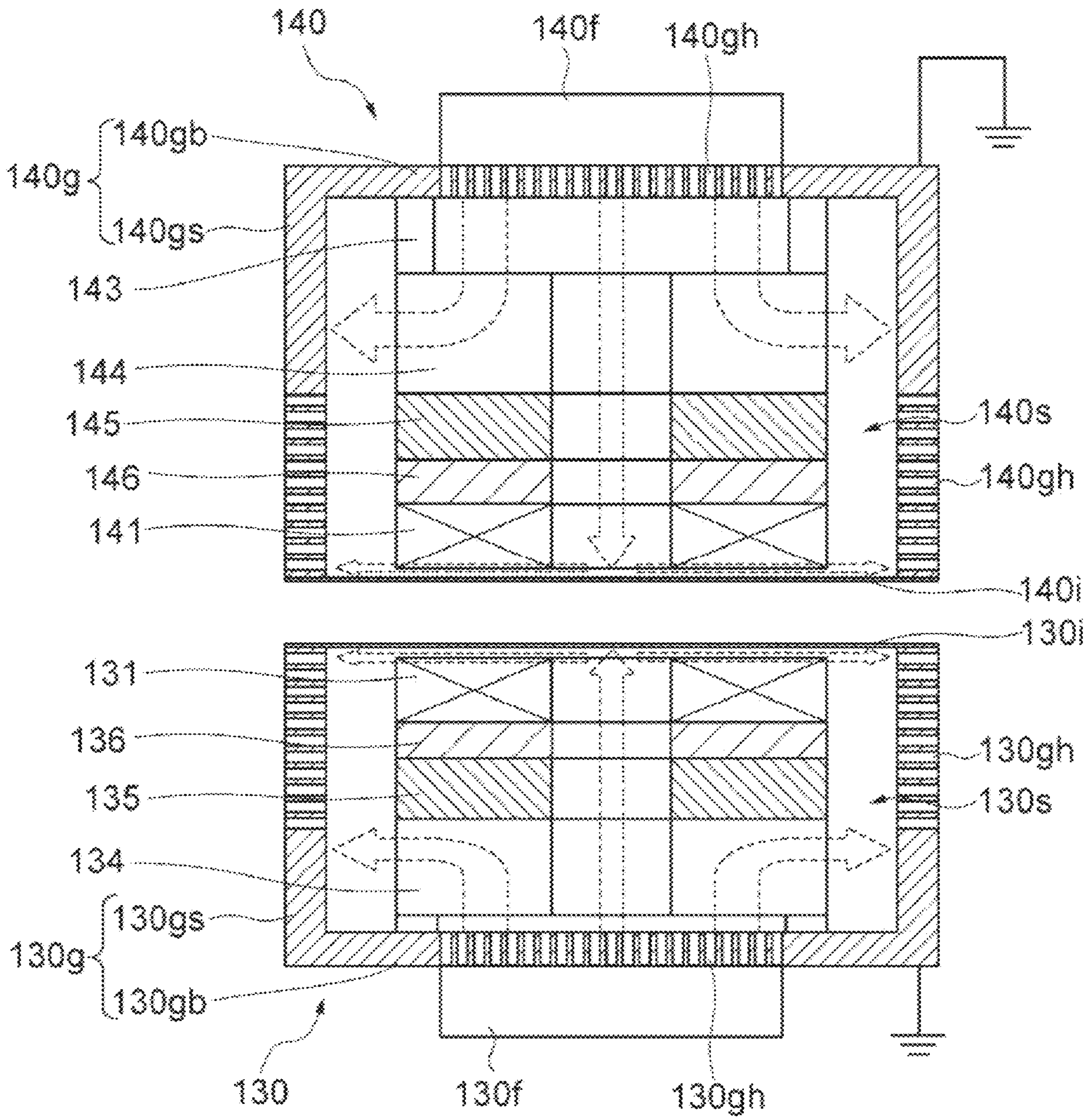

FIG. 61 is a diagram illustrating a power transmitting coil unit and a power receiving coil unit according to yet another exemplary embodiment.

Figure 62:
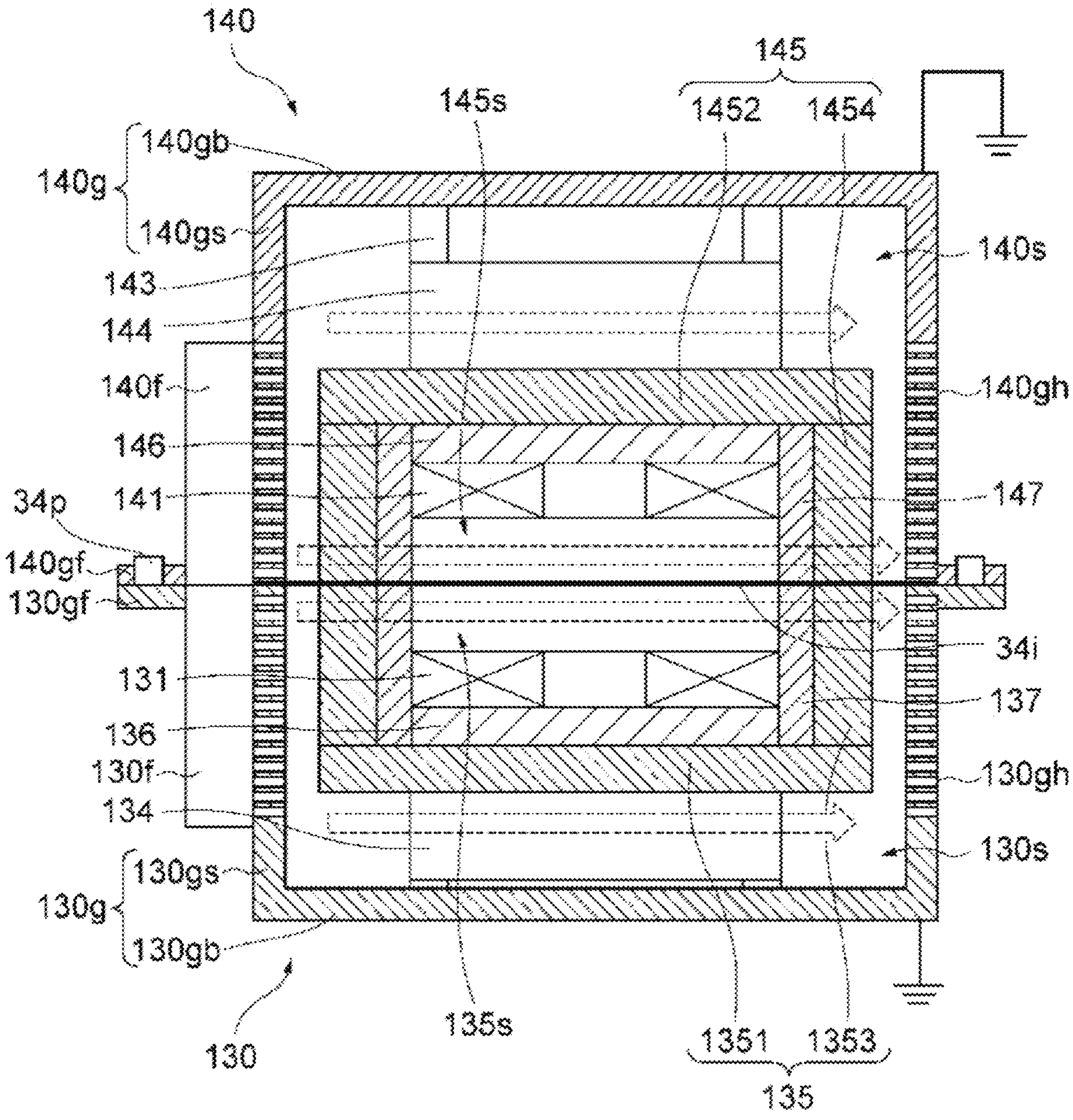

FIG. 62 is a diagram illustrating a power transmitting coil unit and a power receiving coil unit according to yet another exemplary embodiment.

Figure 63:
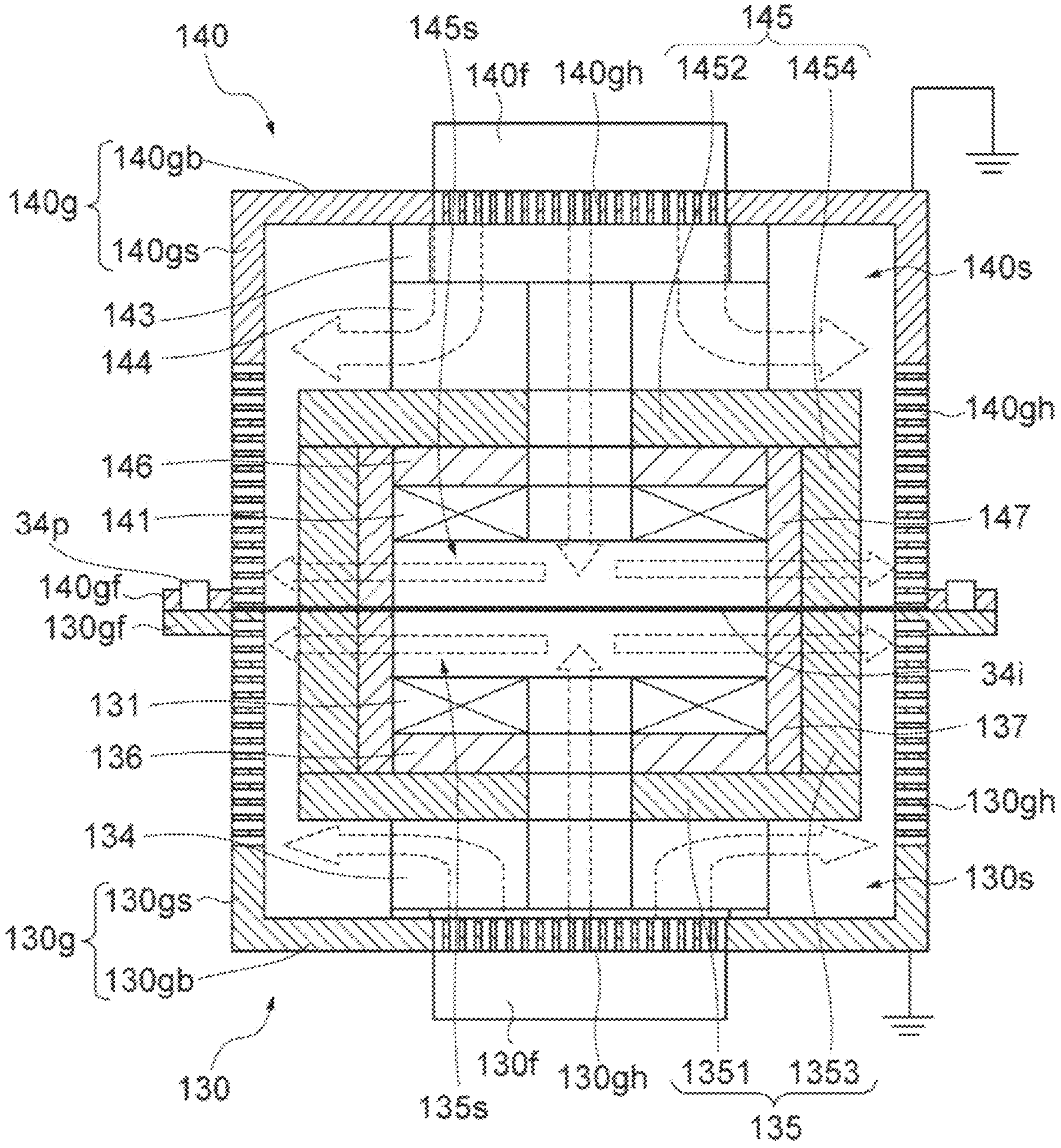

FIG. 63 is a diagram illustrating a power transmitting coil unit and a power receiving coil unit according to yet another exemplary embodiment.

Figure 64:
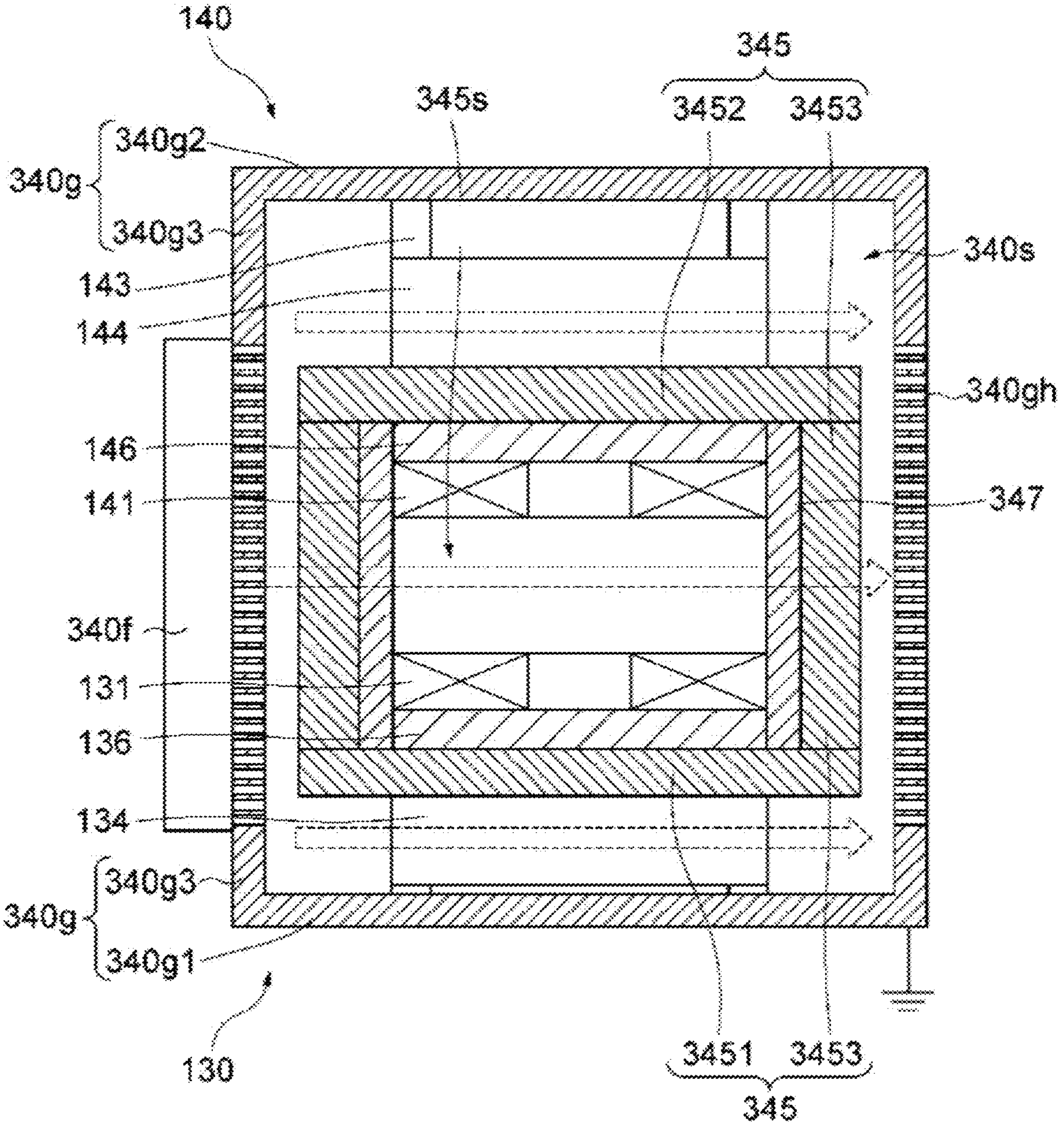

FIG. 64 is a diagram illustrating a power transmitting coil unit and a power receiving coil unit according to yet another exemplary embodiment.

Figure 65:
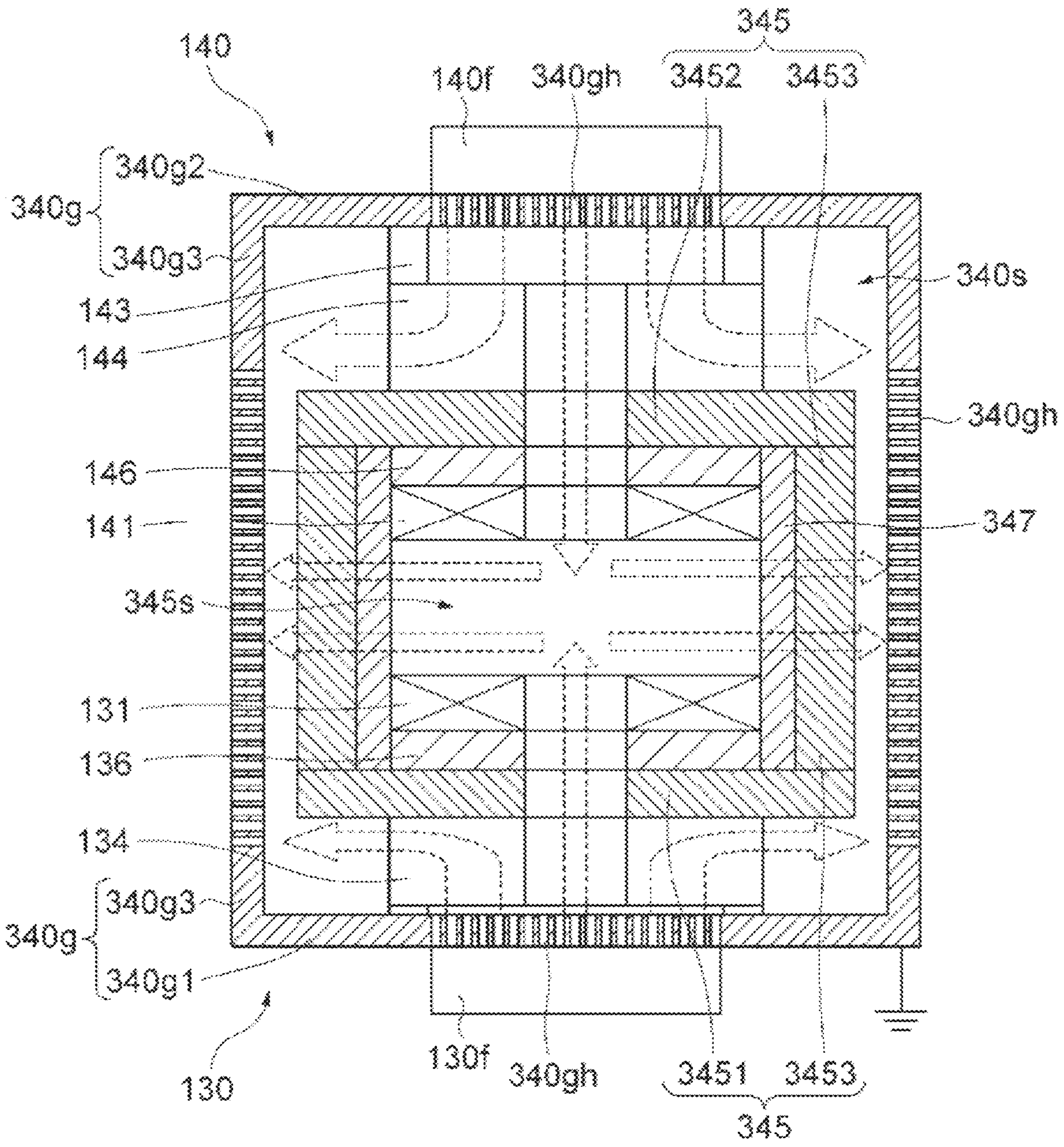

FIG. 65 is a diagram illustrating a power transmitting coil unit and a power receiving coil unit according to yet another exemplary embodiment.

Figure 66A:
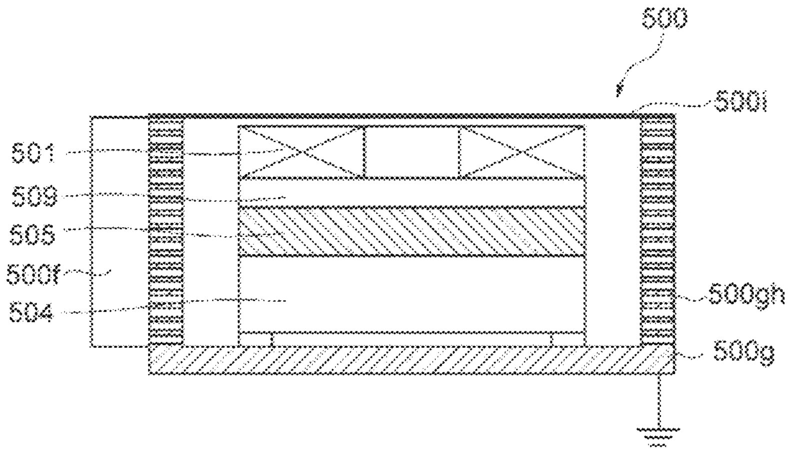
Figure 66B:
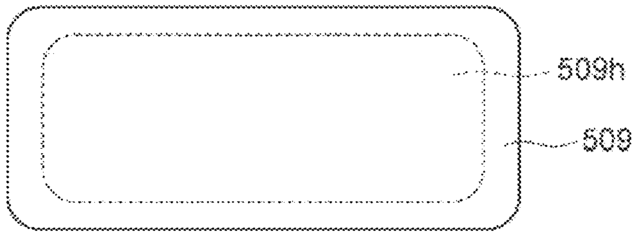

FIG. 66A is a sectional view of a coil unit according to another exemplary embodiment, and FIG. 66B is a plan view illustrating a cooling plate in the coil unit shown in FIG. 66A.

Figure 67:
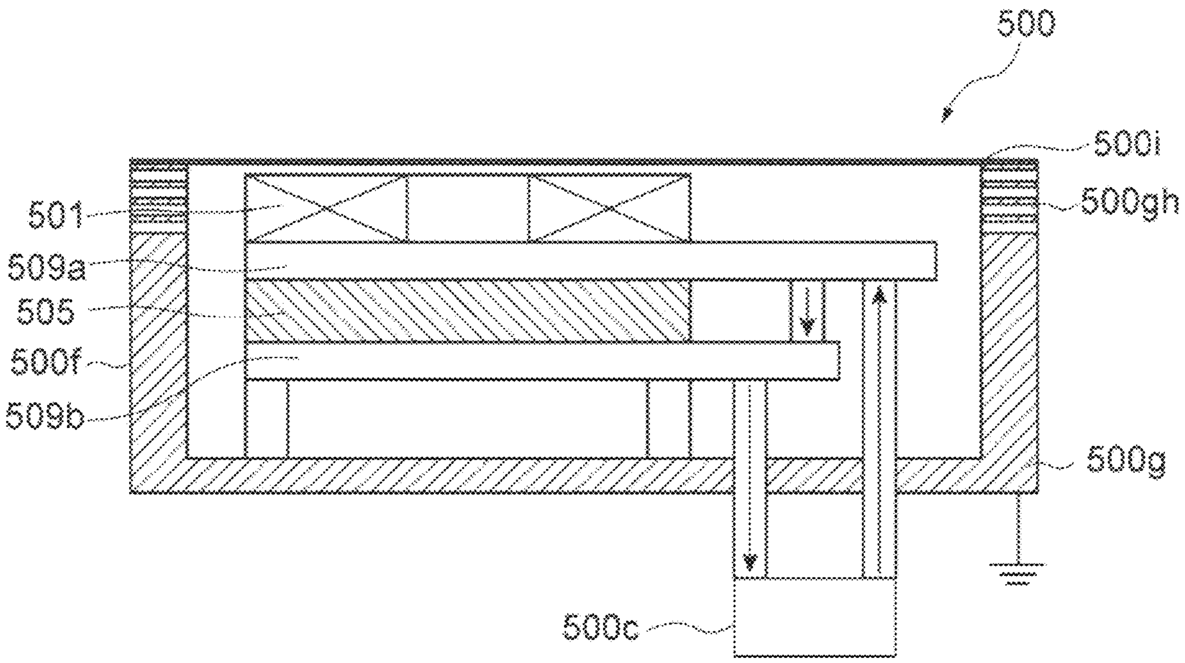

FIG. 67 is a sectional view of a coil unit according to yet another exemplary embodiment.

Figure 68:
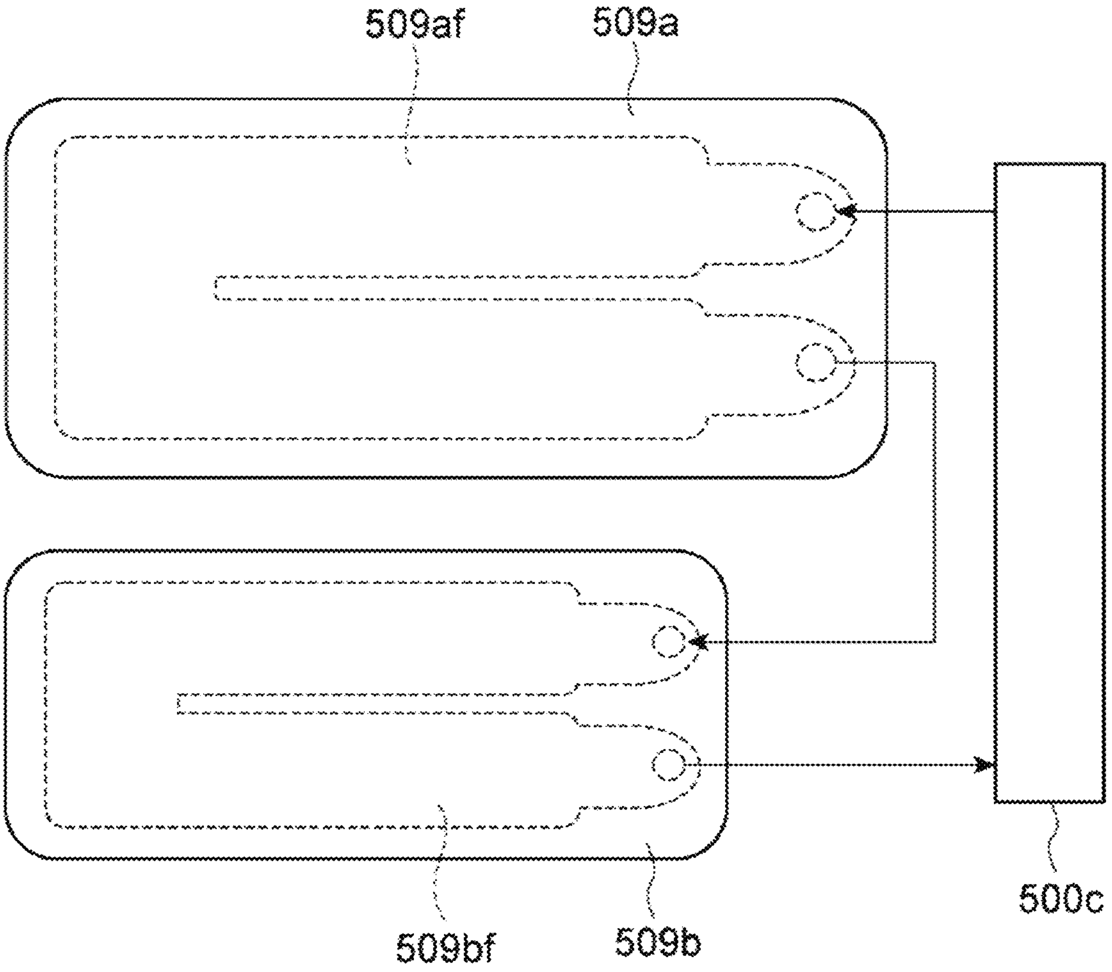

FIG. 68 is a diagram illustrating two cooling plates in the coil unit shown in FIG. 67.

Figure 69:
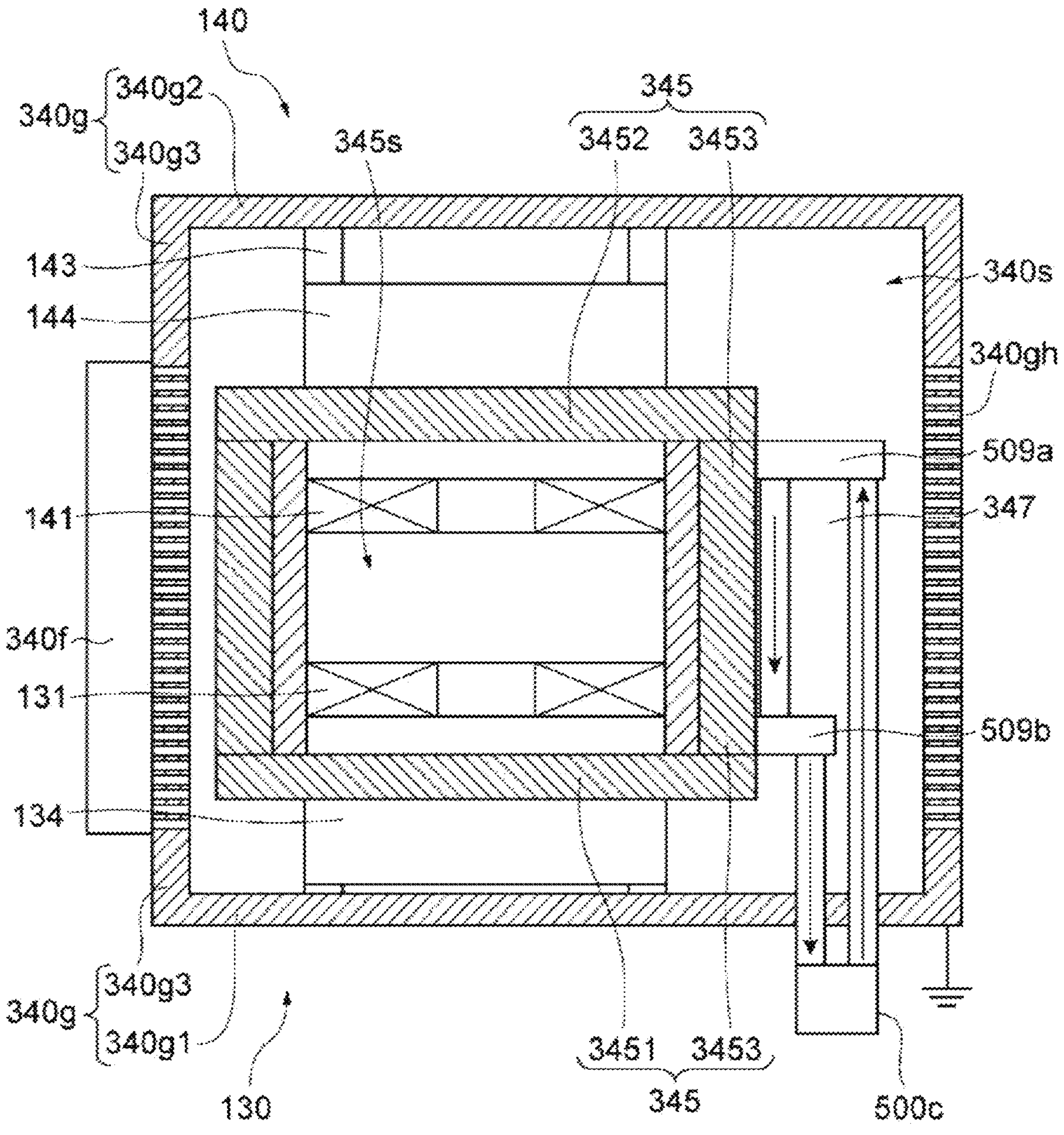

FIG. 69 is a diagram illustrating a power transmitting coil unit and a power receiving coil unit according to yet another exemplary embodiment.

Figure 70A:
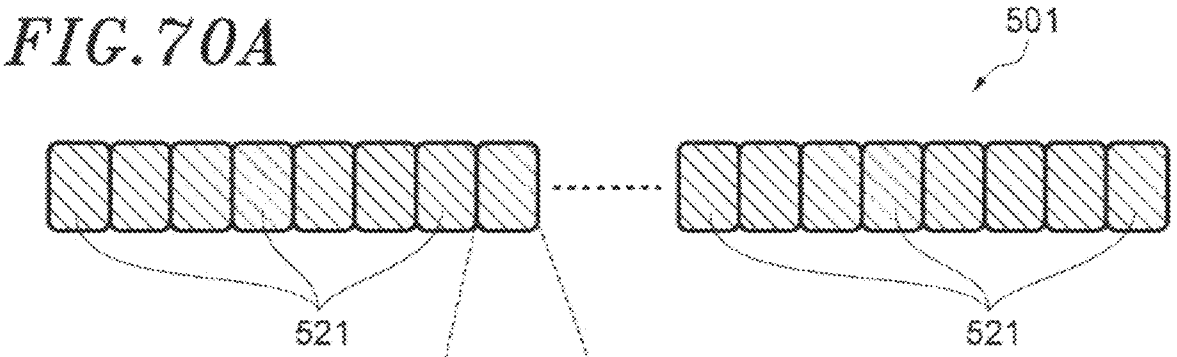
Figure 70B:
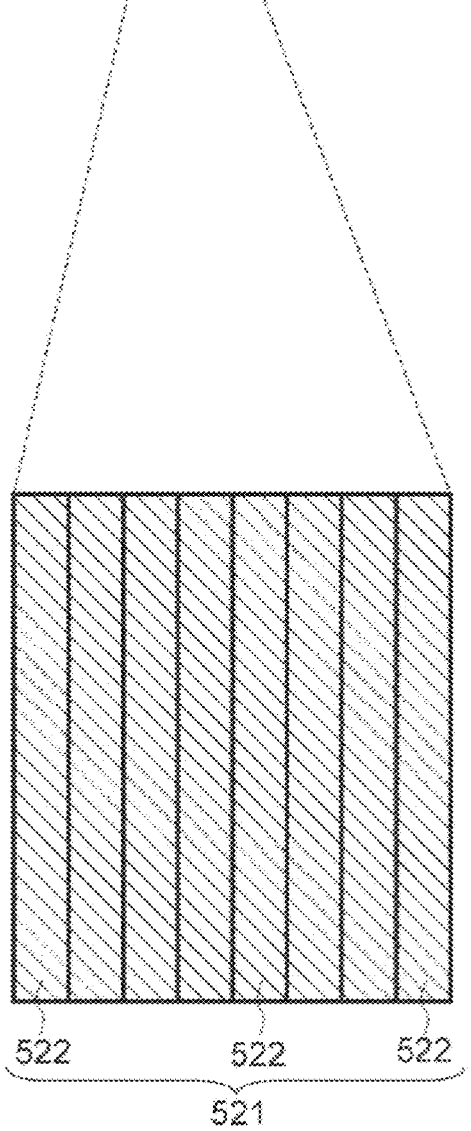

FIG. 70A is a sectional view of a coil according to one exemplary embodiment, and FIG. 70B is a sectional view of a coil wire according to one exemplary embodiment.

Figure 71A:
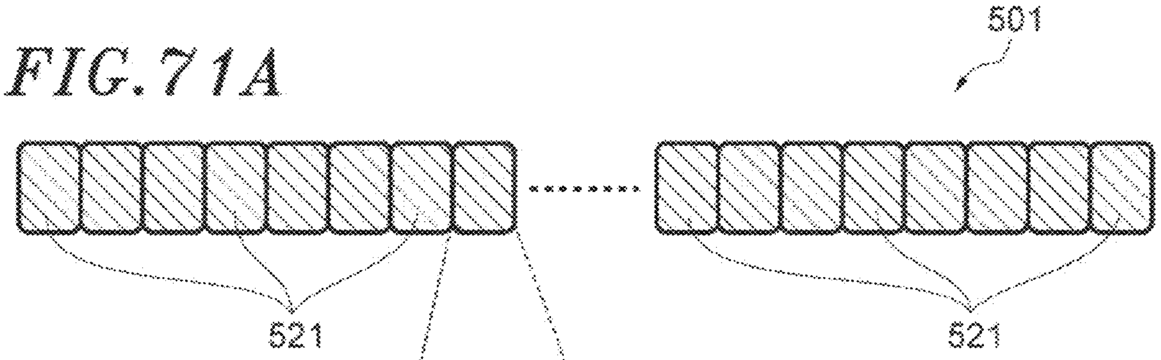
Figure 71B:
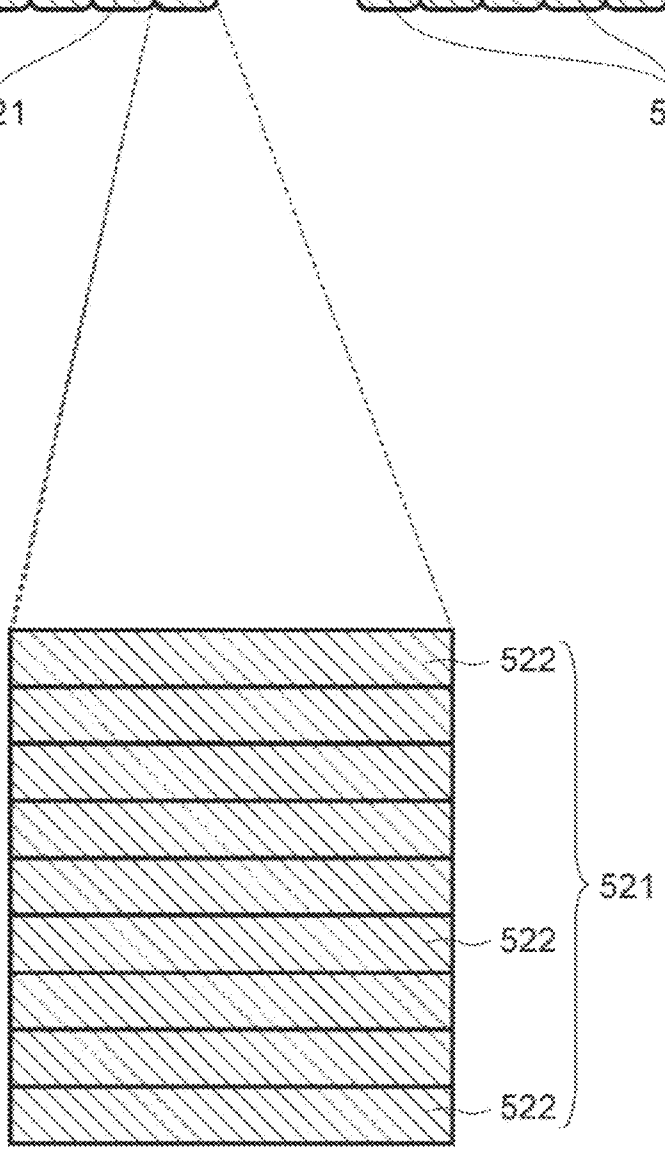

FIG. 71A is a sectional view of a coil according to another exemplary embodiment, and FIG. 71B is a sectional view of a coil wire according to another exemplary embodiment.

Figure 72A:
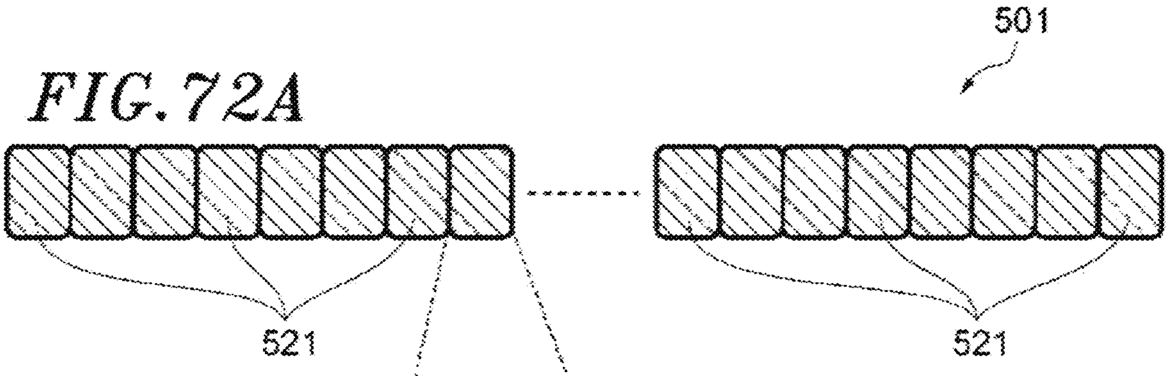
Figure 72B:
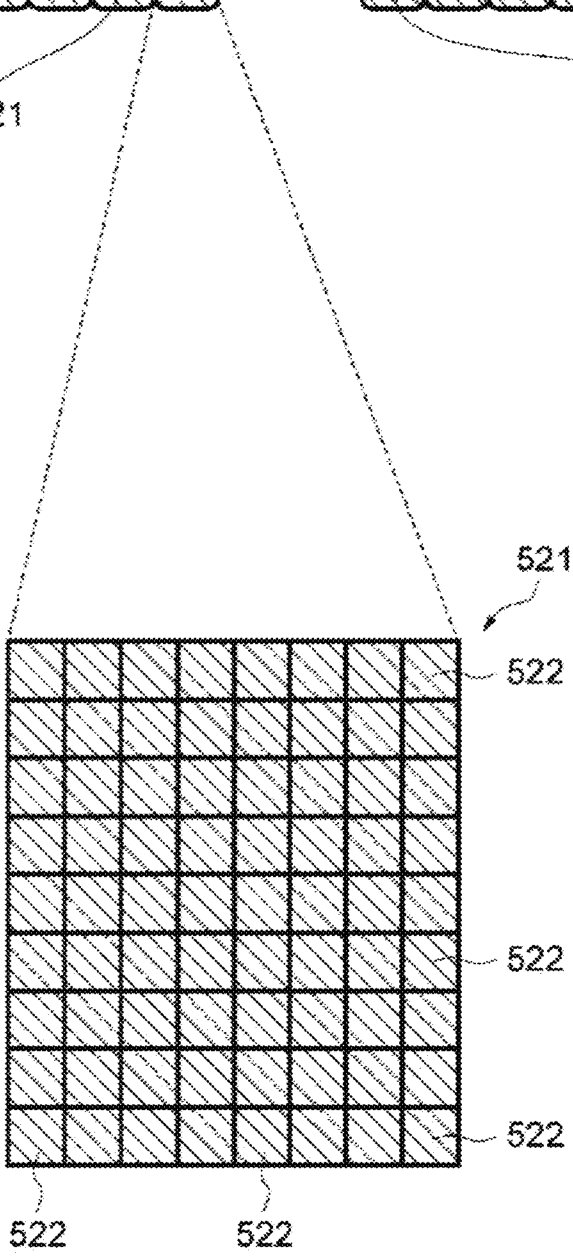

FIG. 72A is a sectional view of a coil according to yet another exemplary embodiment, and FIG. 72B is a sectional view of a coil wire according to another exemplary embodiment.

Figure 73A:
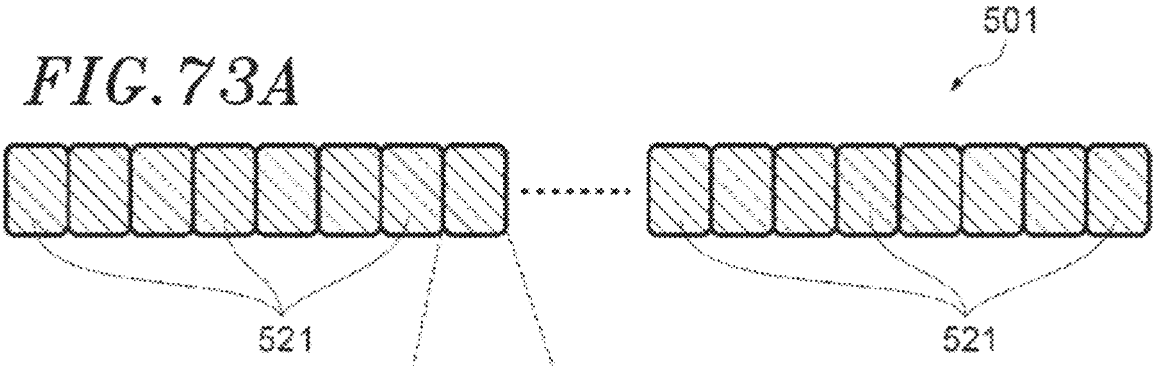
Figure 73B:
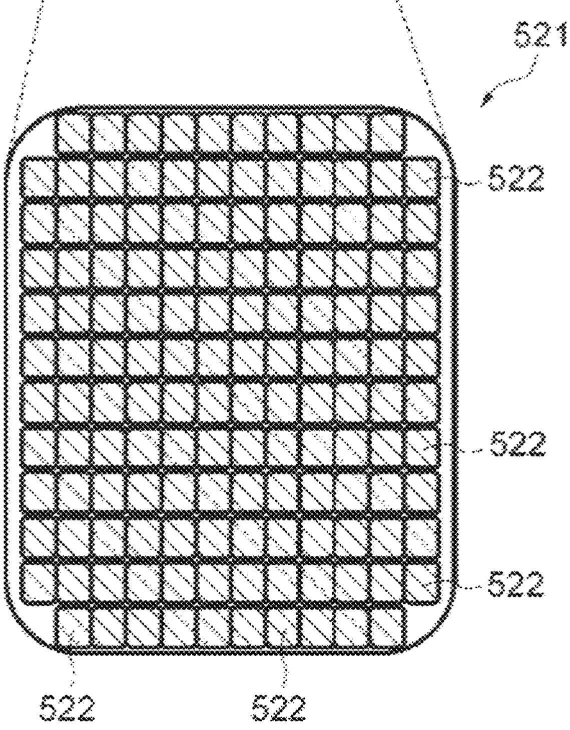

FIG. 73A is a sectional view of a coil according to yet another exemplary embodiment, and FIG. 73B is a sectional view of a coil wire according to another exemplary embodiment.

Figure 74A:
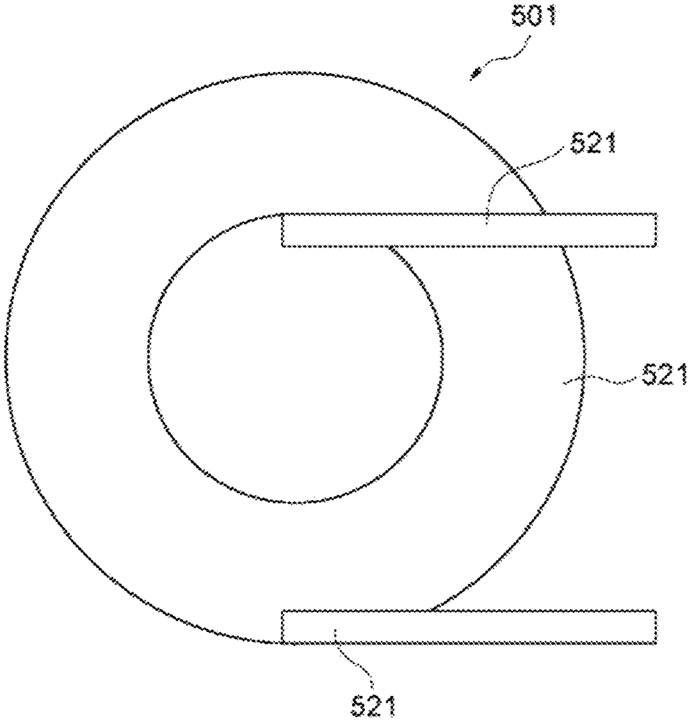
Figure 74B:
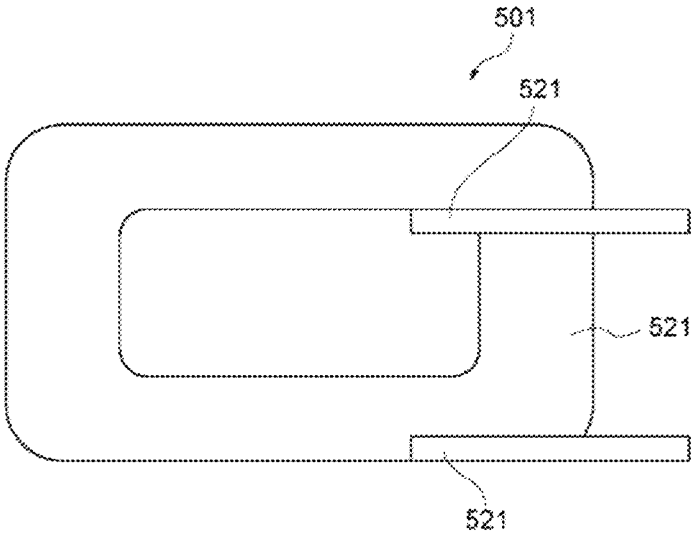

Each of FIGS. 74A and 74B is a plan view of a coil according to yet another exemplary embodiment.

Figure 75A:
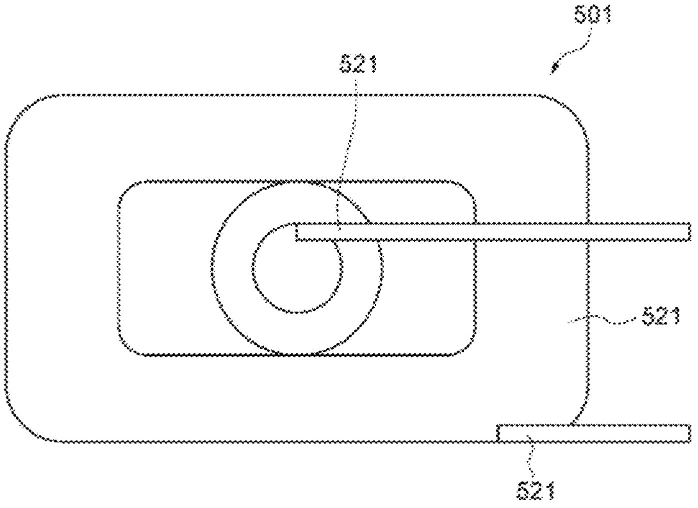
Figure 75B:
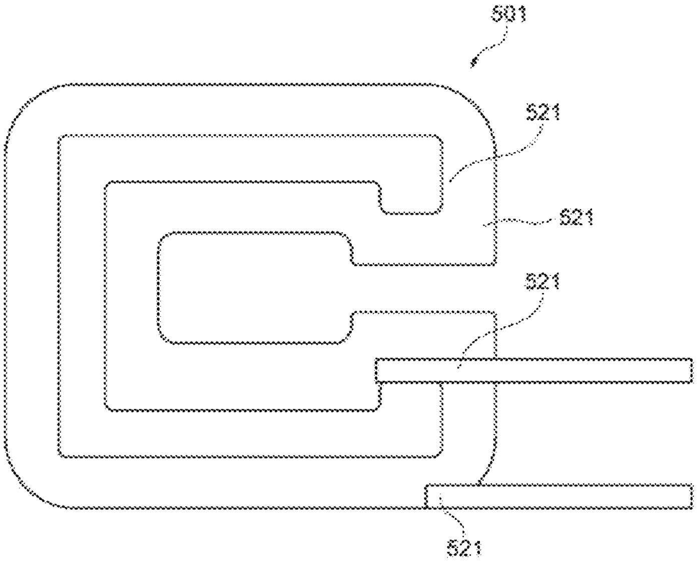

Each of FIGS. 75A and 75B is a plan view of a coil according to yet another exemplary embodiment.

Each of FIGS. 76A to 76D is a sectional view of a coil according to yet another exemplary embodiment.

Figure 77A:
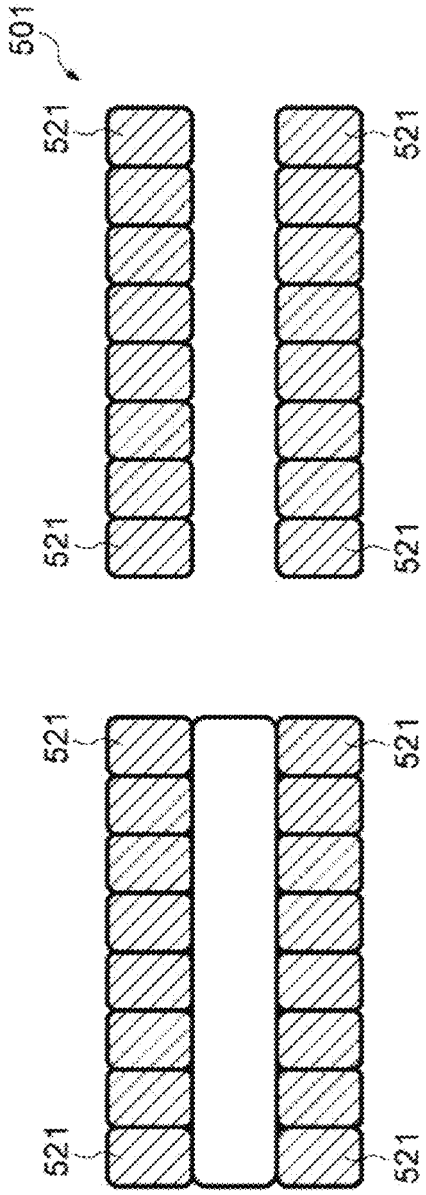
Figure 77B:
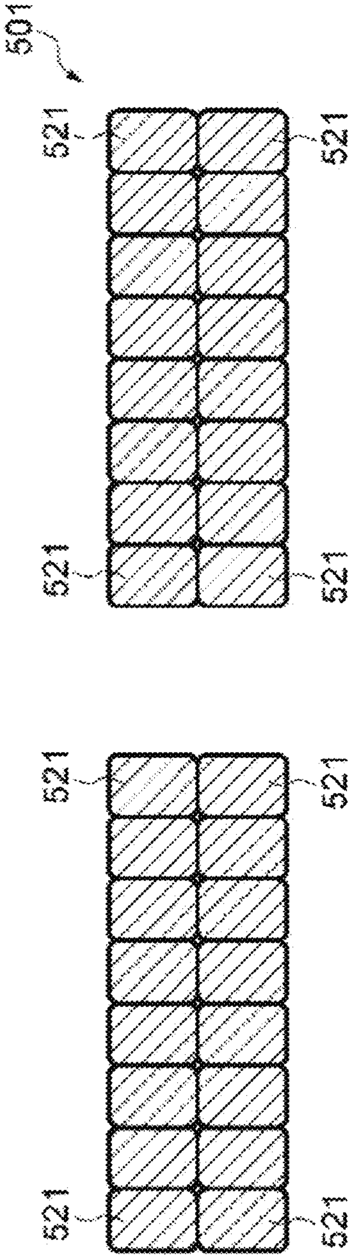

Each of FIGS. 77A and 77B is a sectional view of a coil according to yet another exemplary embodiment.

Figure 78A:
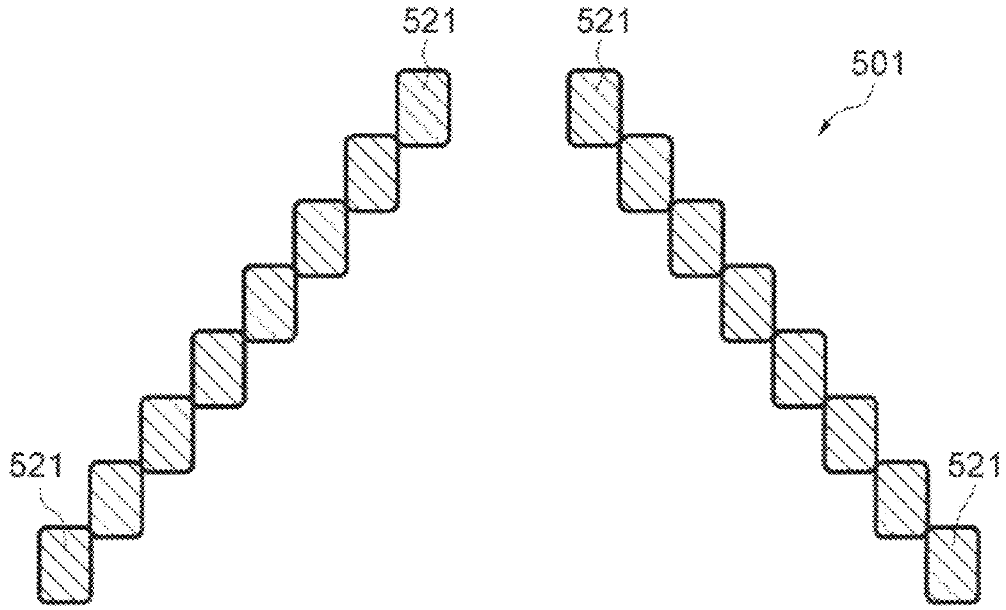
Figure 78B:
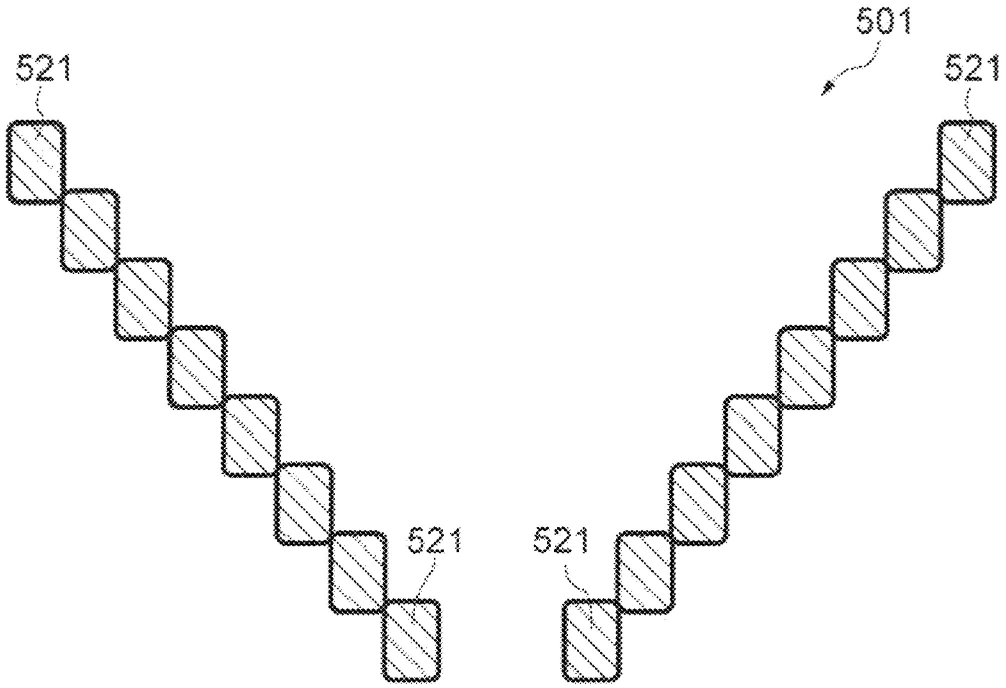

Each of FIGS. 78A and 78B is a sectional view of a coil according to yet another exemplary embodiment.

Figure 79:
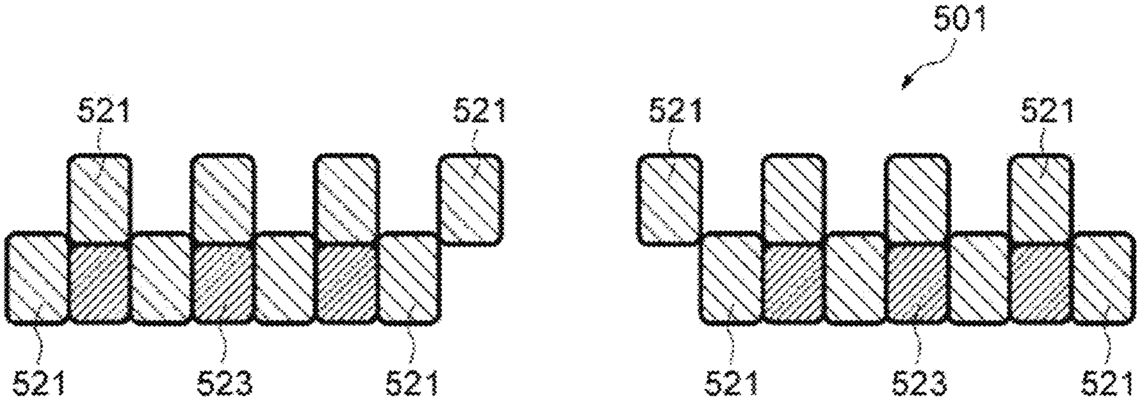

FIG. 79 is a sectional view of a coil according to yet another exemplary embodiment.

Figure 80:
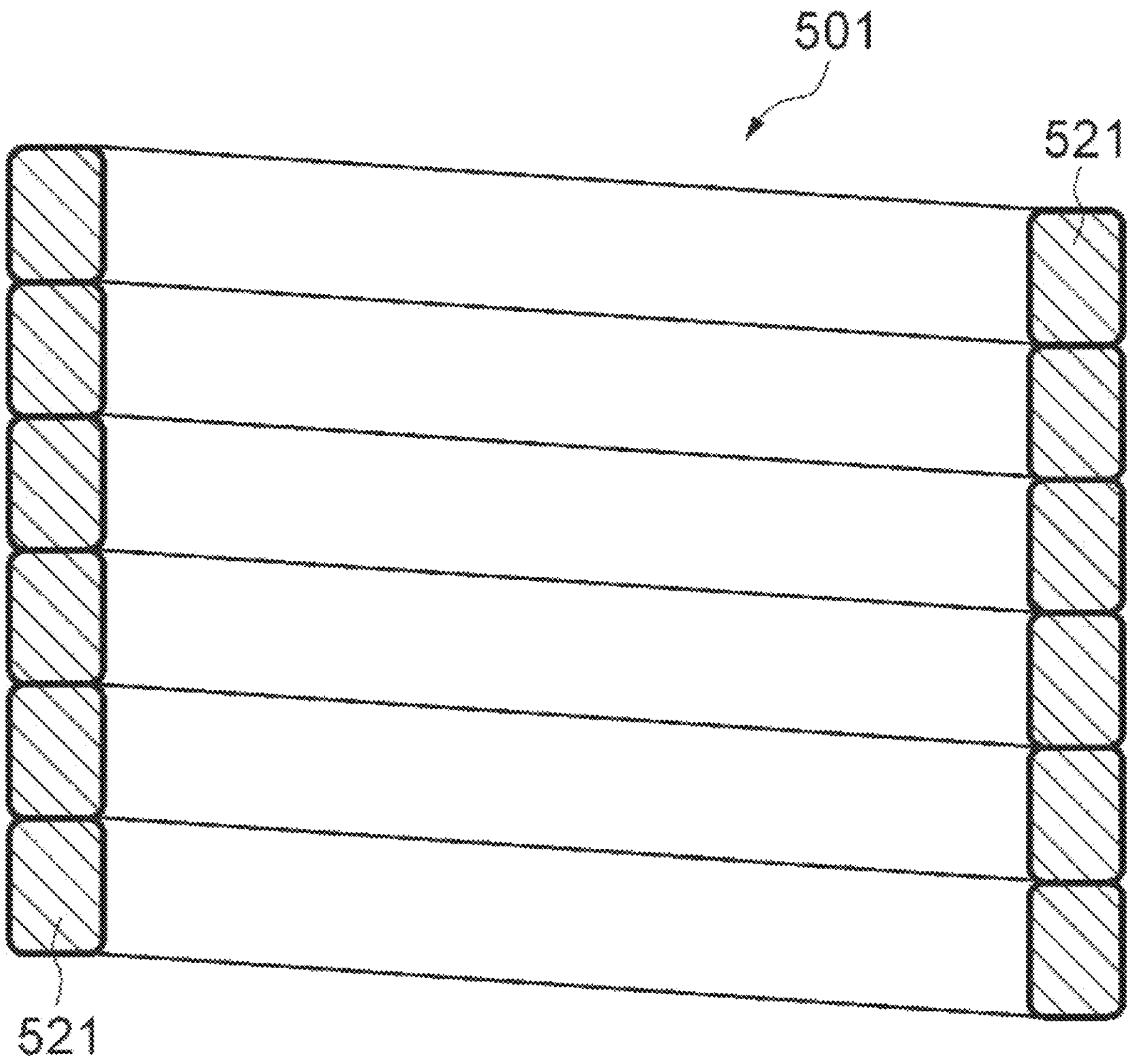

FIG. 80 is a sectional view of a coil according to yet another exemplary embodiment.

Figure 81B:
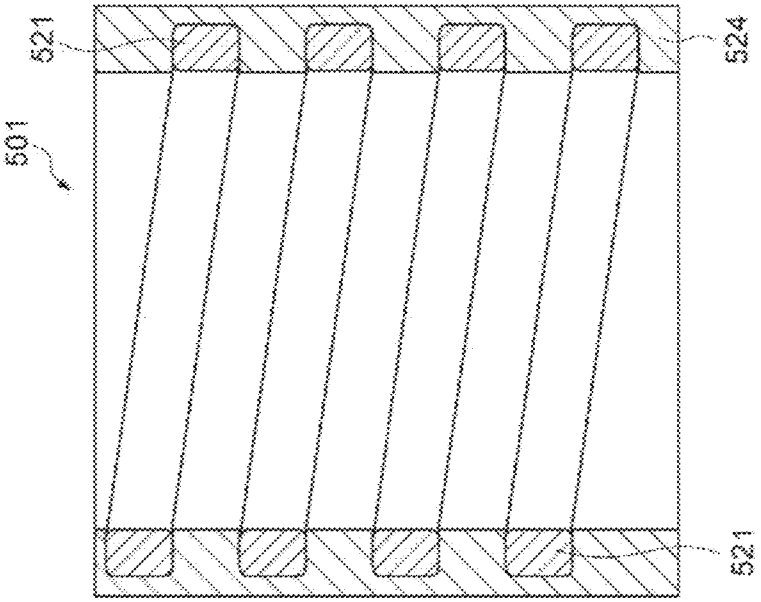
Figure 81A:
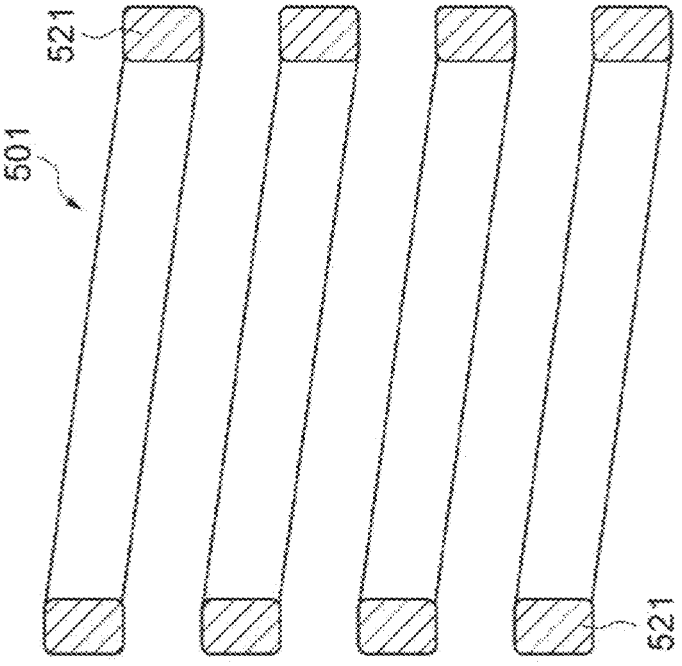

Each of FIGS. 81A and 81B is a sectional view of a coil according to yet another exemplary embodiment.

DETAILED DESCRIPTION

Hereinafter, various exemplary embodiments will be described in detail with reference to the drawings, in which the same or corresponding portions are designated by the same reference numerals.

Figure 1:
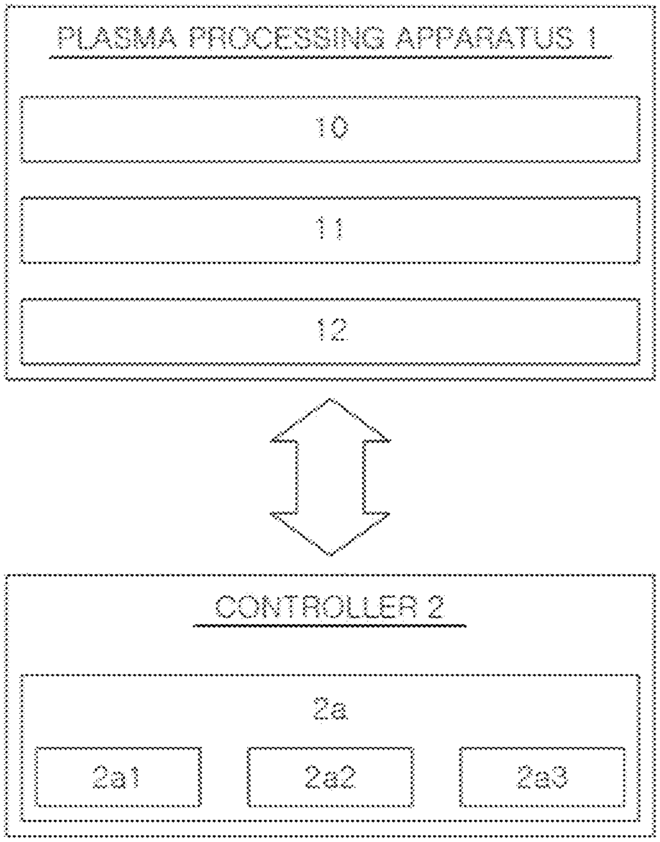
FIG. 1 is a diagram illustrating an example of a configuration of a plasma processing system.

FIG. 1 is a diagram illustrating an example of a configuration of a plasma processing system. In an embodiment, the plasma processing system includes a plasma processing apparatus 1 and a controller (control circuitry, processing circuitry) 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 has at least one gas inlet for supplying at least one processing gas to the plasma processing space and at least one gas outlet for discharging the gas from the plasma processing space. The gas inlet is connected to a gas supply portion 20 to be described later, and the gas outlet is connected to an exhaust system 40 to be described later. The substrate support 11 is disposed within the plasma processing space and has a substrate support surface for supporting a substrate.

The plasma generator 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance (ECR) plasma, a helicon wave excited plasma (HWP), or a surface wave plasma (SWP). Further, various types of plasma generators including an alternating current (AC) plasma generator and a direct current (DC) plasma generator may be used. In an embodiment, an AC signal (AC power) used in the AC plasma generator has a frequency in a range of 100 kHz to 10 GHz. Thus, the AC signal includes a radio frequency (RF) signal and a microwave signal. In an embodiment, the RF signal has a frequency in a range of 100 kHz to 150 MHz.

The controller 2 processes a computer executable instruction that causes the plasma processing apparatus 1 to execute various processes described in an embodiment of the present disclosure. The controller 2 may be configured to control each element of the plasma processing apparatus 1 so as to execute various processes described herein. In an embodiment, a part or all of the controller 2 may be included in the plasma processing apparatus 1. The controller 2 may include a processor **2*a*1, a memory unit 2*a*2, and a communication interface 2*a*3. The controller 2 is realized by, for example, a computer 2*a*. The processor 2*al* may be configured to perform various control operations by reading out a program from the memory unit 2*a*2 and executing the read out program. This program may be stored in advance in the memory unit 2*a*2, or may be acquired via a medium when necessary. The acquired program is stored in the memory unit 2*a*2, and is read out from the memory unit 2*a*2 and executed by the processor 2*a*1. The medium may be any of various memory media readable by the computer 2*a*, or may be a communication line connected to the communication interface 2*a*3. The processor 2*al* may be a central processing unit (CPU). The memory unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1** via a communication line such as a local area network (LAN).

Figure 2:
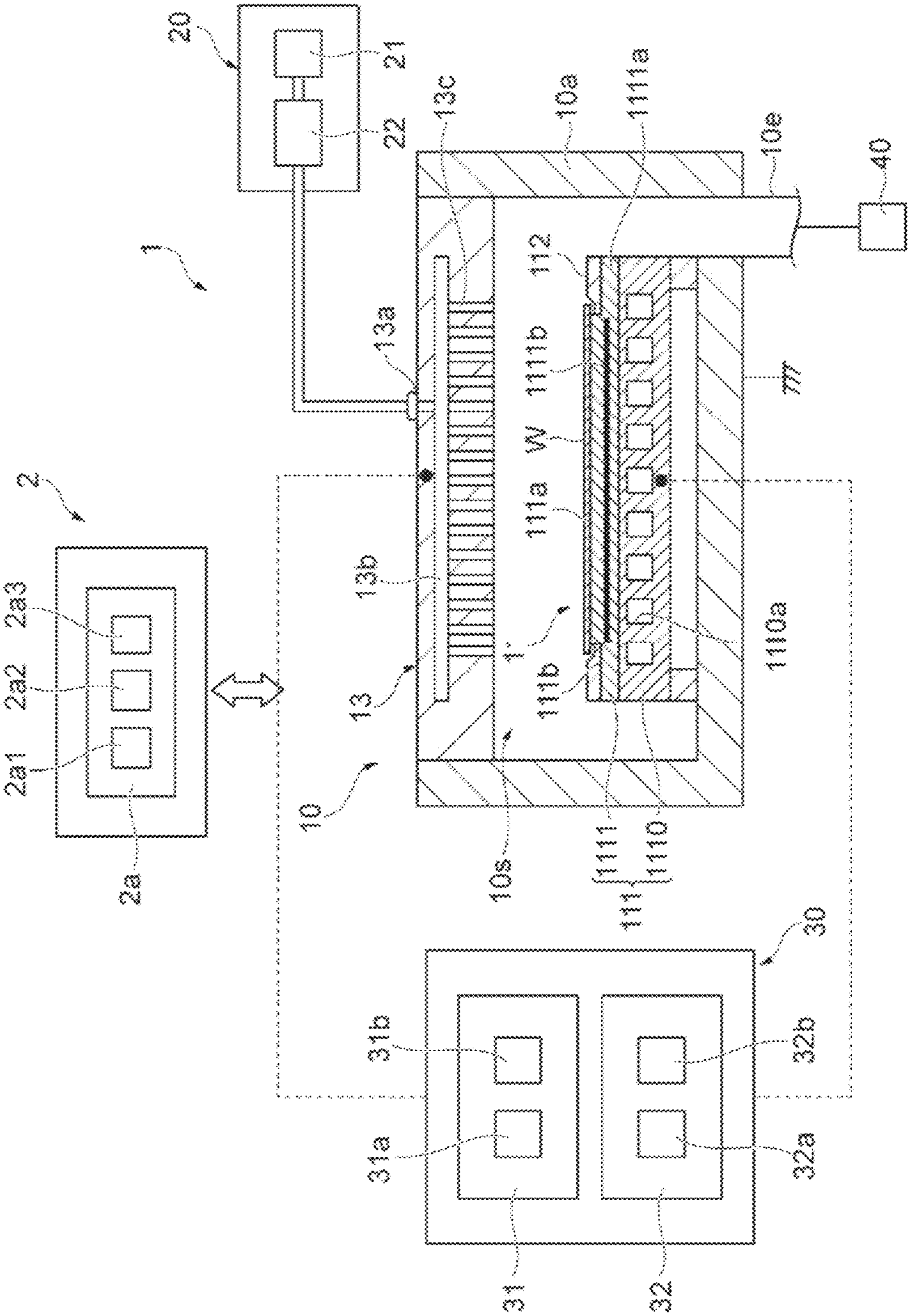
FIG. 2 is a diagram illustrating an example of a configuration of a capacitively coupled plasma processing apparatus.

Hereinafter, the configuration example of a capacitively coupled plasma processing apparatus as an example of the plasma processing apparatus 1 will be described. FIG. 2 is a diagram illustrating an example of a configuration of a capacitively coupled plasma processing apparatus.

The capacitively coupled plasma processing apparatus 1 includes the plasma processing chamber 10, a gas supply portion 20, a power supply 30, and an exhaust system 40. Further, the plasma processing apparatus 1 includes the substrate support 11 and a gas introduction portion. The gas introduction portion is configured to introduce at least one processing gas into the plasma processing chamber 10. The gas introduction portion includes a shower head 13. The substrate support 11 is disposed within the plasma processing chamber 10. The shower head 13 is disposed above the substrate support 11. In an embodiment, the shower head 13 forms at least portion of a ceiling of the plasma processing chamber 10. The plasma processing chamber 10 has a plasma processing space **10*s* defined by the shower head 13, a side wall 10*a* of the plasma processing chamber 10, and the substrate support 11. The plasma processing chamber 10 is grounded. The shower head 13 and the substrate support 11 are electrically insulated from a housing of the plasma processing chamber 10**.

The substrate support 11 includes a main body 111 and a ring assembly 112. The main body 111 has a central area 111*a* for supporting a substrate W, and an annular area 111*b* for supporting the ring assembly 112. The wafer is an example of the substrate W. The annular area 111*b* of the main body 111 surrounds the central area 111*a* of the main body 111 in a plan view. The substrate W is disposed on the central area 111*a* of the main body 111, and the ring assembly 112 is disposed on the annular area 111*b* of the main body 111 to surround the substrate W on the central area 111*a* of the main body 111. Accordingly, the central area 111*a* is also called a substrate support surface for supporting the substrate W, and the annular area 111*b* is also called a ring support surface for supporting the ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a* and an electrostatic electrode (also called an adsorption electrode, a chuck electrode, or a clamp electrode) 1111*b* disposed within the ceramic member 1111*a*. The ceramic member 1111*a* has the central area 111*a*. In an embodiment, the ceramic member 1111*a* also has the annular area 111*b*. Further, other members surrounding the electrostatic chuck 1111, such as an annular electrostatic chuck or an annular insulating member, may be provided in the annular area 111*b*. In this connection, the ring assembly 112 may be disposed on the annular electrostatic chuck or the annular insulating member, and may be disposed on both the electrostatic chuck 1111 and the annular insulating member. Further, at least one RF/DC electrode coupled to an RF power supply 31 and/or a DC power supply 32, which will be described later, may be disposed within the ceramic member 1111*a*. In this connection, at least one RF/DC electrode functions as a lower electrode. When a bias RF signal and/or a DC signal, which will be described later, is supplied to at least one RF/DC electrode, the RF/DC electrode is also referred to as a bias electrode. Further, the conductive member of the base 1110 and at least one RF/DC electrode may function as a plurality of lower electrodes. Further, the electrostatic electrode 1111*b* may function as a lower electrode. Accordingly, the substrate support 11 includes at least one lower electrode.

The ring assembly 112 includes one or more annular members. In an embodiment, the one or more annular members include one or more edge rings and at least one cover ring. The edge ring is formed of a conductive or insulating material, and the cover ring is formed of an insulating material.

Further, the substrate support 11 may include a temperature control module configured to adjust at least one of the electrostatic chuck 1111, the ring assembly 112, and the substrate W to a target temperature. The temperature control module may include a heater, a heat transfer medium, a flow path 1110*a*, or a combination thereof. A heat transfer fluid such as brine or gas flows through the flow path 1110*a*. In an embodiment, the flow path 1110*a* is formed in the base 1110, and one or more heaters are disposed within the ceramic member 1111*a* of the electrostatic chuck 1111. Further, the substrate support 11 may include a heat transfer gas supply portion configured to supply heat transfer gas to a gap between the back surface of the substrate W and the central area 111*a*.

The shower head 13 is configured to introduce at least one processing gas from the gas supply portion 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and then is introduced from the plurality of gas introduction ports 13*c* into the plasma processing space 10*s*. Further, the shower head 13 includes at least one upper electrode. In addition to the shower head 13, the gas introduction portion may include one or more side gas injectors (SGI) installed in one or more openings formed in the side wall 10*a*.

The gas supply portion 20 may include at least one gas source 21 and at least one flow controller 22. In an embodiment, the gas supply portion 20 is configured to supply at least one processing gas from a corresponding gas source 21 through a corresponding flow controller 22 to the shower head 13. The flow controller 22 may include, for example, a mass flow controller or a pressure-controlled flow controller. Further, the gas supply portion 20 may include at least one flow modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. Thereby, plasma is formed from at least one processing gas supplied to the plasma processing space 10*s*. Accordingly, the RF power supply 31 may function as at least a portion of the plasma generator 12. Further, by supplying a bias RF signal to at least one lower electrode, a bias potential may be generated on the substrate W, and ion components in the formed plasma may be attracted into the substrate W.

In an embodiment, the RF power supply 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. In an embodiment, the source RF signal has a frequency within the range of 10 MHz to 150 MHz. In an embodiment, the first RF generator 31*a* may be configured to generate a plurality of source RF signals having different frequencies. One or more generated source RF signals are supplied to at least one lower electrode and/or at least one upper electrode.

The second RF generator 31*b* is coupled to at least one lower electrode via at least one impedance matching circuit, and is configured to generate a bias RF signal (bias RF power). The frequency of the bias RF signal may be equal to or different from the frequency of the source RF signal. In an embodiment, the bias RF signal has a frequency that is lower than the frequency of the source RF signal. In an embodiment, the bias RF signal has a frequency within the range of 100 kHz to 60 MHz. In an embodiment, the second RF generator 31*b* may be configured to generate a plurality of bias RF signals having different frequencies. One or more generated bias RF signals are supplied to at least one lower electrode. Further, in various embodiments, at least one of the source RF signal and the bias RF signal may be pulsed.

The power supply 30 may also include the DC power supply 32 coupled to the plasma processing chamber 10. The DC power supply 32 includes a first DC generator 32*a* and a second DC generator 32*b*. In one embodiment, the first DC generator 32*a* is connected to at least one lower electrode and generates a first DC signal. The generated first DC signal is applied to at least one lower electrode. In one embodiment, the second DC generator 32*b* is connected to at least one upper electrode and generates a second DC signal. The generated second DC signal is applied to at least one upper electrode.

In various embodiments, the first DC signal or the second DC signal may be pulsed. In this connection, a sequence of voltage pulses is applied to at least one lower electrode and/or to at least one upper electrode. The voltage pulse may have a rectangular, trapezoidal, or triangular pulse waveform, or a combination of these pulse waveforms. In one embodiment, a waveform generator for generating a sequence of voltage pulses based on DC signals is connected between the first DC generator 32*a* and at least one lower electrode. Thus, the first DC generator 32*a* and the waveform generator are included in a voltage pulse generator. When the second DC generator 32*b* and the waveform generator are included in the voltage generator, the voltage pulse generator is connected to at least one upper electrode. The voltage pulses may have positive or negative polarity. The sequence of voltage pulses may also include one or more positive voltage pulses and one or more negative voltage pulses within one cycle. Further, the first DC generator 32*a* and the second DC generator 32*b* may be provided in addition to the RF power supply 31, or the first DC generator 32 a may replace the second RF generator 31*b*.

The exhaust system 40 may be, for example, connected to a gas outlet 10*e* in the bottom of the plasma processing chamber 10. The exhaust system 40 may include a pressure control valve and a vacuum pump. The pressure control valve regulates the pressure in the plasma processing space 10*s*. The vacuum pump may include a turbomolecular pump, a dry pump, or a combination of these.

Further, in the capacitively coupled plasma processing apparatus 1, the upper electrode is disposed so that the plasma processing space is located between the upper electrode and the substrate support 11. A high frequency power supply, such as the first RF generator 31*a*, is electrically connected to the upper electrode or the lower electrode within the substrate support 11. When the plasma processing apparatus 1 is an inductively coupled plasma processing apparatus, the antenna is disposed so that the plasma processing space is located between the antenna and the substrate support 11. The high frequency power supply, such as the first RF generator 31*a*, is electrically connected to the antenna. When the plasma processing apparatus 1 is a plasma processing apparatus that generates plasma by surface waves such as microwaves, the antenna is disposed so that the plasma processing space is located between the antenna and the substrate support 11. A high frequency power supply, such as the first RF generator 31*a*, is electrically connected to the antenna via a waveguide.

Hereinafter, plasma processing apparatuses according to various exemplary embodiments will be described. Each of the plasma processing apparatuses described below is configured to supply power to at least one power consuming member in the chamber 10 by wireless power feeding (electromagnetic inductive coupling) and may have the same configuration as the plasma processing apparatus 1.

Figure 3:
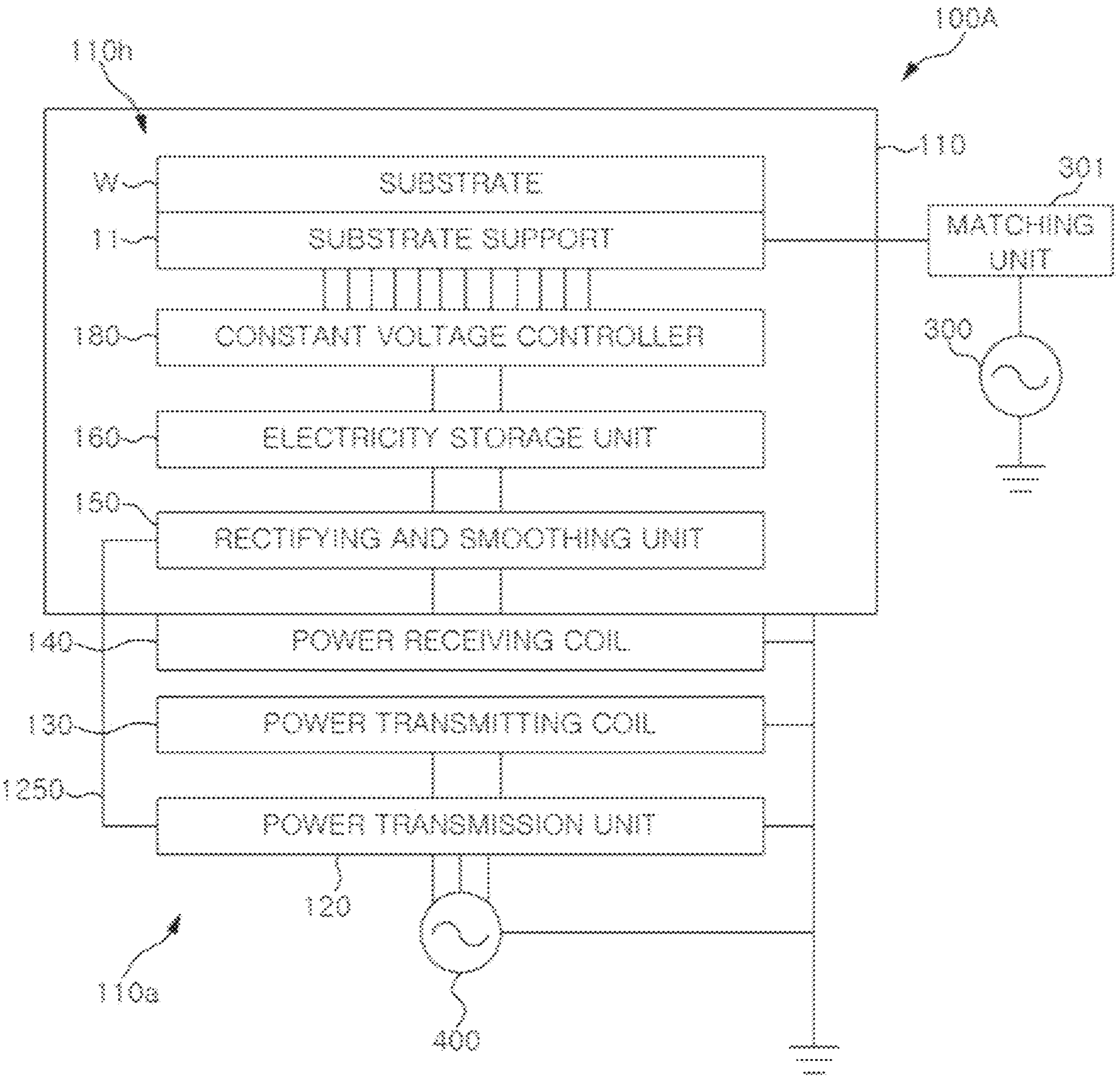
FIG. 3 is a diagram schematically illustrating a plasma processing apparatus according to one exemplary embodiment.

FIG. 3 is a diagram schematically illustrating a plasma processing apparatus according to one exemplary embodiment. A plasma processing apparatus 100A shown in FIG. 3 includes at least one high frequency power supply 300, a power receiving coil unit 140, an electricity storage unit 160, and at least one power consuming member 240 (see FIGS. 25 and 26). The plasma processing apparatus 100A may further include a power transmission unit 120, a power transmitting coil unit 130, a rectifying and smoothing unit 150, a constant voltage controller 180 (an example of a voltage controller), a ground frame 110, and a matching unit 301.

At least one high frequency power supply 300 includes the first RF generator 31*a* and/or the second RF generator 32*a*. At least one high frequency power supply 300 is electrically connected to the substrate support 11 via the matching unit 301. The matching unit 301 includes at least one impedance matching circuit.

The ground frame 110 includes the chamber 10 and is electrically grounded. The ground frame 110 electrically separates an internal space 110*h* (RF-Hot space) from an external space 110*a* (atmospheric space). The ground frame 110 surrounds the substrate support 11 disposed within the space 110*h*. In the plasma processing apparatus 100A, the rectifying and smoothing unit 150, the electricity storage unit 160, and the constant voltage controller 180 are disposed within the space 110*h*. In the plasma processing apparatus 100A, the power transmission unit 120, the power transmitting coil unit 130, and the power receiving coil unit 140 are disposed within the space 110*a*.

The devices disposed within the space 110*a*, that is, the power transmission unit 120, the power transmitting coil unit 130, and the power receiving coil unit 140, are covered by a metal housing made of a metal such as aluminum, and the metal housing is grounded. Thereby, this suppresses leakage of high frequency noise caused by high frequency power such as a first RF signal (source RF signal) and/or a second RF signal (bias RF signal). The metal housing and each power feeding line have an insulating distance therebetween. In the following description, high frequency power such as the first RF signal and/or the second RF signal propagating toward the power transmission unit 120 may be referred to as high frequency noise, common-mode noise, or conductive noise.

The power transmission unit 120 is electrically connected between an AC power supply 400 (for example, a commercial AC power supply) and the power transmitting coil unit 130. The power transmission unit 120 receives the frequency of AC power from the AC power supply 400 and converts the frequency of the AC power into a transmission frequency, thereby generating AC power having the transmission frequency, that is, transmission AC power.

The power transmitting coil unit 130 includes a power transmitting coil 131 (see FIG. 9), which will be described later. The power transmitting coil 131 is electrically connected to power transmission unit 120. The power transmitting coil 131 receives the transmission AC power from the power transmission unit 120 and wirelessly transmits the transmission AC power to a power receiving coil 141.

The power receiving coil unit 140 includes a power receiving coil 141 (see FIG. 9) which will be described later. The power receiving coil 141 is electromagnetically inductively coupled to the power transmitting coil 131. Electromagnetic induction coupling includes magnetic field coupling and electric field coupling. In addition, the magnetic field coupling includes magnetic resonance. The distance between the power receiving coil 141 and the power transmitting coil 131 is set so as to suppress common mode noise (conductive noise). Further, the distance between the power receiving coil 141 and the power transmitting coil 131 is set to a distance that allows power feeding. The distance between the power receiving coil 141 and the power transmitting coil 131 is set so that the attenuation of high frequency power (that is, high frequency noise) between the power receiving coil 141 and the power transmitting coil 131 is below a threshold value and so that power from the power transmitting coil 131 is received by the power receiving coil 141. The threshold value of the attenuation is set to a value that may sufficiently prevent damage or malfunction of the power transmission unit 120. The threshold value of the attenuation is, for example, −20 dB. The transmission AC power received by the power receiving coil unit 140 is output to the rectifying and smoothing unit 150.

The rectifying and smoothing unit 150 is electrically connected between the power receiving coil unit 140 and the electricity storage unit 160. The rectifying and smoothing unit 150 generates DC power by full-wave rectification and smoothing of the AC power transmitted from the power receiving coil unit 140. The DC power generated by the rectifying and smoothing unit 150 is stored in the electricity storage unit 160. The electricity storage unit 160 is electrically connected between the rectifying and smoothing unit 150 and the constant voltage controller 180. The rectifying and smoothing unit 150 may generate DC power by half-wave rectification and smoothing of the AC power transmitted from the power receiving coil unit 140.

The rectifying and smoothing unit 150 and the power transmission unit 120 are electrically connected to each other by a signal line 1250. The rectifying and smoothing unit 150 transmits an instruction signal to the power transmission unit 120 via the signal line 1250. The instruction signal is a signal for instructing the power transmission unit 120 to supply transmission AC power or to stop supplying transmission AC power. The instruction signal may include a status signal, an abnormality detection signal, and a cooling control signal for the power transmitting coil unit 130 and the power receiving coil unit 140.

The status signal is a value of the magnitude and/or phase of the voltage, current, power, etc. detected by a voltage detector 155*v* (see FIG. 14) and a current detector 155*i* (see FIG. 14) of the rectifying and smoothing unit 150. The abnormality detection signal is a signal for transmitting to the power transmission unit 120 the occurrence of a failure and/or an abnormal temperature in the rectifying and smoothing unit 150. The cooling control signal controls the cooling appliances provided in the power transmitting coil unit 130 and the power receiving coil unit 140. The cooling control signal controls the number of revolutions of a fan in the case of air cooling, for example. Further, in the case of liquid cooling, the flow rate and/or temperature of a coolant are controlled.

The constant voltage controller 180 applies a voltage to at least the power consuming member 240 using the power stored in the electricity storage unit 160. The constant voltage controller 180 may at least control the application of voltage to the power consuming member 240 and the stopping of the application.

In the plasma processing apparatus 100A, the power receiving coil 141 functions as a filter against high frequency noise caused by high frequency power such as the first RF signal and/or the second RF signal. Accordingly, the propagation of high frequency noise to the power supply outside the plasma processing apparatus is suppressed.

Figure 4:
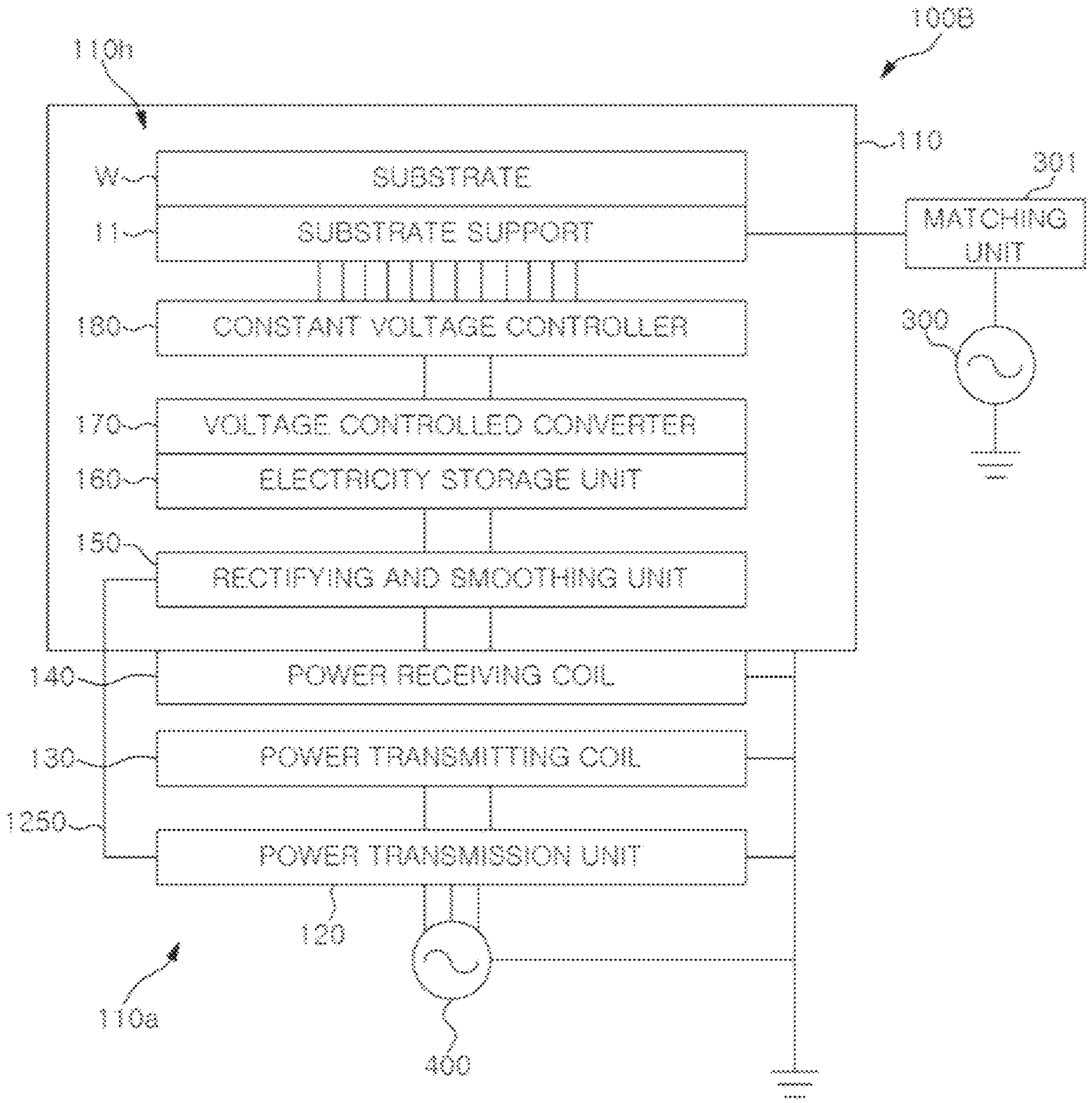
FIG. 4 is a diagram schematically illustrating a plasma processing apparatus according to another exemplary embodiment.

FIG. 4 is referred. FIG. 4 is a diagram schematically illustrating a plasma processing apparatus according to another exemplary embodiment. Hereinafter, a plasma processing apparatus 100B shown in FIG. 4 will be described from the viewpoint of its differences from the plasma processing apparatus 100A.

The plasma processing apparatus 100B further includes a voltage controlled converter 170. The voltage controlled converter 170 is a DC-DC converter, and is connected between the electricity storage unit 160 and the constant voltage controller 180. The voltage controlled converter 170 may be configured to input a constant output voltage to the constant voltage controller 180 even when a voltage fluctuation occurs in the electricity storage unit 160. Further, the voltage fluctuation in the electricity storage unit 160 may occur as a voltage drop or the like according to the stored power when the electricity storage unit 160 is configured with an electric double layer, for example.

Figure 5:
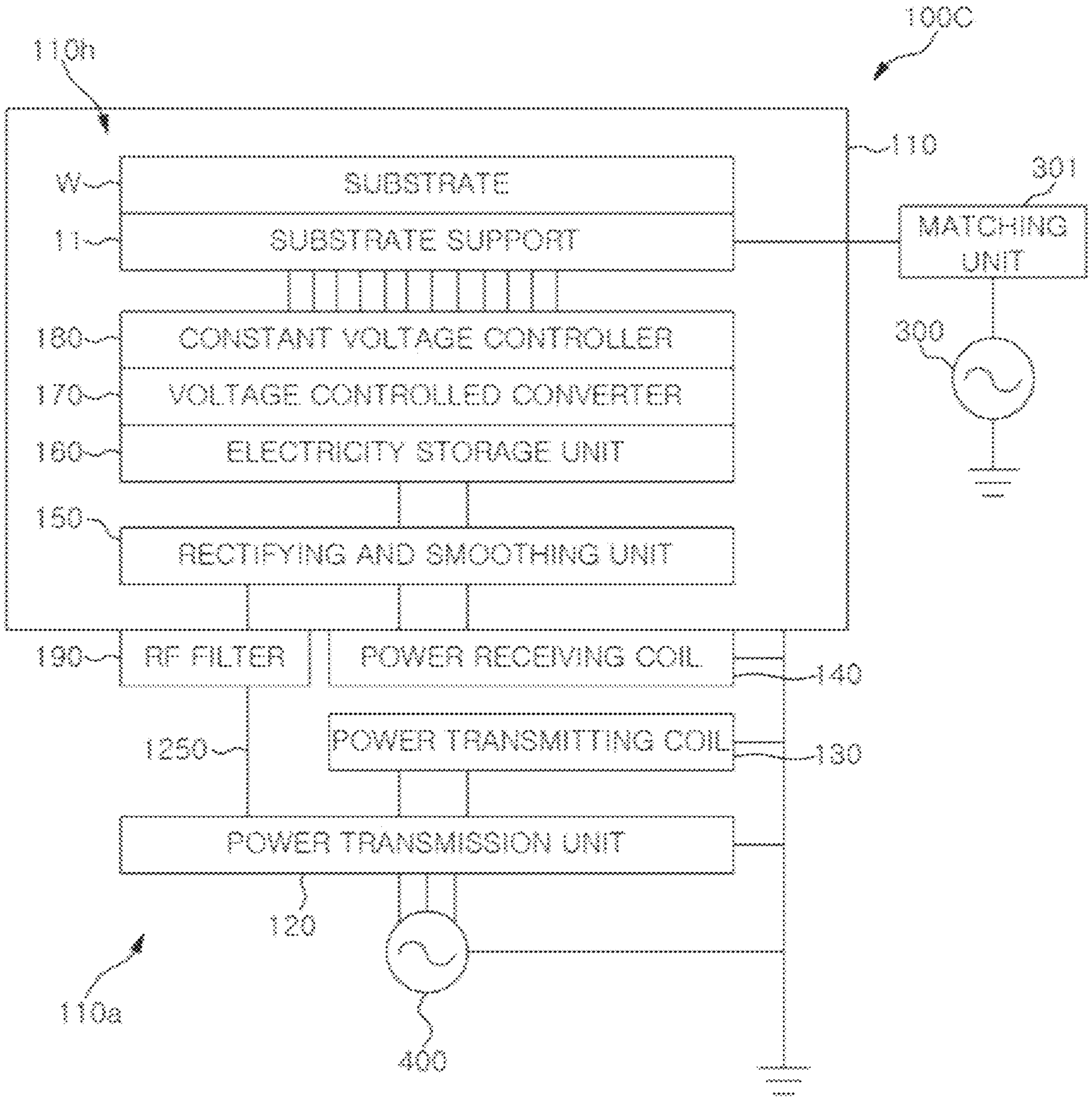
FIG. 5 is a diagram schematically illustrating a plasma processing apparatus according to yet another exemplary embodiment.

FIG. 5 is referred. FIG. 5 is a diagram schematically illustrating a plasma processing apparatus according to yet another exemplary embodiment. Hereinafter, a plasma processing apparatus 100C shown in FIG. 5 will be described from the viewpoint of its differences from the plasma processing apparatus 100B.

The plasma processing apparatus 100C further includes an RF filter 190. The RF filter 190 is connected between the rectifying and smoothing unit 150 and the power transmission unit 120. The RF filter 190 configures a portion of the signal line 1250. The RF filter 190 has the characteristic of suppressing the propagation of high frequency power (high frequency noise) via the signal line 1250. That is, the RF filter 190 includes a low-pass filter having a characteristic of having high impedance to high frequency noise (conductive noise) but passing an instruction signal of a relatively low frequency.

In the plasma processing apparatus 100C, the electricity storage unit 160, the voltage controlled converter 170, and the constant voltage controller 180 are integrated with one another. That is, the electricity storage unit 160, the voltage controlled converter 170, and the constant voltage controller 180 are all disposed within a single metal housing or formed on a single circuit board. This shortens the length of each of a pair of power feeding lines (positive line and negative line) connecting the electricity storage unit 160 and the voltage controlled converter 170 to each other. Furthermore, the lengths of the pair of power feeding lines connecting the electricity storage unit 160 and the voltage controlled converter 170 to each other may be made equal to each other. Furthermore, the length of each of the pair of power feeding lines (positive and negative lines) connecting the voltage controlled converter 170 and the constant voltage controller 180 to each other is shortened. Furthermore, the lengths of the pair of power feeding lines connecting the voltage controlled converter 170 and the constant voltage controller 180 to each other may be made equal to each other. Accordingly, malfunction and damage of a device caused by normal mode noise (voltage difference between lines of the positive and negative lines) is suppressed. When another metal body that shields the electromagnetic field is provided around a housing within the chamber 10, a single housing does not have to be made of metal.

Figure 6:
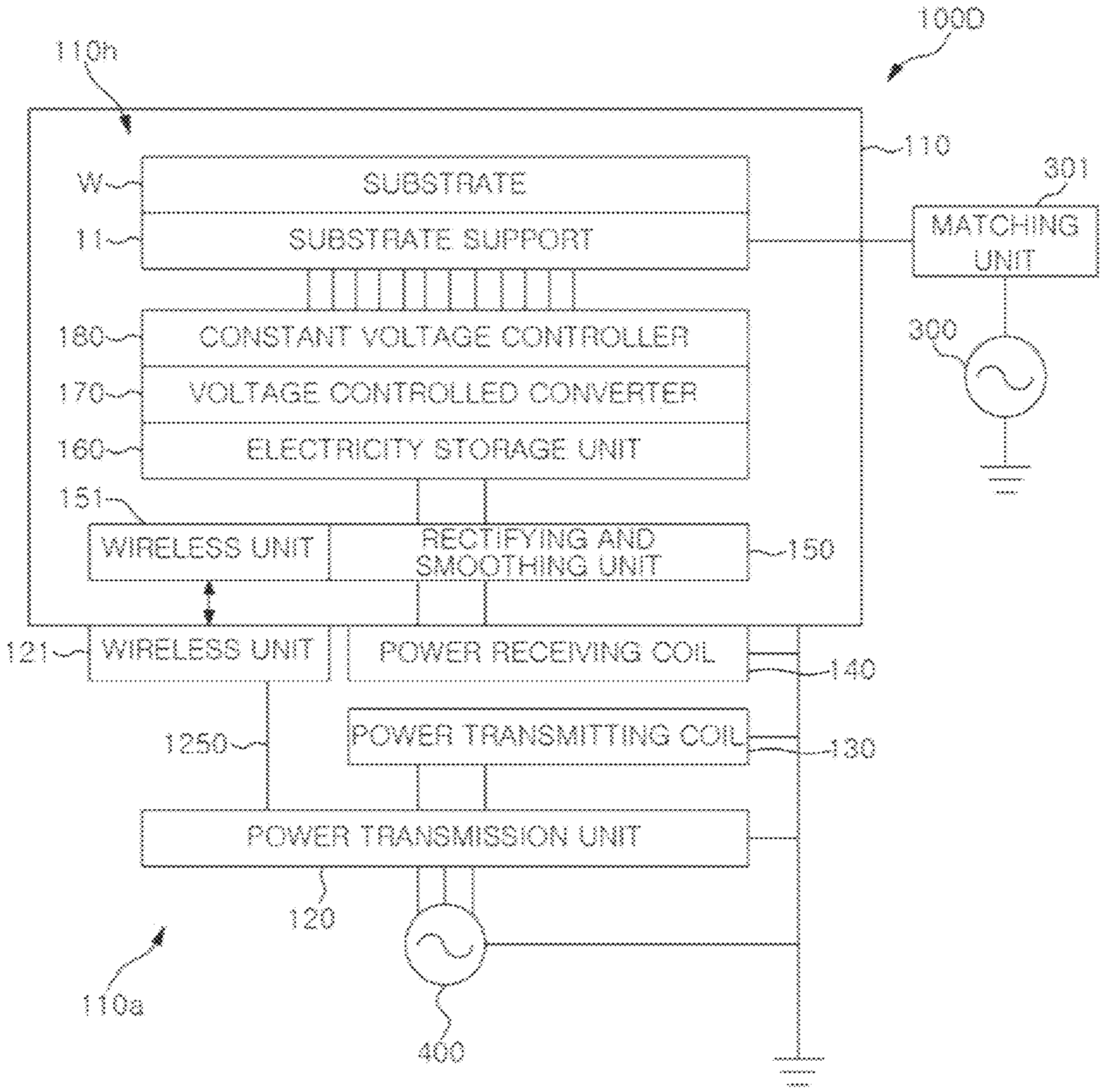
FIG. 6 is a diagram schematically illustrating a plasma processing apparatus according to yet another exemplary embodiment.

FIG. 6 is referred. FIG. 6 is a diagram schematically illustrating a plasma processing apparatus according to yet another exemplary embodiment. Hereinafter, a plasma processing apparatus 100D shown in FIG. 6 will be described from the viewpoint of its differences from the plasma processing apparatus 100C.

The plasma processing apparatus 100 D does not include the RF filter 190. In the plasma processing apparatus 100D, the rectifying and smoothing unit 150 includes a communication unit 151 which is a wireless unit. The power transmission unit 120 also includes a communication unit 121 which is a wireless unit. The aforementioned instruction signal is transmitted between the rectifying and smoothing unit 150 and the power transmission unit 120 using the communication unit 151 and the communication unit 121. The communication units 121 and 151 will be described in detail later.

Figure 7:
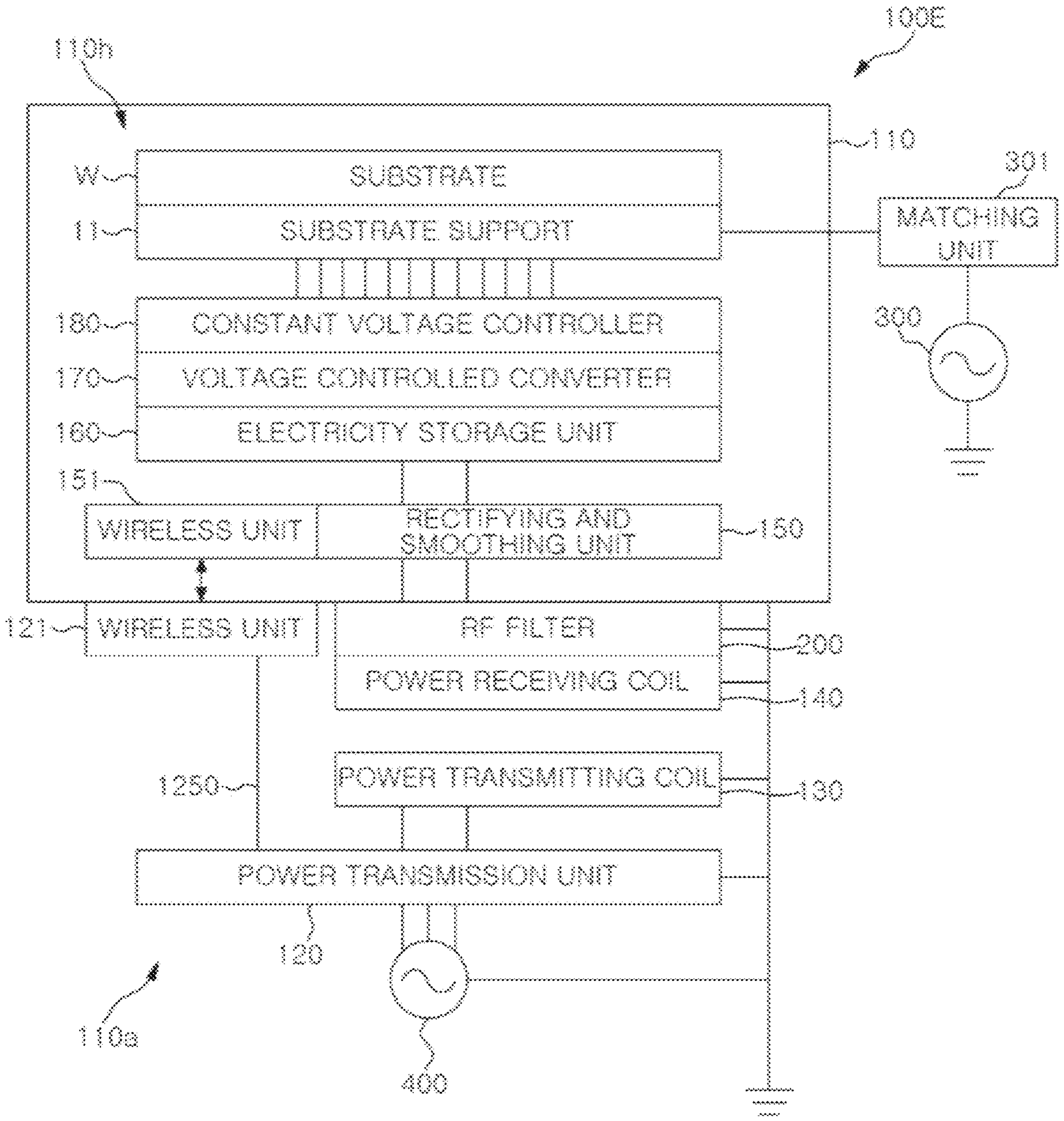
FIG. 7 is a diagram schematically illustrating a plasma processing apparatus according to yet another exemplary embodiment.

FIG. 7 is referred. FIG. 7 is a diagram schematically illustrating a plasma processing apparatus according to yet another exemplary embodiment. Hereinafter, a plasma processing apparatus 100E shown in FIG. 7 will be described from the viewpoint of its differences from the plasma processing apparatus 100D.

The plasma processing apparatus 100E further includes an RF filter 200. The RF filter 200 is connected between the power receiving coil unit 140 and the rectifying and smoothing unit 150. The RF filter 200 has the characteristic of reducing or blocking high frequency noise propagating from the power receiving coil unit 140 to the power transmitting coil 131 and the power transmission unit 120. The RF filter 200 will be described in detail later.

Hereinafter, configurations of each portion for wireless power feeding in the plasma processing apparatuses according to various exemplary embodiments will be described in detail.

[Configuration of Power Transmission Unit]

Figure 8:
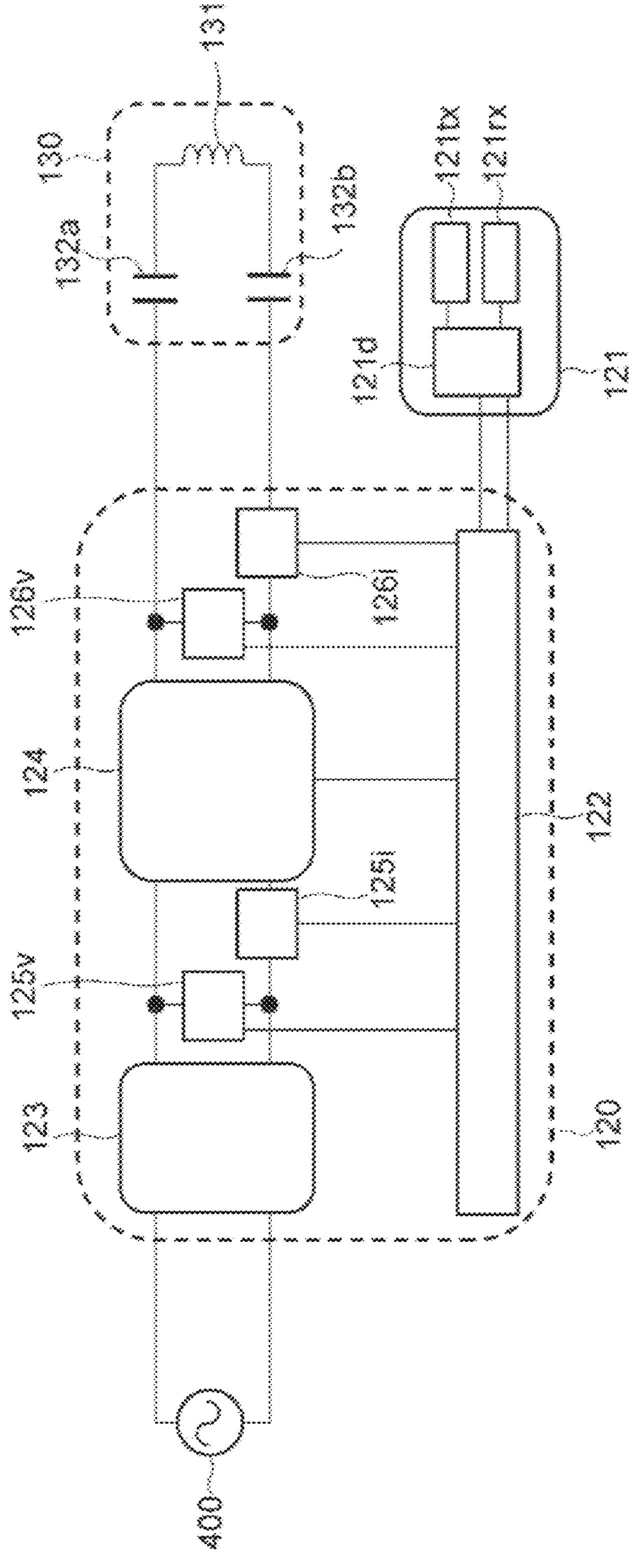
FIG. 8 is a diagram illustrating a power transmission unit according to one exemplary embodiment.

FIG. 8 is a diagram illustrating a power transmission unit according to one exemplary embodiment. As described above, the power transmission unit 120 receives the frequency of the AC power from the AC power supply 400 and converts the frequency of the AC power into a transmission frequency, thereby generating transmission AC power having the transmission frequency.

In one embodiment, the power transmission unit 120 includes a controller 122, a rectifying and smoothing unit 123, and an inverter 124. The controller 122 is configured of a processor such as a CPU or a programmable logic device such as an field-programmable gate array (FPGA).

The rectifying and smoothing unit 123 includes a rectifying circuit and a smoothing circuit (ripple filter). The rectifying circuit includes, for example, a diode bridge. The smoothing circuit includes, for example, an interline capacitor. The rectifying and smoothing unit 123 generates DC power by full-wave rectification and smoothing of the AC power from the AC power supply 400. Further, the rectifying and smoothing unit 123 may generate DC power by half-wave rectification and smoothing of the AC power from the AC power supply 400.

The inverter 124 generates transmission AC power having a transmission frequency from the DC power output by the rectifying and smoothing unit 123. The inverter 124 is, for example, a full-bridge inverter, and includes a plurality of triacs or a plurality of switching elements (for example, FETs). The inverter 124 generates the transmission AC power by ON/OFF control of the plurality of triacs or the plurality of switching elements by the controller 122. The transmission AC power output from the inverter 124 is output to the power transmitting coil unit 130.

The power transmission unit 120 may further include a voltage detector 125*v*, a current detector 125*i*, a voltage detector 126*v*, and a current detector 126*i*. The voltage detector 125*v* detects a voltage value between the pair of power feeding lines that connect the rectifying and smoothing unit 123 and the inverter 124 to each other. The current detector 125*i* detects a current value between the rectifying and smoothing unit 123 and the inverter 124. The voltage detector 126*v* detects a voltage value between the pair of power feeding lines that connect the inverter 124 and the power transmitting coil unit 130 to each other. The current detector 126*i* detects a current value between the inverter 124 and the power transmitting coil unit 130. The controller 122 is notified of the voltage value detected by the voltage detector 125*v*, the current value detected by the current detector 125*i*, the voltage value detected by the voltage detector 126*v*, and the current value detected by the current detector 126*i*.

The power transmission unit 120 includes the communication unit 121 described above. The communication unit 121 includes a driver 121*d*, a transmitter 121*tx*, and a receiver 121*rx*. The transmitter 121*tx* is a transmitter of a wireless signal or a transmitter of an optical signal. The receiver 121*rx* is a receiver of a wireless signal or a receiver of an optical signal. The communication unit 121 drives the transmitter 121*tx* using the driver 121*d* to output the signal from the controller 122 from the transmitter 121*tx* as a wireless signal or an optical signal. The signal output from the transmitter 121*tx* is received by the communication unit 151 (see FIG. 14) which will be described later. Furthermore, the communication unit 121 receives a signal such as the instruction signal described above from the communication unit 151 by the receiver 121*rx*, and inputs the received signal to the controller 122 via the driver 121*d*. The controller 122 switches between outputting and stopping the transmission AC power by controlling the inverter 124 in accordance with the instruction signal received from the communication unit 151 via the communication unit 121, the voltage value detected by the voltage detector 125*v*, the current value detected by the current detector 125*i*, the voltage value detected by the voltage detector 126*v*, and the current value detected by the current detector 126*i*.

[Power Transmitting Coil Unit and Power Receiving Coil Unit]

Figure 9:
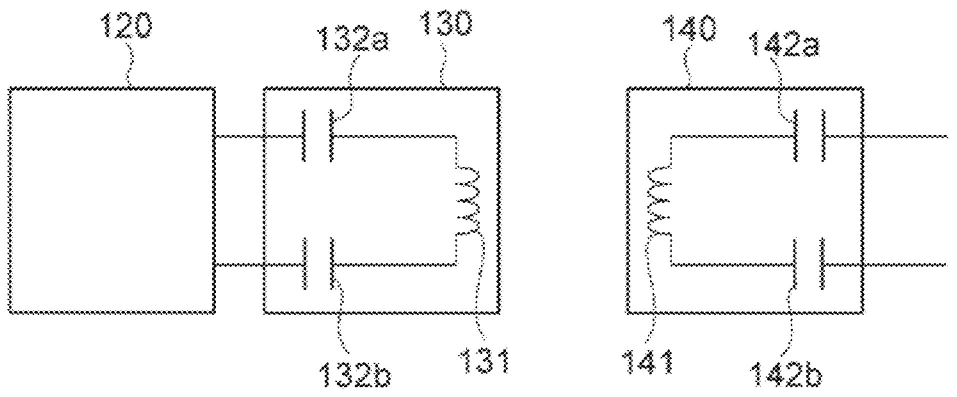
FIG. 9 is a diagram illustrating a power transmitting coil unit and a power receiving coil unit according to one exemplary embodiment.
Figure 10:
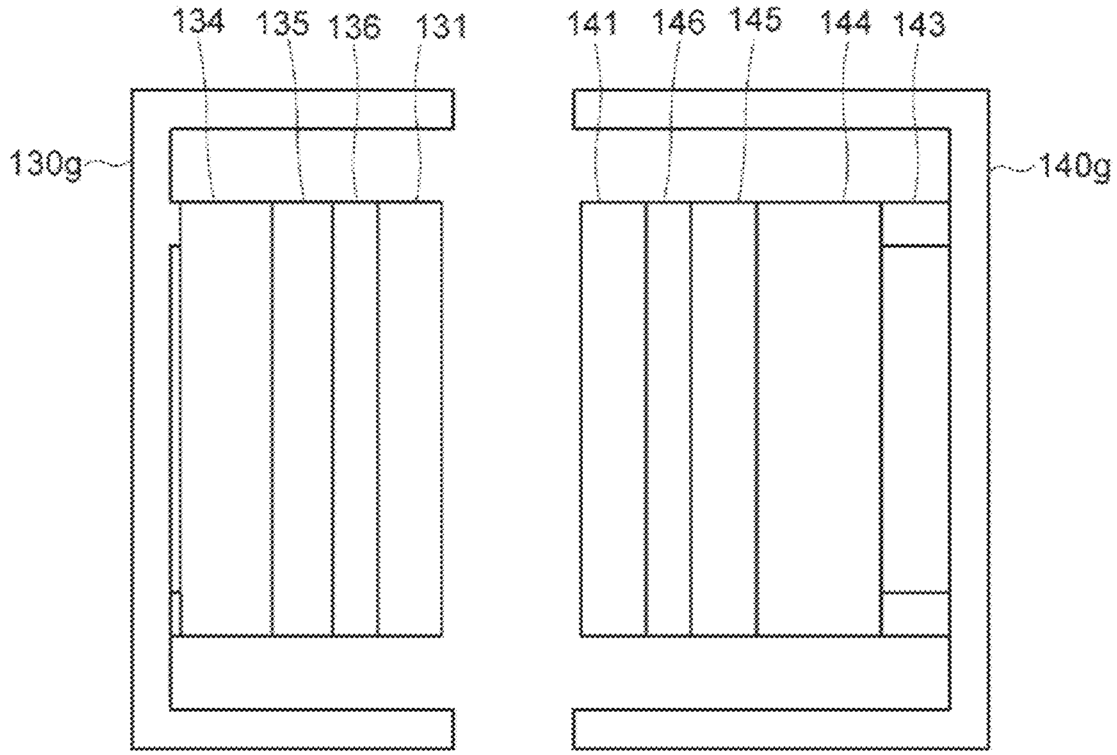
FIG. 10 is a diagram illustrating a power transmitting coil unit and a power receiving coil unit according to one exemplary embodiment.
Figure 11:
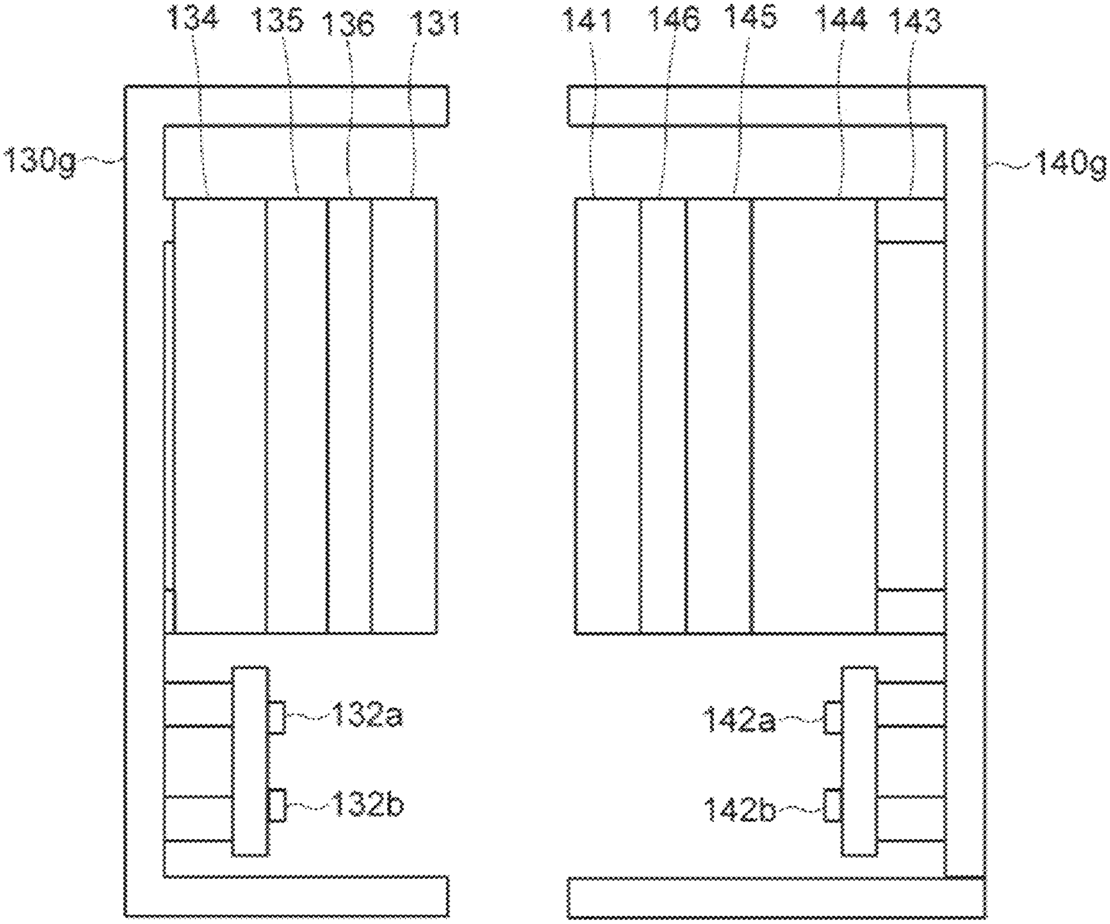
FIG. 11 is a diagram illustrating a power transmitting coil unit and a power receiving coil unit according to one exemplary embodiment.

FIGS. 9 to 11 are referred. Each of FIGS. 9 to 11 is a diagram illustrating a power transmitting coil unit and a power receiving coil unit according to one exemplary embodiment. As shown in FIG. 9, the power transmitting coil unit 130 may include, in addition to the power transmitting coil 131, a resonant capacitor 132*a* and a resonant capacitor 132*b*. The resonant capacitor 132*a* is connected between one of the pair of power feeding lines that connect the power transmission unit 120 and the power transmitting coil unit 130 to each other and one end of the power transmitting coil 131. The resonant capacitor 132*b* is connected between the other of the pair of power feeding lines and the other end of the power transmitting coil 131. The power transmitting coil 131, the resonant capacitor 132*a*, and the resonant capacitor 132*b* configure a resonant circuit for the transmission frequency. That is, the power transmitting coil 131, the resonant capacitor 132*a*, and the resonant capacitor 132*b* have a resonant frequency that is approximately equal to the transmission frequency. Further, the power transmitting coil unit 130 does not necessarily have to include either the resonant capacitor 132*a* or the resonant capacitor 132*b*.

As shown in FIGS. 10 and 11, the power transmitting coil unit 130 may further include a metal housing 130*g*. The metal housing 130*g* has an open end and is grounded. The power transmitting coil 131 is disposed within the metal housing 130*g* with an insulation distance secured therebetween. The power transmitting coil unit 130 may further include a heat sink 134, a ferrite material 135, and a thermally conductive sheet 136. The heat sink 134 is disposed within the metal housing 130*g* and is supported by the metal housing 130*g*. The ferrite material 135 is disposed on the heat sink 134. The thermally conductive sheet 136 is disposed on the ferrite material 135. The power transmitting coil 131 is disposed on the thermally conductive sheet 136 and faces the power receiving coil 141 via the open end of the metal housing 130*g*. As shown in FIG. 11, the resonant capacitor 132*a* and the resonant capacitor 132*b* may be further accommodated within the metal housing 130*g*.

As shown in FIG. 9, the power receiving coil unit 140 includes the power receiving coil 141. The power receiving coil 141 is electromagnetically inductively coupled to the power transmitting coil 131. The power receiving coil unit 140 may include, in addition to the power receiving coil 141, a resonant capacitor 142*a* and a resonant capacitor 142*b*. The resonant capacitor 142*a* is connected between one of the pair of power feeding lines extending from the power receiving coil unit 140 and one end of the power receiving coil 141. The resonant capacitor 142*b* is connected between the other of the pair of power feeding lines and the other end of the power receiving coil 141. The power receiving coil 141, the resonant capacitor 142*a*, and the resonant capacitor 142*b* configure a resonant circuit for the transmission frequency. That is, the power receiving coil 141, the resonant capacitor 142*a*, and the resonant capacitor 142*b* have a resonant frequency that is approximately equal to the transmission frequency. Further, the power receiving coil unit 140 does not necessarily have to include either the resonant capacitor 142*a* or the resonant capacitor 142*b*.

As shown in FIGS. 10 and 11, the power receiving coil unit 140 may further include a metal housing 140*g*. The metal housing 140*g* has an open end and is grounded. The power receiving coil 141 is disposed within the metal housing 140*g* with an insulation distance secured therebetween. The power receiving coil unit 140 may further include a spacer 143, a heat sink 144, a ferrite material 145, and a thermally conductive sheet 146. The spacer 143 is disposed within the metal housing 140*g* and is supported by the metal housing 140*g*. The spacer 143 will be described later. The heat sink 144 is disposed on the spacer 143. The ferrite material 145 is disposed on the heat sink 144. The thermally conductive sheet 146 is disposed on the ferrite material 145. The power receiving coil 141 is disposed on the thermally conductive sheet 146 and faces the power transmitting coil 131 via the open end of the metal housing 140*g*. As shown in FIG. 11, the resonant capacitor 142*a* and the resonant capacitor 142*b* may be further accommodated within the metal housing 140*g*.

The spacer 143 is made of a dielectric material and is provided between the power receiving coil 141 and the metal housing 140*g* (ground). The spacer 143 provides a space stray capacity between the power receiving coil 141 and the ground.

[Impedance Characteristics of Power Receiving Coil Unit]

Figure 12:
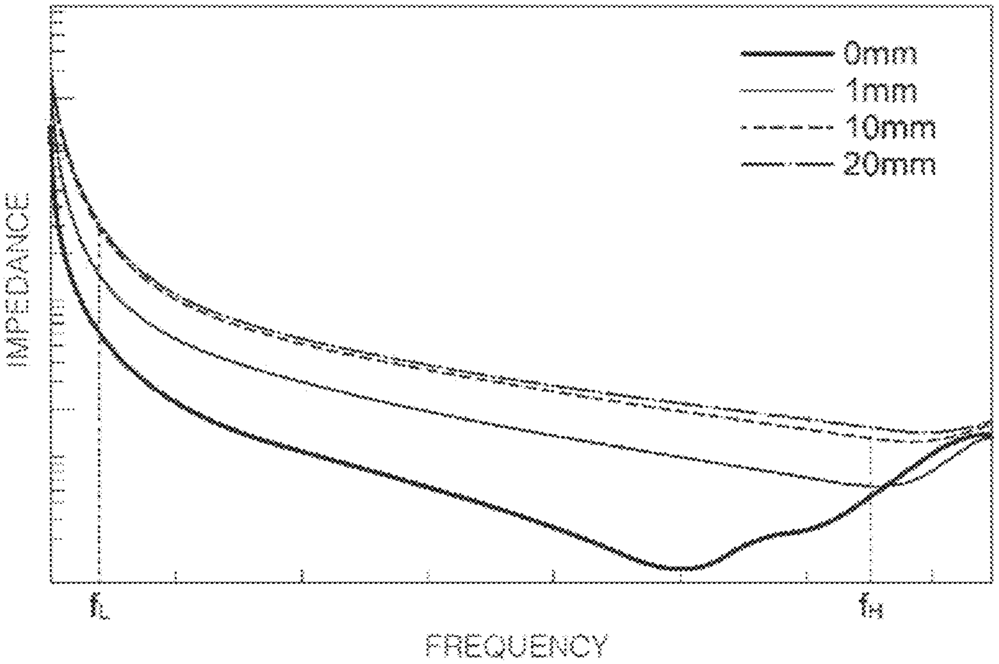
FIG. 12 is a graph showing the impedance characteristics of a power receiving coil unit according to one exemplary embodiment.

FIG. 12 is referred. FIG. 12 is a graph showing the impedance characteristics of a power receiving coil unit according to one exemplary embodiment. FIG. 12 shows the impedance characteristics of the power receiving coil unit 140 according to the thickness of the spacer 143. The thickness of the spacer 143 corresponds to the distance between the heat sink 144 and the metal housing 140*g*. As shown in FIG. 12, the power receiving coil unit 140 may adjust the impedance of each of frequencies fu and fi in accordance with the thickness of the spacer 143. Accordingly, the power receiving coil unit 140 may provide high impedance at each of the frequencies of two high frequency powers used in the plasma processing apparatus, such as the first RF signal and the second RF signal. Furthermore, since a high impedance may be obtained in the power receiving coil unit 140, the loss of high frequency power may be suppressed and a high processing rate (for example, an etching rate) may be obtained.

[RF Filter 200]

Figure 13:
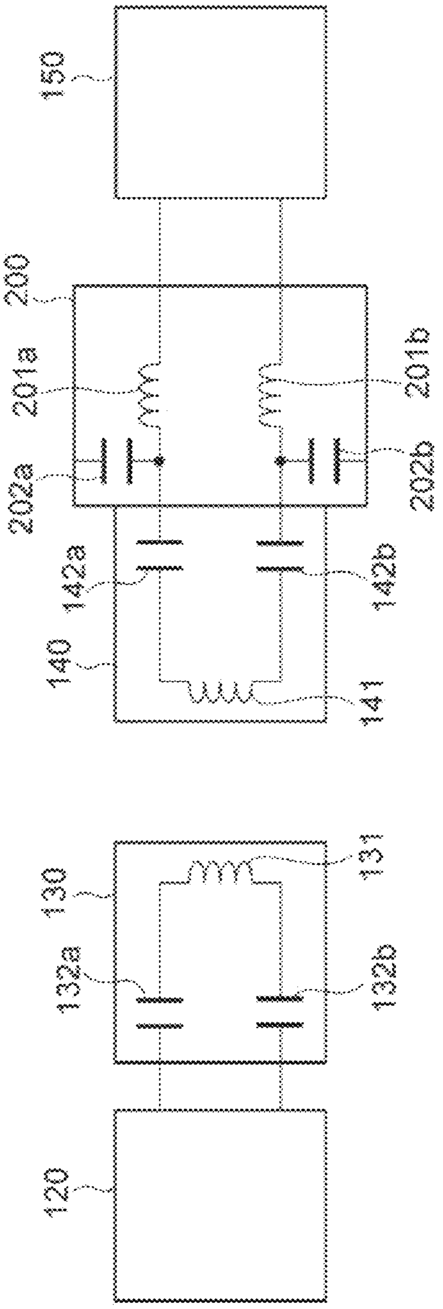
FIG. 13 is a diagram illustrating an RF filter according to one exemplary embodiment.

FIG. 13 is referred. FIG. 13 is a diagram illustrating an RF filter according to one exemplary embodiment. As shown in FIG. 13, the RF filter 200 is connected between the power receiving coil unit 140 and the rectifying and smoothing unit 150. The RF filter 200 includes an inductor 201*a*, an inductor 201*b*, a termination capacitor 202*a*, and a termination capacitor 202*b*. One end of the inductor 201 a is connected to the resonant capacitor 142*a*, and the other end of the inductor 201*a* is connected to the rectifying and smoothing unit 150. One end of the inductor 201*b* is connected to the resonant capacitor 142*b*, and the other end of the inductor 201*b* is connected to the rectifying and smoothing unit 150. The termination capacitor 202*a* is connected between one end of the inductor 201*a* and the ground. The termination capacitor 202*b* is connected between one end of the inductor 201*b* and the ground. The inductor 201*a* and the termination capacitor 202*a* form a low pass filter. Additionally, the inductor 201*b* and the termination capacitor 202*b* form a low pass filter. The RF filter 200 makes it possible to obtain a high impedance at each of the frequencies of the two high frequency powers used in the plasma processing apparatus, such as the first RF signal and the second RF signal. Accordingly, the loss of high frequency power may be suppressed, and a high processing rate (for example, etching rate) may be obtained.

[Rectifying and Smoothing Unit]

Figure 14:
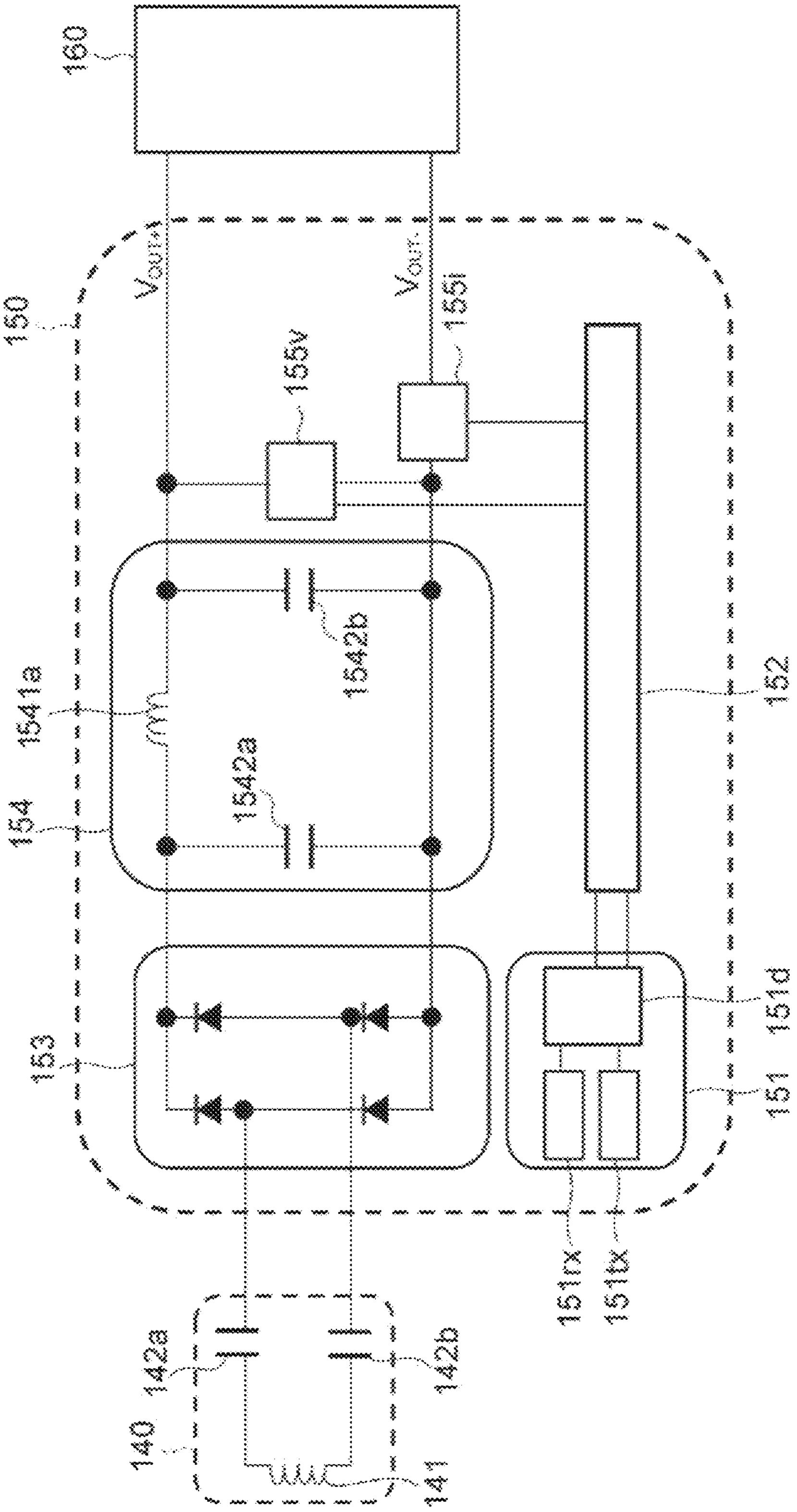
FIG. 14 is a diagram illustrating a rectifying and smoothing unit according to one exemplary embodiment.

FIG. 14 is referred. FIG. 14 is a diagram illustrating a rectifying and smoothing unit according to one exemplary embodiment. In one embodiment, the rectifying and smoothing unit 150 includes a controller 152, a rectifying circuit 153, and a smoothing circuit 154. The rectifying circuit 153 is connected between the power receiving coil unit 140 and the smoothing circuit 154. The smoothing circuit 154 is connected between the rectifying circuit 153 and the electricity storage unit 160. The controller 152 is configured of a processor such as a CPU or a programmable logic device such as an field-programmable gate array (FPGA). Further, the controller 152 may be the same as or different from the controller 122.

The rectifying circuit 153 outputs power generated by full-wave rectification of the AC power from the power receiving coil unit 140. The rectifying circuit 153 is, for example, a diode bridge. Further, the rectifying circuit 153 may output power generated by half-wave rectification of the AC power from the power receiving coil unit 140.

The smoothing circuit 154 generates DC power by smoothing the power from the rectifying circuit 153. The smoothing circuit 154 may include an inductor 1541*a*, a capacitor 1542*a*, and a capacitor 1542*b*. One end of the inductor 1541*a* is connected to one of a pair of inputs of the smoothing circuit 154. The other end of the inductor 1541*a* is connected to a positive output ($V_{OUT+}$) of the rectifying and smoothing unit 150. The positive output of the rectifying and smoothing unit 150 is connected to one end of each of one or more capacitors of the electricity storage unit 160 via a positive line 160*p* (see FIGS. 23A and 23B) of the pair of power feeding lines described below.

One end of the capacitor 1542*a* is connected to one of the pair of inputs of the smoothing circuit 154 and one end of the inductor 1541*a*. The other end of the capacitor 1542*a* is connected to the other of a pair of outputs of the smoothing circuit 154 and a negative output ($V_{OUT-}$) of the rectifying and smoothing unit 150. The negative output of the rectifying and smoothing unit 150 is connected to the other end of each of one or more capacitors of the electricity storage unit 160 via a negative line 160*m* (see FIGS. 23A and 23B) of the pair of power feeding lines described below. One end of the capacitor 1542*b* is connected to the other end of the inductor 1541*a*. The other end of the capacitor 1542*b* is connected to the other of the pair of outputs of the smoothing circuit 154 and the negative output ($V_{OUT-}$) of the rectifying and smoothing unit 150.

The rectifying and smoothing unit 150 may further include a voltage detector 155*v* and a current detector 155*i*. The voltage detector 155*v* detects a voltage value between the positive output and the negative output of the rectifying and smoothing unit 150. The current detector 155*i* detects a current value between the rectifying and smoothing unit 150 and the electricity storage unit 160. The voltage value detected by the voltage detector 155*v* and the current value detected by the current detector 155*i* are notified to the controller 152. The controller 152 generates the instruction signal described above in accordance with the power stored in the electricity storage unit 160. For example, when the power stored in the electricity storage unit 160 is equal to or less than a first threshold value, the controller 152 generates an instruction signal to instruct the power transmission unit 120 to feed power, that is, to output transmission AC power. The first threshold value is the power consumption at a load, for example, the power consuming member 240. In addition, considering margin, the power consumption of a load such as the power consuming member 240 may be multiplied by a certain value (for example, a value within the range of 1 to 3). When the power stored in the electricity storage unit 160 is greater than a second threshold value, the controller 152 generates an instruction signal to instruct the power transmission unit 120 to stop feeding power, that is, to stop outputting the transmission AC power. The second threshold value is a value that does not exceed limit electricity storage power of the electricity storage unit 160. The second threshold value is, for example, a value obtained by multiplying the limit electricity storage power of the electricity storage unit 160 by a certain value (for example, a value equal to or less than 1).

The rectifying and smoothing unit 150 includes the communication unit 151 described above. The communication unit 151 includes a driver 151*d*, a transmitter 151*tx*, and a receiver 151*rx*. The transmitter 151*tx* is a transmitter of a wireless signal or a transmitter of an optical signal. The receiver 151*rx* is a receiver of a wireless signal or a receiver of an optical signal. The communication unit 151 drives the transmitter 151*tx* by the driver 151*d* to output a signal from the controller 122, such as an instruction signal, from the transmitter 151*tx* as a wireless signal or an optical signal. The signal output from the transmitter 151*tx* is received by the communication unit 121 of the power transmission unit 120. Furthermore, the communication unit 151 receives a signal from the communication unit 121 by the receiver 151*rx*, and inputs the received signal to the controller 152 via the driver 151*d*.

[RF Filter 190]

Figure 15:
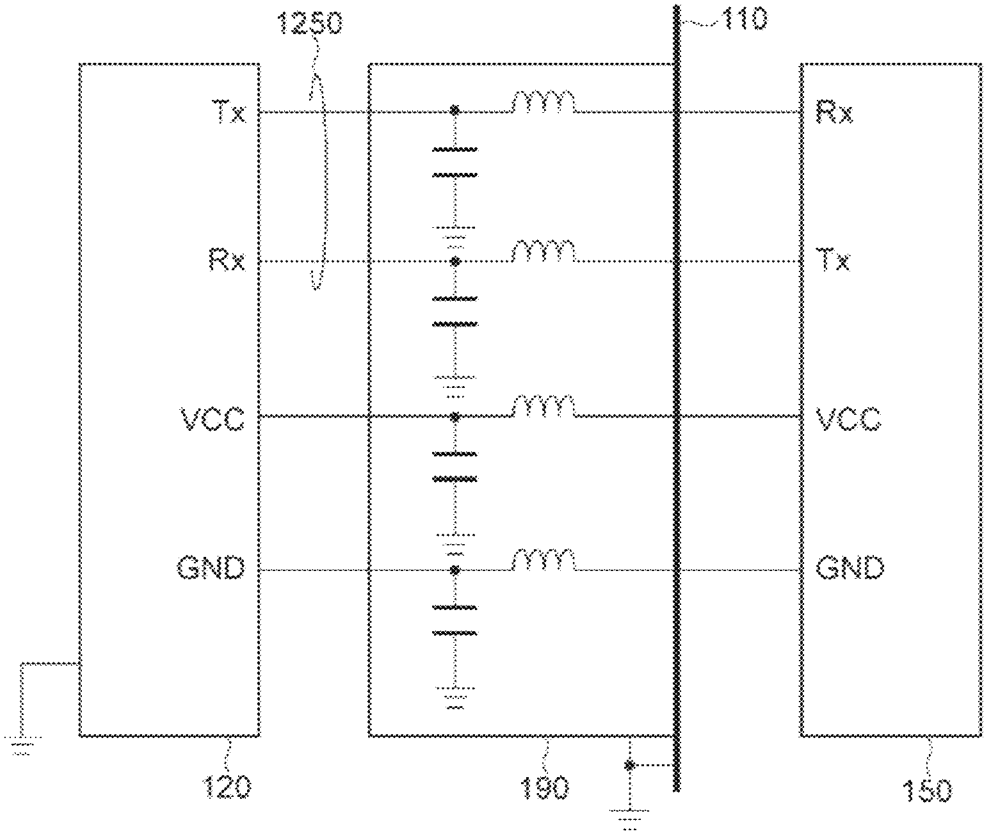
FIG. 15 is a diagram illustrating an RF filter according to one exemplary embodiment.

FIG. 15 is referred. FIG. 15 is a diagram illustrating the RF filter 190 according to one exemplary embodiment. As shown in FIG. 15, the signal line 1250 may include a first signal line electrically connecting a signal output (Tx) of the power transmission unit 120 and a signal input (Rx) of the rectifying and smoothing unit 150, and a second signal line electrically connecting the signal input (Rx) of the power transmission unit 120 and the signal output (Tx) of the rectifying and smoothing unit 150. The signal line 1250 may include a signal line connecting a first reference voltage terminal (VCC) of the power transmission unit 120 and the first reference voltage terminal (VCC) of the rectifying and smoothing unit 150, and a signal line connecting a second reference voltage terminal (GND) of the power transmission unit 120 and the second reference voltage terminal (GND) of the rectifying and smoothing unit 150. The signal line 1250 may be a shielded cable covered with a shield at ground potential. In this connection, a plurality of signal lines constituting the signal line 1250 may be individually covered with a shield or may be collectively covered with a shield. The RF filter 190 provides a low pass filter for each of the plurality of signal lines constituting the signal line 1250. The low pass filter may be an LC filter including an inductor and a capacitor. The inductor of the low pass filter forms a portion of the corresponding signal line. The capacitor is connected between one end of the inductor connected to the power transmission unit 120 and the ground. The RF filter 190 makes it possible to suppress the propagation of high frequency power (high frequency noise) via the signal line 1250 between the rectifying and smoothing unit 150 and the power transmission unit 120.

[Communication Unit of Power Transmission Unit and Communication Unit of Rectifying and Smoothing Unit]

Figure 16:
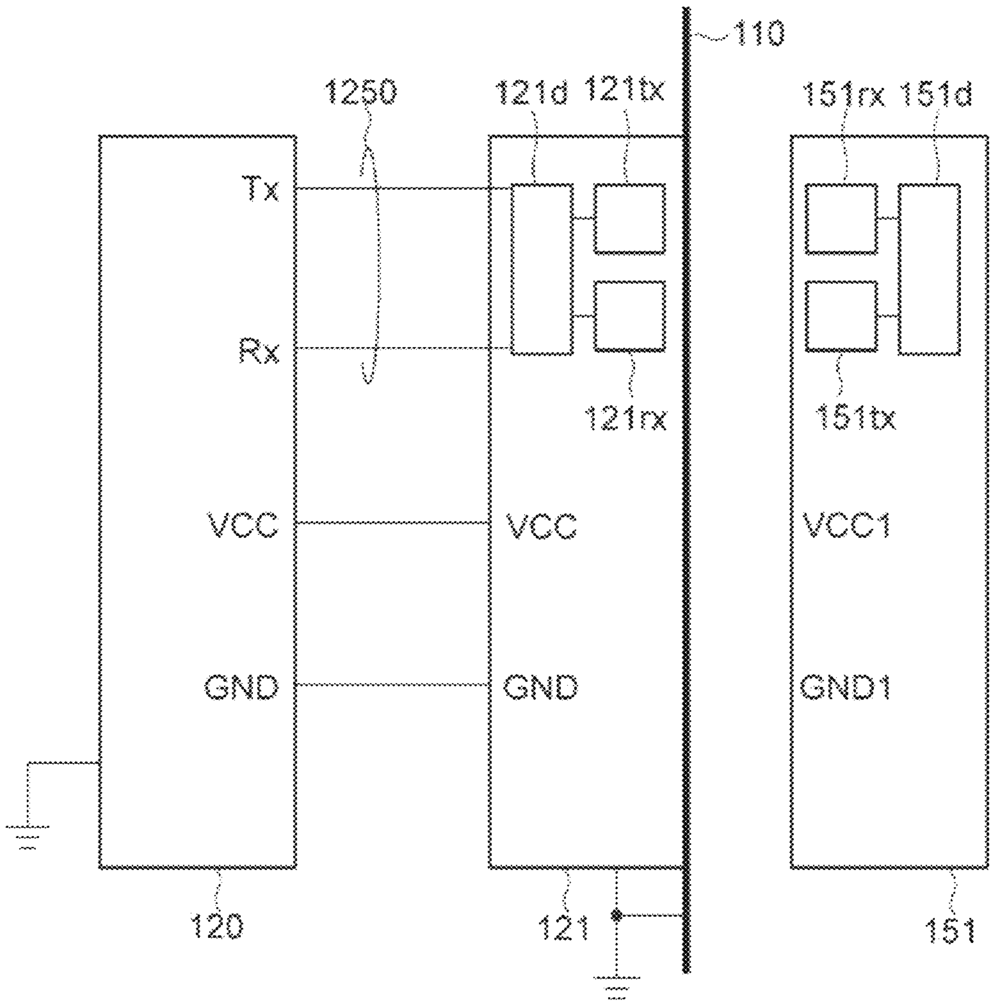
FIG. 16 is a diagram illustrating a communication unit of a power transmission unit and a communication unit of a rectifying and smoothing unit according to one exemplary embodiment.
Figure 17:
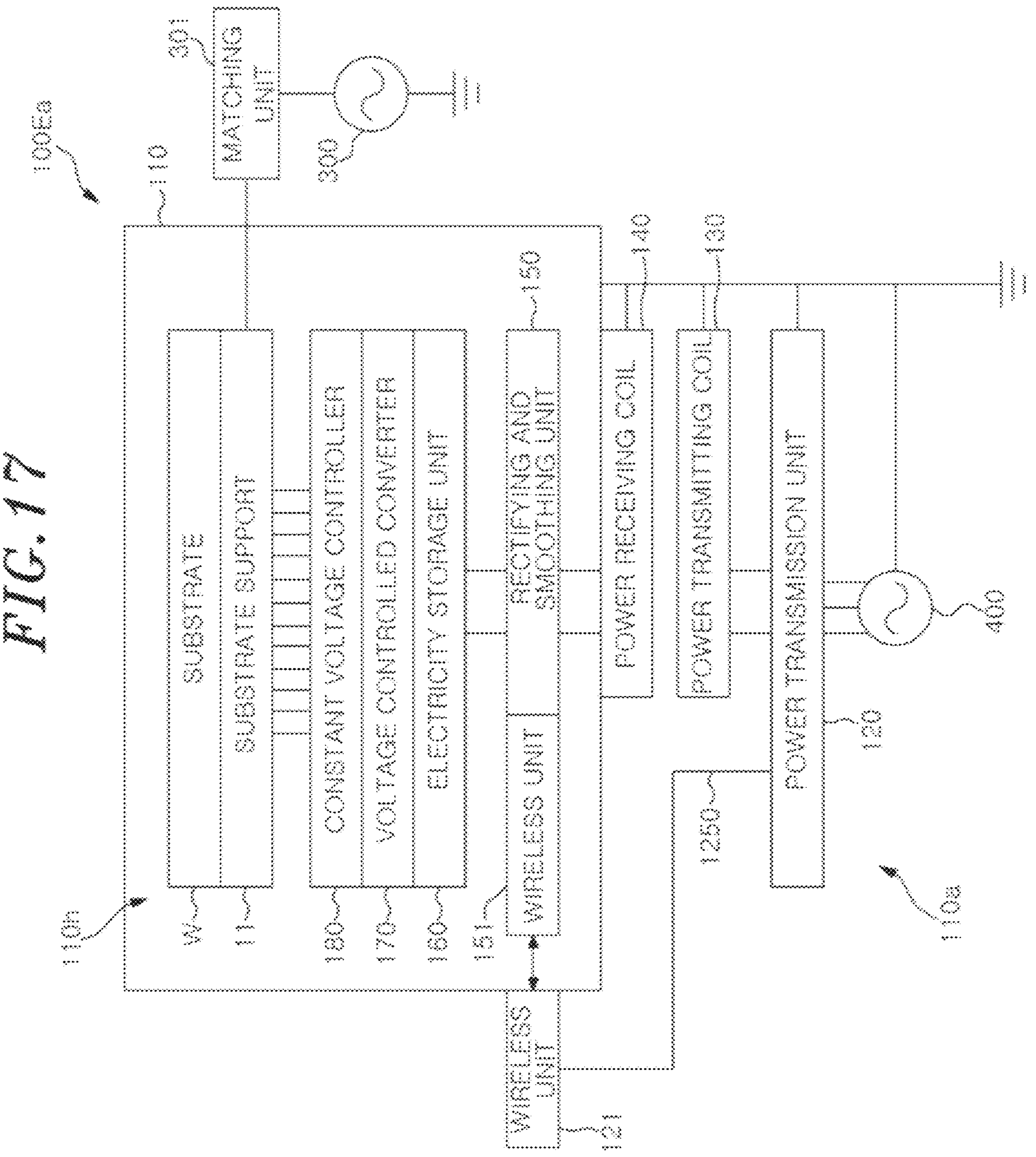
FIG. 17 is a diagram schematically illustrating a plasma processing apparatus according to yet another exemplary embodiment.
Figure 18:
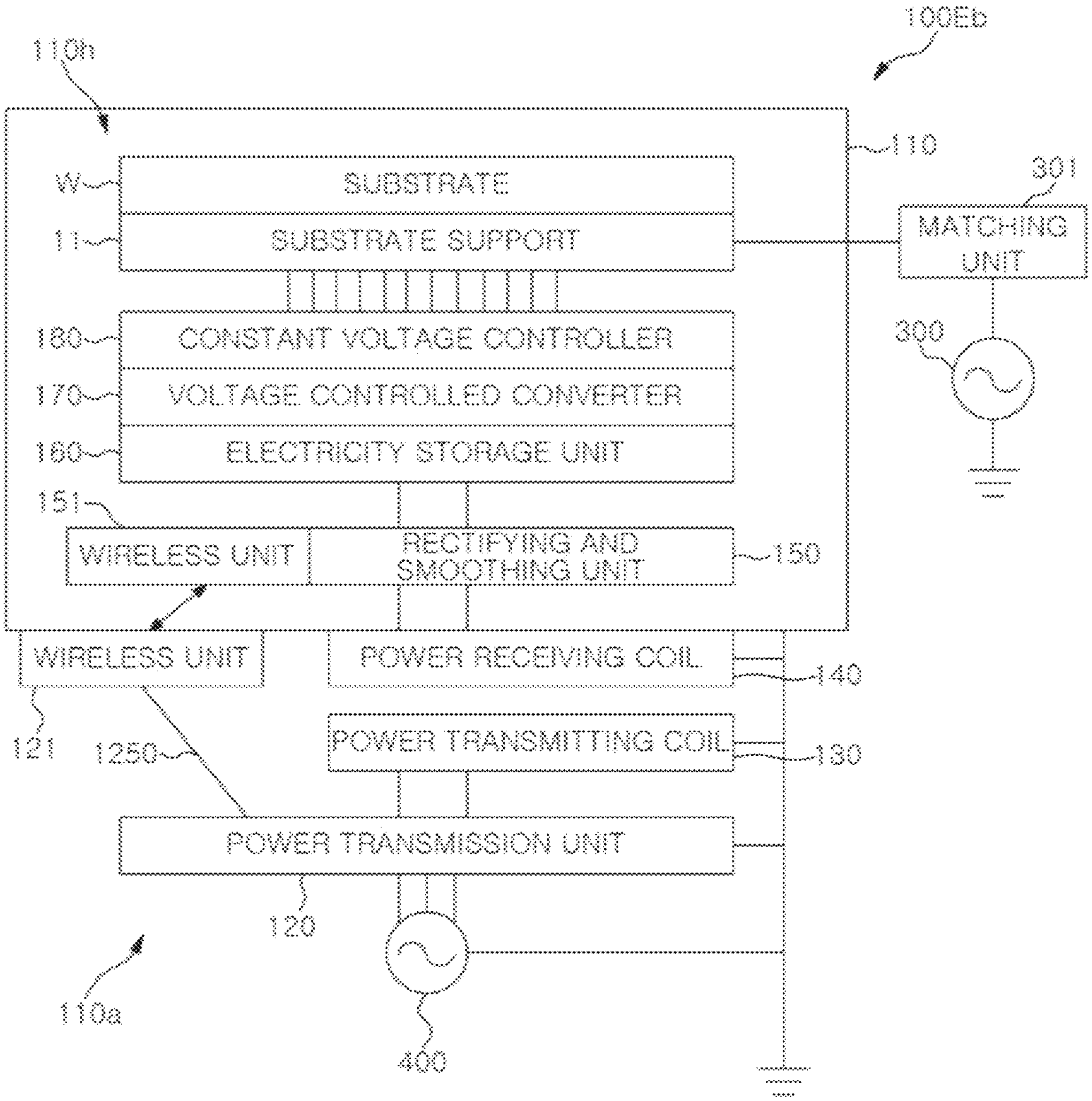
FIG. 18 is a diagram schematically illustrating a plasma processing apparatus according to yet another exemplary embodiment.

FIGS. 16 to 18 are referred. FIG. 16 is a diagram illustrating a communication unit of a power transmission unit and a communication unit of a rectifying and smoothing unit according to one exemplary embodiment. Each of FIGS. 17 and 18 is a diagram schematically illustrating a plasma processing apparatus according to yet another exemplary embodiment. As shown in FIGS. 6, 7, 16, 17, and 18, the communication unit 121 and the communication unit 151 may be configured to transmit signals such as the instruction signal described above between each other via wireless communication. The communication via wireless communication may be performed by optical communication. When the communication unit 121 and the communication unit 151 transmit signals therebetween via wireless communication, the communication unit 121 and the communication unit 151 may be disposed in any location as long as there is no shielding material interposed therebetween. According to the examples shown in these drawings, the RF filter 190 is not required. Further, in various exemplary embodiments including the examples shown in FIGS. 16 to 18, the signal line 1250 may be a shielded cable covered with a shield at ground potential. In this connection, the plurality of signal lines constituting the signal line 1250 may be individually covered with a shield or may be collectively covered with a shield.

Figure 19:
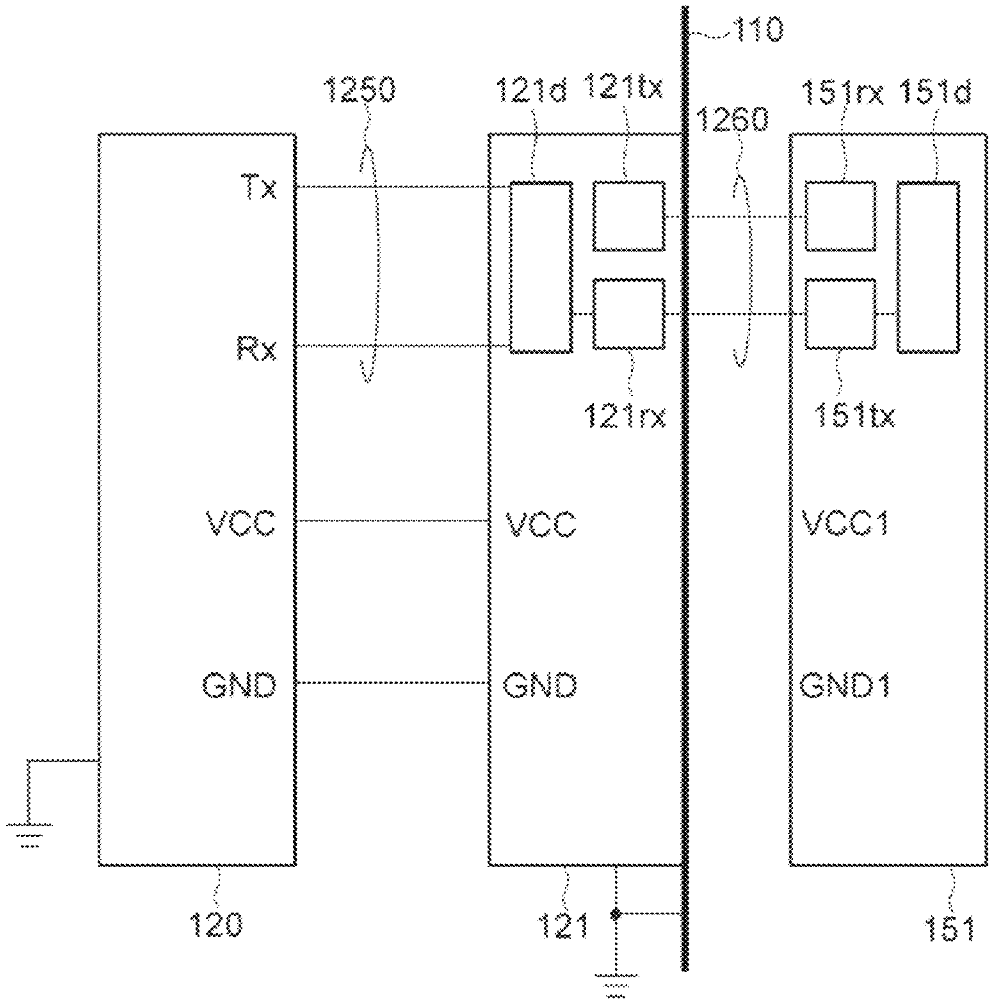
FIG. 19 is a diagram illustrating a communication unit of a power transmission unit and a communication unit of a rectifying and smoothing unit according to another exemplary embodiment.
Figure 20:
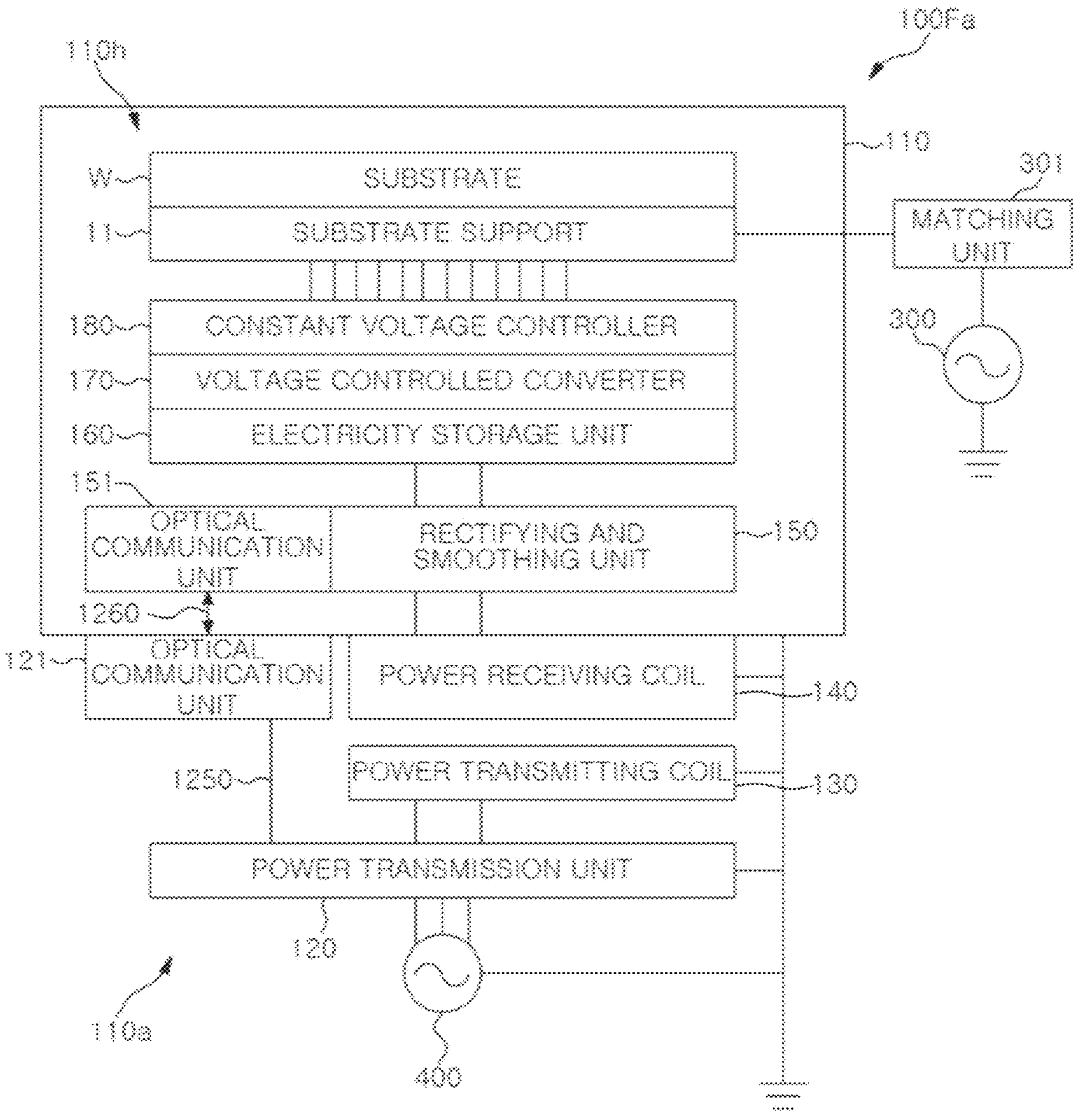
FIG. 20 is a diagram schematically illustrating a plasma processing apparatus according to yet another exemplary embodiment.
Figure 21:
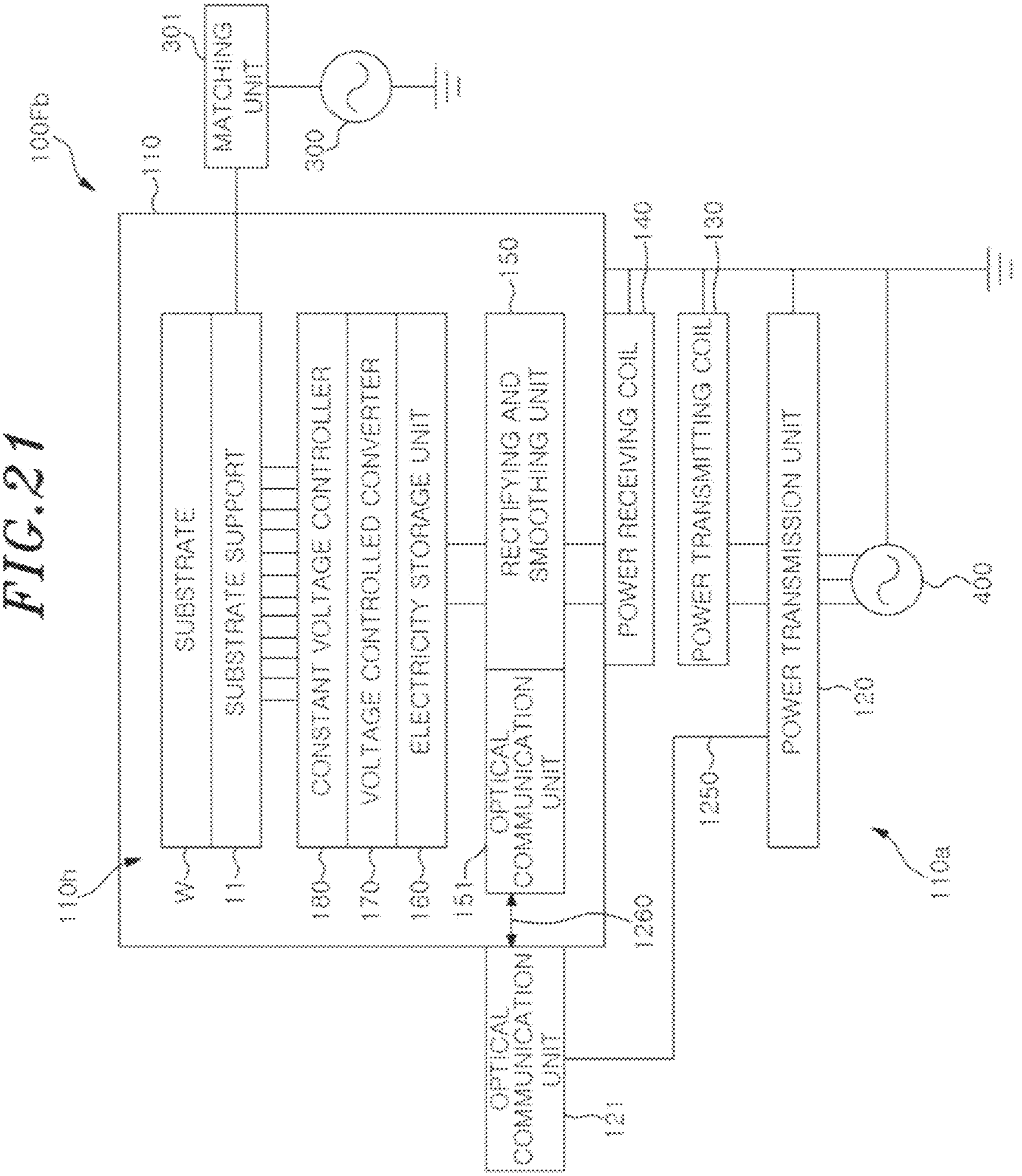
FIG. 21 is a diagram schematically illustrating a plasma processing apparatus according to yet another exemplary embodiment.
Figure 22:
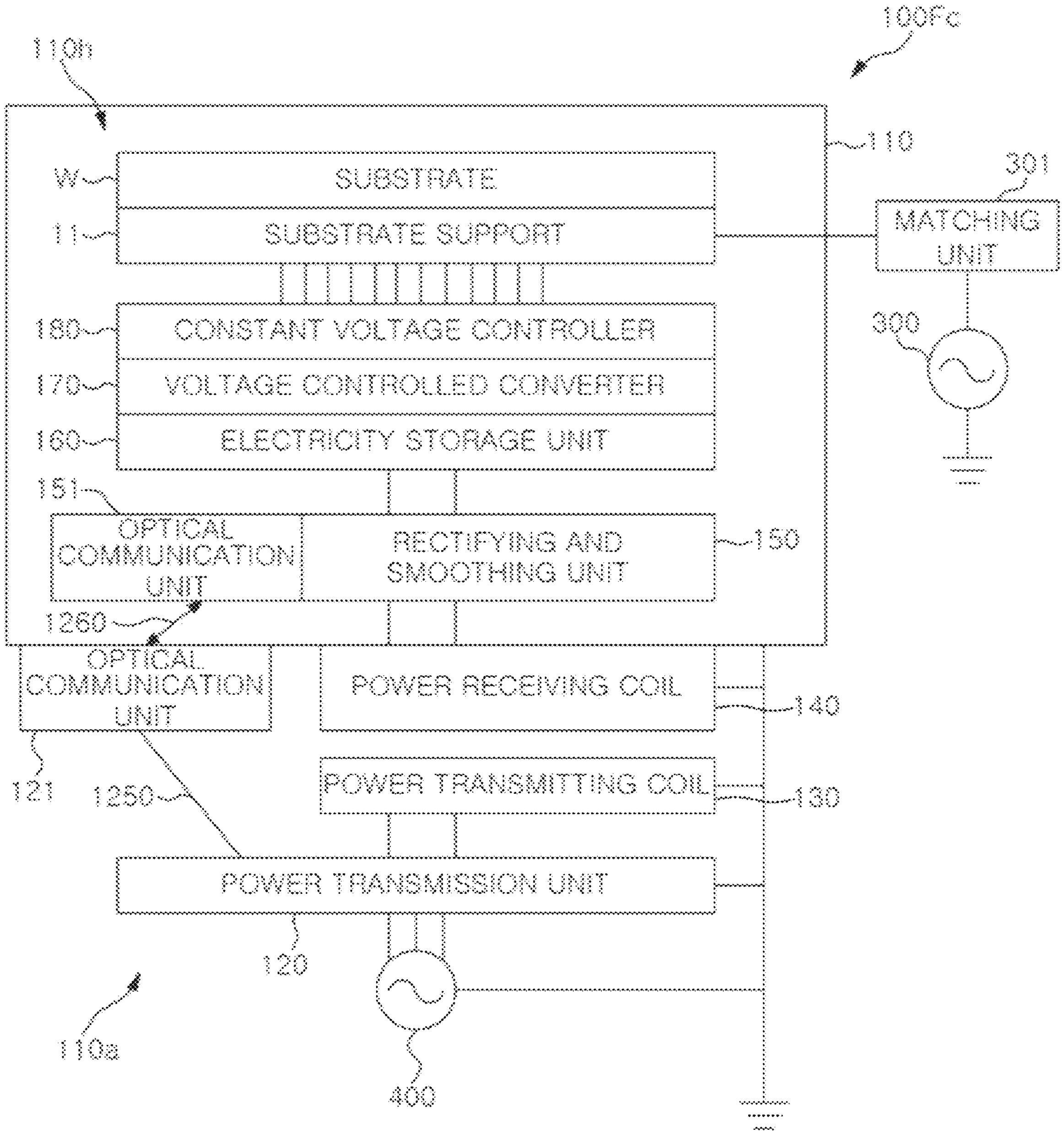
FIG. 22 is a diagram schematically illustrating a plasma processing apparatus according to yet another exemplary embodiment.

FIGS. 19 to 22 are referred. FIG. 19 is a diagram illustrating a communication unit of a power transmission unit and a communication unit of a rectifying and smoothing unit according to another exemplary embodiment. Each of FIGS. 20 to 22 is a diagram schematically illustrating a plasma processing apparatus according to yet another exemplary embodiment. As shown in FIGS. 19 to 22, the communication unit 121 and the communication unit 151 may be configured to transmit signals (optical signals) such as the above-mentioned instruction signal between each other via an optical fiber 1260, that is, by optical fiber communication. When the communication unit 121 and communication unit 151 transmit signals therebetween via the optical fiber 1260, the communication unit 121 and the communication unit 151 may be disposed in any location as long as the bending radius of the optical fiber 1260 falls within the allowable range. Also in the examples shown in these drawings, the RF filter 190 becomes unnecessary.

[Electricity Storage Unit]

FIGS. 23A and 23B are referred. Each of FIGS. 23A and 23B is a diagram illustrating an electricity storage unit according to one exemplary embodiment. As shown in FIG. 23A, the electricity storage unit 160 includes a capacitor 161. The capacitor 161 is connected between the pair of power feeding lines, that is, the positive line 160*p* and the negative line 160*m*. The positive line 160*p* extends from the positive output ($V_{OUT+}$) of the rectifying and smoothing unit 150 toward a load. The negative line 160*m* extends from the negative output ($V_{OUT-}$) of the rectifying and smoothing unit 150 toward the load. The capacitor 161 may be a polarized capacitor. The capacitor 161 may be an electric double layer or lithium ion battery.

As shown in FIG. 23B, the electricity storage unit 160 may include a plurality of capacitors 161. The plurality of capacitors 161 are connected in series between the positive line 160*p* and the negative line 160*m*. The plurality of capacitors 161 may have the same capacitance or may have different capacitances. Each of the plurality of capacitors 161 may be a polarized capacitor. Each of the plurality of capacitors 161 may be an electric double layer or a lithium ion battery. The electricity storage unit 160 needs to be used under conditions in which a total value of the input voltage thereto and the line-to-line potential difference due to normal mode noise is lower than the allowable input voltage. When the electricity storage unit 160 includes the plurality of capacitors 161 connected in series, the allowable input voltage of the electricity storage unit 160 becomes high. Accordingly, according to the example shown in FIG. 23B, the noise resistance of the electricity storage unit 160 is improved.

[Voltage Controlled Converter]

FIG. 24 is referred. FIG. 24 is a diagram illustrating a voltage control converter according to one exemplary embodiment. The voltage controlled converter 170 is a DC-DC converter. The voltage controlled converter 170 is connected between the electricity storage unit 160 and the constant voltage controller 180. The positive line 160*p* is connected to a positive input ($V_{IN+}$) of the voltage controlled converter 170. The negative line 160*m* is connected to a negative input ($V_{IN-}$) of the voltage controlled converter 170. The positive output ($V_{OUT+}$) of the voltage controlled converter 170 is connected to the positive input ($V_{IN+}$) of the constant voltage controller 180. The negative output ($V_{OUT-}$) of the voltage controlled converter 170 is connected to the negative input ($V_{IN-}$) of the constant voltage controller 180.

The voltage controlled converter 170 may include a controller 172, a low-pass filter 173, a transformer 174, and a capacitor 175. The low-pass filter 173 may include an inductor 1731*a*, a capacitor 1732*a*, and a capacitor 1732*b*. One end of the inductor 1731*a* is connected to the positive input ($V_{IN+}$) of the voltage controlled converter 170. The other end of the inductor 1731*a* is connected to one end of a primary coil of the transformer 174. One end of the capacitor 1732*a* is connected to one end of the inductor 1731*a* and the positive input ($V_{IN+}$) of the voltage controlled converter 170. The other end of the capacitor 1732 a is connected to the negative input ($V_{IN-}$) of the voltage controlled converter 170. One end of the capacitor 1732*b* is connected to the other end of the inductor 1731*a*. The other end of the capacitor 1732*b* is connected to the negative input ($V_{IN-}$) of the voltage controlled converter 170.

The transformer 174 includes a primary coil 1741, a secondary coil 1742, and a switch 1743. The other end of the primary coil 1741 is connected to the negative input ($V_{IN-}$) of the voltage controlled converter 170 via the switch 1743. One end of the secondary coil 1742 is connected to one end of the capacitor 175 and the positive output ($V_{OUT+}$) of the voltage controlled converter 170. The other end of the secondary coil 1742 is connected to the other end of the capacitor 175 and the negative output ($V_{OUT-}$) of the voltage controlled converter 170.

A driver 1744 is connected to the switch 1743. The driver 1744 opens and closes the switch 1743. When the switch 1743 is closed, that is, when the other end of the primary coil 1741 and the negative input ($V_{IN-}$) are in a conductive state, the other end of the primary coil 1741 is connected to the negative input ($V_{IN-}$) of the voltage controlled converter 170, and DC power from the voltage controlled converter 170 is provided to the constant voltage controller 180. When the switch 1743 is open, that is, when the other end of the primary coil 1741 and the negative input ($V_{IN-}$) are in a non-conductive state, the connection between the other end of the primary coil 1741 and the negative input ($V_{IN-}$) of the voltage controlled converter 170 is cut off, and the supply of DC power from the voltage controlled converter 170 to the constant voltage controller 180 is shut off.

The voltage controlled converter 170 may further include a voltage detector 176*v* and a current detector 176*i*. The voltage detector 176*v* detects a voltage value between both ends of the secondary coil 1742 or the voltage value between the positive output and the negative output of the voltage controlled converter 170. The current detector 176*i* measures a current value between the other end of the secondary coil 1742 and the negative output of the voltage controlled converter 170. The voltage value detected by the voltage detector 176*v* and the current value detected by the current detector 176*i* are notified to the controller 172. The controller 172 may be the same as or different from at least one of the controller 122 or the controller 152.

When the voltage value detected by the voltage detector 176*v* is equal to or higher than the threshold value, the controller 172 controls the driver 1744 to shut off the supply of DC power from the voltage controlled converter 170 to the constant voltage controller 180. The voltage value between the positive output and the negative output of the voltage controlled converter 170 is an added value of the output voltage value of the voltage controlled converter 170 and the line-to-line potential difference due to normal mode noise. In this embodiment, damage to the load of the voltage controlled converter 170 due to an overvoltage caused by the line-to-line potential difference due to normal mode noise may be suppressed.

[Constant Voltage Controller]

FIGS. 25 and 26 are referred. FIGS. 25 and 26 are diagrams illustrating a constant voltage controller according to some exemplary embodiments. The constant voltage controller 180 is connected between the electricity storage unit 160 and at least one power consuming member 240, and is configured to control the application of voltage (application of DC voltage) to at least one power consuming member 240 and the stopping of the application.

The constant voltage controller 180 includes a controller 182 and at least one switch 183. The positive input ($V_{IN+}$) of the constant voltage controller 180 is connected to the power consuming member 240 via the switch 183. The negative input ($V_{IN-}$) of the constant voltage controller 180 is connected to the power consuming member 240. The switch 183 is controlled by the controller 182. When the switch 183 is closed, the DC voltage from the constant voltage controller 180 is applied to the power consuming member 240. When the switch 183 is open, the application of DC voltage from the constant voltage controller 180 to the power consuming member 240 is stopped. Further, the controller 182 may be the same as or different from at least one of the controller 122, the controller 152, or the controller 172.

In the embodiment shown in FIGS. 25 and 26, the plasma processing apparatus includes a plurality of power consuming members 240. The constant voltage controller 180 includes the controller 182 and a plurality of switches 183. The positive input ($V_{IN+}$) of the constant voltage controller 180 is connected to the plurality of power consuming members 240 via the plurality of switches 183. The negative input ($V_{IN-}$) of the constant voltage controller 180 is connected to the plurality of power consuming members 240.

In the embodiment shown in FIGS. 25 and 26, the plurality of power consuming members 240 may include a plurality of heaters (resistive heating elements). The plurality of heaters may be provided within the substrate support 11. In the embodiment shown in FIG. 25, a plurality of resistors 260 are disposed adjacent to each of the plurality of heaters. Each of the plurality of resistors 260 has a resistance value that changes with temperature. Each of the plurality of resistors 260 is, for example, a thermistor. Each of the plurality of resistors 260 is connected in series with a reference resistor (not shown). The constant voltage controller 180 includes a plurality of measuring units 184. Each of the plurality of measuring units 184 applies a reference voltage to a series connection of a corresponding resistor among the plurality of resistors 260 and the reference resistor, and detects the voltage value between both ends of the resistor. Each of the plurality of measuring units 184 notifies the controller 182 of the detected voltage value. The controller 182 specifies the temperature of an area in which the corresponding heater among the plurality of heaters is disposed from the notified voltage value, and controls the application of DC voltage to the corresponding heater so as to bring the temperature of the area closer to the target temperature. Further, instead of the plurality of resistors 260, an optical fiber thermometer may be disposed. In this connection, wiring between the plurality of resistors 260 and the plurality of measuring units 184 is not required, so the influence of high frequency conductive noise on the power consuming member 240 may be eliminated.

In the embodiment shown in FIG. 26, the constant voltage controller 180 includes a voltage detector 185*v* and a plurality of current detectors 185*i*. The voltage detector 185*v* detects the voltage value applied to each of the plurality of heaters. The plurality of current detectors 185*i* measure the value of the current supplied to the corresponding one of the plurality of heaters, that is, the current value. The plurality of measuring units 184 specifies the resistance value of the corresponding one of the plurality of heaters from the current value detected by the corresponding one of the plurality of current detectors 185*i* and the voltage value detected by the voltage detector 185*v*. The controller 182 specifies the temperature of each of a plurality of areas in which each of the plurality of heaters are disposed, based on the detected resistance value of each of the plurality of heaters. The controller 182 controls the application of DC voltage to each of the plurality of heaters so that the temperature of each of the plurality of areas approaches the target temperature.

[Exemplary Embodiment Regarding Variable Gap Between Power Transmitting Coil and Power Receiving Coil]

Hereinafter, referring to FIGS. 27 to 37, various exemplary embodiments of a variable gap between a power transmitting coil and a power receiving coil will be described. FIG. 27 is a diagram schematically illustrating a plasma processing apparatus according to yet another exemplary embodiment. Each of FIGS. 28 to 37 is a diagram illustrating a power transmitting coil unit and a power receiving coil unit according to another exemplary embodiment. The power transmitting coil unit and the power receiving coil unit shown in each of FIGS. 28 to 37 may be employed in the plasma processing apparatus 100G shown in FIG. 27.

Hereinafter, the plasma processing apparatus 100G shown in FIG. 27 will be described from the viewpoint of its differences from the plasma processing apparatus 100E of FIG. 7. The plasma processing apparatus 100G further includes a driving system 340*d* and a sensor 340*m*, in addition to a configuration similar to that of the plasma processing apparatus 100E.

The driving system 340*d* is configured to change a distance between the power transmitting coil 131 and the power receiving coil 141, that is, the length of a gap between the power transmitting coil 131 and the power receiving coil 141 by moving at least one of the power transmitting coil 131 and the power receiving coil 141.

The driving system 340*d* includes at least one actuator. At least one actuator may include a hydraulic or pneumatic cylinder, a motor, or a piezoelectric element. The driving system 340*d* may include a plurality of actuators. The driving system 340*d* may detect the parallelism of the power transmitting coil 131 and the power receiving coil 141 using the sensor 340*m*, and at least one actuator may be controlled to keep the power transmitting coil 131 and the power receiving coil 141 parallel to each other according to the detected result of the sensor 340*m*.

According to the plasma processing apparatus 100G, since a distance between the power transmitting coil 131 and the power receiving coil 141 may be changed, the efficiency of power transmission between the power transmitting coil 131 and the power receiving coil 141 may be improved, and high frequency noise (or conductive noise) from the power receiving coil 141 to the power transmitting coil 131 may be suppressed.

In an embodiment, the controller 122 of the power transmission unit 120 receives supply state information about the supply or stop of high frequency power from the high frequency power supply 300. Based on the supply state information, the controller 122 determines whether high frequency power is being supplied from the high frequency power supply 300 or whether the supply has been stopped. While high frequency power is being supplied from the high frequency power supply 300, the controller 122 controls the driving system 340*d* to set a distance between the power transmitting coil 131 and the power receiving coil 141 to a relatively large distance. This makes it possible to suppress conductive noise. When the supply of high frequency power from the high frequency power supply 300 is stopped, the controller 122 controls the driving system 340*d* to set a distance between the power transmitting coil 131 and the power receiving coil 141 to a relatively small distance. This may improve the efficiency of power transmission between the power transmitting coil 131 and the power receiving coil 141.

In an embodiment, when the power level of the high frequency power from the high frequency power supply 300 specified in a process recipe is equal to or higher than a predetermined level, the controller 2 controls the driving system 340*d* via the controller 122 to set the distance between the power transmitting coil 131 and the power receiving coil 141 to a relatively large distance. This makes it possible to suppress conductive noise. Further, when the power level of the high frequency power from the high frequency power supply 300 specified in the process recipe is lower than a predetermined level, the controller 2 controls the driving system 340*d* via the controller 122 to set the distance between the power transmitting coil 131 and the power receiving coil 141 to a relatively small distance. This may improve the efficiency of power transmission between the power transmitting coil 131 and the power receiving coil 141.

In an embodiment, the controller 2 controls the driving system 340*d* via the controller 122 to set a distance between the power transmitting coil 131 and the power receiving coil 141 to a distance determined according to the frequency of the high frequency power from the high frequency power supply 300 specified in the process recipe. This allows the distance between the power transmitting coil 131 and the power receiving coil 141 to be set to an appropriate distance according to the frequency of the high frequency power, improving the efficiency of power transmission between the power transmitting coil 131 and the power receiving coil 141 and suppressing high frequency noise from the power receiving coil 141 to the power transmitting coil 131.

Hereinafter, an embodiment shown in FIG. 28 will be described. Similarly to the embodiment shown in FIG. 10, the power transmitting coil unit 130 includes a metal housing 130*g*, a power transmitting coil 131, a heat sink 134, a ferrite material 135, and a thermally conductive sheet 136. The power transmitting coil unit 130 further includes a fan 130*f*.

The metal housing 130*g* is grounded. The metal housing 130*g* defines a shielded space 130*s*, and accommodates the power transmitting coil 131 in the shielded space 130*s*. The metal housing 130*g* extends from the back side of the power transmitting coil 131 relative to the power receiving coil 141, and surrounds the outer circumference of the power transmitting coil 131.

The metal housing 130*g* includes a rear wall 130*gb* and a side wall 130*gs*. The rear wall 130*gb* and the side wall 130*gs* define the shielded space 130*s*. The rear wall 130*gb* has a generally flat plate shape, and extends from the back side of the power transmitting coil 131 relative to the power receiving coil 141. The side wall 130*gs* has a tubular shape, such as a prismatic shape or a cylindrical shape, and extends from the rear wall 130*gb* toward the power receiving coil unit 140. The side wall 130*gs* surrounds the outer circumference of the power transmitting coil 131.

The heat sink 134, the ferrite material 135, and the thermally conductive sheet 136 are arranged in this order within the shielded space 130*s* and between the rear wall 130*gb* and the power transmitting coil 131.

An opening at an end of the side wall 130*gs* of the metal housing 130*g* is closed by an insulating plate 130*i*. The insulating plate 130*i* is formed of a resin such as PEEK (polyether ether ketone) or PPS (polyphenylene sulfide).

A plurality of vent holes 130*gh* are formed in the side wall 130*gs*. Further, the fan 130*f* is disposed along the side wall 130*gs* outside the metal housing 130*g*. The fan 130*f* may be a blower fan or an exhaust fan. The fan 130*f* generates airflow that flows from the outside of the metal housing 130*g* through the plurality of vent holes 130*gh* and the shielded space 130*s* to the outside of the metal housing 130*g*. This causes the power transmitting coil 131 and the ferrite material 135 to cool.

As in the embodiment illustrated in FIG. 10, the power receiving coil unit 140 includes a metal housing 140*g*, a power receiving coil 141, a spacer 143, a heat sink 144, a ferrite material 145, and a thermally conductive sheet 146. The power receiving coil unit 140 further includes a fan 140*f*.

The metal housing 140*g* is grounded. The metal housing 140*g* defines a shielded space 140*s*, and accommodates the power receiving coil 141 in the shielded space 140*s*. The metal housing 140*g* extends from the back side of the power receiving coil 141 relative to the power transmitting coil 131, and surrounds the outer circumference of the power receiving coil 141.

The metal housing 140*g* includes a rear wall 140*gb* and a side wall 140*gs*. The rear wall 140*gb* and the side wall 140*gs* define the shielded space 140*s*. The rear wall 140*gb* has a generally flat plate shape, and extends from the back side of the power receiving coil 141 relative to the power transmitting coil 131. The side wall 140*gs* has a tubular shape, such as a prismatic shape or a cylindrical shape, and extends from the rear wall 140*gb* toward the power transmitting coil unit 130. The side wall 140*gs* surrounds the outer circumference of the power receiving coil 141.

The spacer 143, the heat sink 144, the ferrite material 145, and the thermally conductive sheet 146 are arranged in this order within the shielded space 140*s* and between the rear wall 140*gb* and the power receiving coil 141.

An opening at an end of the side wall 140*gs* of the metal housing 140*g* is closed by an insulating plate 140*i*. The insulating plate 140*i* is formed of a resin such as PEEK or PPS.

A plurality of vent holes 140*gh* are formed in the side wall 140*gs*. Further, the fan 140*f* is disposed along the side wall 140*gs* outside the metal housing 140*g*. The fan 140*f* may be a blower fan or an exhaust fan. The fan 140*f* generates airflow that flows from the outside of the metal housing 140*g* through the plurality of vent holes 140*gh* and the shielded space 140*s* to the outside of the metal housing 140*g*. This causes the power receiving coil 141 and the ferrite material 145 to cool.

In the embodiment shown in FIG. 28, the driving system 340*d* is configured to move the power transmitting coil unit 130 so as to change the length of a gap between the power transmitting coil 131 and the power receiving coil 141.

Hereinafter, various embodiments shown in FIGS. 29 to 37 will be described from the viewpoint of its differences from the embodiment shown in FIG. 28. In each of the embodiments shown in FIGS. 29 to 37, the power transmitting coil unit 130 and the power receiving coil unit 140 are integrated with each other. The power transmitting coil 131 of the power transmitting coil unit 130 and the power receiving coil 141 of the power receiving coil unit 140 are disposed in the shielded space provided by at least one metal housing. The at least one metal housing is grounded and electromagnetically shields the shielded space from an external space. At least one ferrite material is provided within the shielded space. The at least one ferrite material closes a space that accommodates the power transmitting coil 131 and the power receiving coil 141.

Hereinafter, an embodiment shown in FIG. 29 will be described from the viewpoint of its differences from the embodiment shown in FIG. 28. In the embodiment shown in FIGS. 28, two metal housings are used as the at least one metal housing. That is, a metal housing 130*g* (first metal housing) of the power transmitting coil unit 130 and a metal housing 140*g* (second metal housing) of the power receiving coil unit 140 are used.

The metal housings 130*g* and 140*g* are arranged so that the ends of the side walls thereof face each other, and an insulating plate 34*i* is interposed between the ends of the side walls. That is, the shielded space 130*s* of the metal housing 130*g* and the shielded space 140*s* of the metal housing 140*g* are separated by the insulating plate 34*i*. The insulating plate 34*i* is formed of resin such as PEEK or PPS.

The side wall 130*gs* includes a flange 130*gf*, and the side wall 140*gs* includes a flange 140*gf*. The metal housings 130*g* and 140*g* are positioned and fixed to each other by a positioning pin 34*p* with the flanges 130*gf* and 140*gf* facing or abutting each other and electrically connected. This allows the coil axes of the power transmitting coil 131 and the power receiving coil 141 to be aligned with each other, mechanically ensuring the parallelism of the power transmitting coil 131 and the power receiving coil 141. It is therefore possible to provide a technique that can improve the efficiency of power transmission between the power transmitting coil 131 and the power receiving coil 141.

The heat sink 134, a rear portion 1351 of the ferrite material 135, and the thermally conductive sheet 136 are arranged in this order within the shielded space 130*s* and between the rear wall 130*gb* and the power transmitting coil 131. The ferrite material 135 is disposed in the shielded space 130*s* and defines a space 135*s* that is open on the side of the insulating plate 34*i*. The power transmitting coil 131 is disposed in the space 135*s*.

The rear portion (first rear portion) 1351 of the ferrite material 135 has a generally flat plate shape, and extends from the back side of the power transmitting coil 131. The ferrite material 135 further includes a side wall portion (first side wall portion) 1353. The side wall portion 1353 has a tubular shape, such as a prismatic shape or a cylindrical shape, and extends from the rear portion 1351 toward the insulating plate 34*i*. The side wall portion 1353 surrounds the outer circumference of the power transmitting coil 131. The thermally conductive sheet 137 may be disposed between the side wall portion 1353 and the power transmitting coil 131 to surround the outer circumference of the power transmitting coil 131. An end of the side wall portion 1353 and an end of a side wall portion 1454, which will be described later, face each other with the insulating plate 34*i* therebetween. The rear portion 1351 and the side wall portion 1353 may be formed of a single member, or the rear portion 1351 and the side wall portion 1353 may be formed of separate members.

The spacer 143, the heat sink 144, a rear portion 1452 of the ferrite material 145, and the thermally conductive sheet 146 are arranged in this order within the shielded space 140*s* and between the rear wall 140*gb* and the power receiving coil 141. The ferrite material 145 is disposed in the shielded space 140*s* and defines a space 145*s* that is open on the side of the insulating plate 34*i*. The power receiving coil 141 is disposed in the space 145*s*.

The rear portion (second rear portion) 1452 of the ferrite material 145 has a generally flat plate shape, and extends from the back side of the power receiving coil 141. The ferrite material 145 further includes a side wall portion (second side wall portion) 1454. The side wall portion 1454 has a tubular shape, such as a prismatic shape or a cylindrical shape, and extends from the rear portion 1452 toward the insulating plate 34*i*. The side wall portion 1454 surrounds the outer circumference of the power receiving coil 141. The thermally conductive sheet 147 may be disposed between the side wall portion 1454 and the power receiving coil 141 to surround the outer circumference of the power receiving coil 141. An end of the side wall portion 1454 and an end of the side wall portion 1353 face each other with the insulating plate 34*i* therebetween. The rear portion 1452 and the side wall portion 1454 may be formed of a single member, or the rear portion 1452 and the side wall portion 1454 may be formed of separate members.

In the embodiment shown in FIG. 29, the driving system 340*d* is configured to move the power transmitting coil assembly so as to change the length of a gap between the power transmitting coil 131 and the power receiving coil 141. The power transmitting coil assembly includes a power transmitting coil 131, a heat sink 134, a ferrite material 135, a thermally conductive sheet 136, and a thermally conductive sheet 137.

In the power transmitting coil unit 130 and the power receiving coil unit 140 shown in FIG. 29, the metal housings 130*g* and 140*g* suppress leakage of high frequency noise to the outside. Moreover, it is possible to prevent foreign matter from entering the interior of each of the power transmitting coil unit 130 and the power receiving coil unit 140.

Furthermore, leakage of magnetic flux is suppressed by the ferrite material 135 and the ferrite material 145. Therefore, high power supply efficiency between the power transmitting coil 131 and the power receiving coil 141 can be obtained without increasing the number of turns of each of the power transmitting coil 131 and the power receiving coil 141. This makes it possible to reduce the resistance value of each of the power transmitting coil 131 and the power receiving coil 141. In addition, each of the power transmitting coil 131 and the power receiving coil 141 may be made smaller.

Each of the ferrite materials 135 and 145 has a relatively large volume because it has a side wall portion. Thus, even if each of the ferrite materials 135 and 145 generates heat due to conductive noise, the temperature rise is small. Further, since each of the ferrite materials 135 and 145 has the relatively large volume, it has a relatively large inductance. The relatively large inductance of each of the ferrite materials 135 and 145 and the small resistance of each of the power transmitting coil 131 and the power receiving coil 141 result in a high Q value of each of the power transmitting coil 131 and the power receiving coil 141. Therefore, high efficiency of power transmission between the power transmitting coil 131 and the power receiving coil 141 is ensured.

Each of the ferrite material 135 and the ferrite material 145 may be formed of manganese zinc based ferrite, nickel zinc based ferrite, or a nanocrystalline soft magnetic material. In this case, when the transmission frequency is 1 MHz or less, a high magnetic flux confinement effect can be obtained at the transmission frequency due to high magnetic permeability, and conductive noise can be efficiently converted into heat.

Hereinafter, an embodiment shown in FIG. 30 will be described from the viewpoint of its differences from the embodiment shown in FIG. 29. In the embodiment shown in FIG. 30, a single metal housing 340*g* is used as the at least one metal housing.

The metal housing 340*g* is grounded. The metal housing 340*g* defines a shielded space 340*s*, and accommodates the power transmitting coil 131 and the power receiving coil 141 in the shielded space 340*s*.

The metal housing 340*g* includes a first rear wall 340*g*1, a second rear wall 340*g*2, and a side wall 340*g*3. The first rear wall 340*g*1, the second rear wall 340*g*2, and the side wall 340*g*3 define the shielded space 340*s*. The first rear wall 340*g*1 has a generally flat plate shape, and extends from the back side of the power transmitting coil 131 relative to the power receiving coil 141. The second rear wall 340*g*2 has a generally flat plate shape, and extends from the back side of the power receiving coil 141 relative to the power transmitting coil 131. The side wall 130*gs* has a tubular shape, such as a prismatic shape or a cylindrical shape, and extends from the first rear wall 340*g*1 to the second rear wall 340*g*2. The side wall 130*gs* surrounds the outer circumference of the power transmitting coil 131 and the outer circumference of the power receiving coil 141.

The heat sink 134, the rear portion 1351 of the ferrite material 135, and the thermally conductive sheet 136 are arranged in this order within the shielded space 340*s* and between the first rear wall 340*g*1 and the power transmitting coil 131.

In addition, the spacer 143, the heat sink 144, the rear portion 1452 of the ferrite material 145, and the thermally conductive sheet 146 are arranged in this order within the shielded space 340*s* and between the second rear wall 340*g*2 and the power receiving coil 141.

The ferrite material 135 and the ferrite material 145 are disposed in the shielded space 340*s*. The side wall portion 1353 of the ferrite material 135 extends outside the side wall portion 1454 of the ferrite material 145. The ferrite material 135 and the ferrite material 145 define a closed space 345*s* as the side wall portion 1353 surrounds the side wall portion 1454. The power transmitting coil 131 and the power receiving coil 141 are disposed in the space 345*s*.

A fan 340*f* is disposed along the metal housing 340*g* outside the metal housing 340*g*. The fan 340*f* may be a blower fan or an exhaust fan. In an example of FIG. 30, the fan 340*f* may be disposed along the side wall 340*g*3. The fan 340*f* generates airflow that flows from the outside of the metal housing 340*g* through a plurality of vent holes 340*gh* and the shielded space 340*s* of the metal housing 340*g* to the outside of the metal housing 340*g*. In the example of FIG. 30, the plurality of vent holes 340*gh* are formed in the side wall 340*g*3.

In the example of FIG. 30, the driving system 340*d* is configured to move the power transmitting coil assembly so as to change the length of a gap between the power transmitting coil 131 and the power receiving coil 141. The power transmitting coil assembly includes a power transmitting coil 131, a heat sink 134, a ferrite material 135, a thermally conductive sheet 136, and a thermally conductive sheet 137. When the driving system 340*d* moves the power transmitting coil assembly, the side wall portion 1353 moves along the outer circumferential surface of the side wall portion 1454.

In the power transmitting coil unit 130 and the power receiving coil unit 140 shown in FIG. 30, the metal housing 340*g* suppresses leakage of high frequency noise to the outside. Moreover, it is possible to prevent foreign matter from entering the interior of each of the power transmitting coil unit 130 and the power receiving coil unit 140.

Hereinafter, an embodiment shown in FIG. 31 will be described from the viewpoint of its differences from the embodiment shown in FIG. 30. In the embodiment shown in FIG. 31, a plurality of vent holes 340*gh* are formed in the first rear wall 340*g*1 and the second rear wall 340*g*2. In the embodiment shown in FIG. 31, the fan 340*f* is provided along the second rear wall 340*g*2 outside the metal housing 340*g*.

In the embodiment shown in FIG. 31, the heat sink 134, the rear portion 1351, the thermally conductive sheet 136, and the power transmitting coil 131 provide a first gas flow path that connects the space between the power transmitting coil 131 and the power receiving coil 141 to the plurality of vent holes 340*gh* in the first rear wall 340*g*1. Further, the heat sink 144, the rear portion 1452, the thermally conductive sheet 146, and the power receiving coil 141 provide a second gas flow path that connects the space between the power transmitting coil 131 and the power receiving coil 141 to the plurality of vent holes 340*gh* in the second rear wall 340*g*2.

In the embodiment shown in FIG. 31, the fan 340*f* is a blower fan, and generates airflow that flows through the multiple vent holes 340*gh* in the second rear wall 340*g*2, the second gas flow path, the space between the power receiving coil 141 and the power transmitting coil 131, the first gas flow path, and the multiple vent holes 340*gh* in the first rear wall 340*g*1 to the outside of the metal housing 340*g*. This causes the power transmitting coil 131, the ferrite material 135, the power receiving coil 141, and the ferrite material 145 to cool.

Hereinafter, an embodiment shown in FIG. 32 will be described from the viewpoint of its differences from the embodiment shown in FIG. 31. In the embodiment shown in FIG. 32, the power transmitting coil unit 130 includes a base plate 138 instead of the heat sink 134. The base plate 138 is, for example, a glass epoxy board. In the power transmitting coil unit 130, the ferrite material 135 has a substantially plate-like shape, similar to that of the rear portion 1351 described above, and extends from the back side of the power transmitting coil 131. The base plate 138 may have at least one hollow portion in a surface contacting the ferrite material 135. In this case, the cooling efficiency of the ferrite material 135 can be improved.

The power receiving coil unit 140 includes a base plate 148 instead of the heat sink 144. The base plate 148 is, for example, a glass epoxy board. In the power receiving coil unit 140, the side wall portion 1454 of the ferrite material 145 extends from the rear portion 1452 to the power transmitting coil unit 130, and surrounds the outer circumference of the power transmitting coil 131, the outer circumference of the thermally conductive sheet 136, and the outer circumference of the ferrite material 135. The base plate 148 may have at least one hollow portion in a surface contacting the ferrite material 145. In this case, the cooling efficiency of the ferrite material 145 can be improved.

In the example of FIG. 32, the driving system 340*d* is configured to move the power transmitting coil assembly so as to change the length of a gap between the power transmitting coil 131 and the power receiving coil 141. The power transmitting coil assembly includes a power transmitting coil 131, a base plate 138, a ferrite material 135, and a thermally conductive sheet 136. The power transmitting coil assembly moves within an area enclosed by the side wall portion 1454.

In the embodiment of FIGS. 30 and 31 described above, two ferrite side walls are nested. On the other hand, in the embodiment of FIG. 32, a single side wall portion 1454 surrounds the power transmitting coil 131 and the power receiving coil 141 in the metal housing 340*g*. Thus, according to the embodiment of FIG. 32, the width of the ferrite material in the metal housing 340*g* is small. Therefore, according to the embodiment of FIG. 32, the width of the metal housing 340*g* may be made small.

Hereinafter, an embodiment shown in FIG. 33 will be described from the viewpoint of its differences from the embodiment shown in FIG. 32. In the embodiment shown in FIG. 33, the ferrite material 145 has a substantially plate-like shape, similar to that of the rear portion 1452 described above, and extends from the back side of the power receiving coil 141.

The ferrite material 135 includes the above-described rear portion 1351 and side wall portion 1353. The side wall portion 1353 extends from the rear portion 1351 to the power receiving coil unit 140, and surrounds the outer circumference of the power receiving coil 141, the outer circumference of the thermally conductive sheet 146, and the outer circumference of the ferrite material 145.

In the example of FIG. 33, the driving system 340*d* is configured to move the power transmitting coil assembly so as to change the length of a gap between the power transmitting coil 131 and the power receiving coil 141. The power transmitting coil assembly includes a power transmitting coil 131, a base plate 138, a ferrite material 135, and a thermally conductive sheet 136. The power transmitting coil 131, the ferrite material 135, and the thermally conductive sheet 136 of the power transmitting coil assembly are moved so that the ferrite material 145 is positioned within an area surrounded by the side wall portion 1353.

Hereinafter, an embodiment shown in FIG. 34 will be described from the viewpoint of its differences from the embodiment shown in FIG. 32. In the embodiment shown in FIG. 34, the fan 340*f* is provided along the first rear wall 340*g*1 outside the metal housing 340*g*.

Hereinafter, an embodiment shown in FIG. 35 will be described from the viewpoint of its differences from the embodiment shown in FIG. 34. In the embodiment shown in FIG. 35, the driving system 340*d* is configured to move the power receiving coil assembly so as to change the length of a gap between the power transmitting coil 131 and the power receiving coil 141. The power receiving coil assembly includes a power receiving coil 141, a base plate 148, a ferrite material 145, and a thermally conductive sheet 146. The power receiving coil assembly is moved such that the power transmitting coil 131, the ferrite material 135, and the thermally conductive sheet 136 are positioned within an area surrounded by the side wall portion 1454. Further, the embodiment shown in FIG. 35 has a configuration in which the positions of the driving system 340*d* and the fan 340*f* in the embodiment shown in FIG. 32 are interchanged, but the positions of the driving system 340*d* and the fan 340*f* in the embodiment of FIG. 33 may also be interchanged in a similar manner.

Hereinafter, an embodiment shown in FIG. 36 will be described from the viewpoint of its differences from the embodiment shown in FIG. 34. In the embodiment shown in FIG. 36, two driving systems 340*d* are used. One of the two driving systems 340*d* moves the power transmitting coil assembly to change a distance between the power transmitting coil 131 and the power receiving coil. The other of the two driving systems 340*d* moves the power receiving coil assembly to change the distance between the power transmitting coil 131 and the power receiving coil. The power receiving coil assembly includes the power receiving coil 141, the base plate 148, the ferrite material 145, and the thermally conductive sheet 146.

Hereinafter, an embodiment shown in FIG. 37 will be described from the viewpoint of its differences from the embodiment shown in FIG. 36. In the embodiment shown in FIG. 37, the ferrite material 145 has a substantially plate-like shape, similar to that of the rear portion 1452 described above, and extends from the back side of the power receiving coil 141. In addition, a ferrite material 1345 is used to form the side wall portion. The ferrite material 1345 is cylindrical and fixed to the metal housing 340*g*. In the embodiment of FIG. 37, the two driving systems 340*d* are configured to move the power transmitting coil assembly and the power receiving coil assembly within an area surrounded by the ferrite material 1345 that forms the side wall portion. The driving system 340*d* may be configured with only one system to move either the power transmitting coil assembly or the power receiving coil assembly within the area surrounded by the ferrite material 1345 that forms the side wall portion.

[Exemplary Embodiments Regarding Use of Variable Capacitor as Resonant Capacitor]

Hereinafter, resonant capacitors in the power transmitting coil unit 130 and the power receiving coil unit 140 in various embodiments in which the length of the gap between the power transmitting coil 131 and the power receiving coil 141 may be changed will be described. At least one resonant capacitor in either or both of the power transmitting coil unit 130 and the power receiving coil unit 140 may be a variable capacitor.

FIG. 9 is referred. For example, in the power transmitting coil unit 130 shown in FIG. 9, one of resonant capacitors 132*a* and 132*b* may be a variable capacitor. Alternatively, both of the resonant capacitors 132*a* and 132*b* may be variable capacitors. When the resonant capacitors 132*a* and 132*b* are variable capacitors, they may have the same capacitance or different capacitances.

In the power receiving coil unit 140 shown in FIG. 9, one of resonant capacitors 142*a* and 142*b* may be a variable capacitor. Alternatively, both of the resonant capacitors 142*a* and 142*b* may be variable capacitors. When the resonant capacitors 142*a* and 142*b* are variable capacitors, they may have the same capacitance or different capacitances.

In the embodiment shown in FIG. 9, each of the resonant capacitors 132*a* and 142*a* may be a variable capacitor. Alternatively, each of the resonant capacitors 132*b* and 142*b* may be a variable capacitor. Alternatively, each of the resonant capacitors 132*a*, 132*b*, 142*a*, and 142*b* may be a variable capacitor.

FIG. 38 is referred. FIG. 38 is a diagram illustrating a power transmitting coil unit and a power receiving coil unit according to yet another exemplary embodiment. In yet another embodiment, two or more resonant capacitors may be connected in parallel to the power transmitting coil 131. Alternatively or additionally, two or more other resonant capacitors may be connected in parallel to the power receiving coil 141.

In the embodiment of FIG. 38, two or more resonant capacitors 132*a* are connected in parallel between one end of the power transmitting coil 131 and the power transmission unit 120. Two or more resonant capacitors 132*b* are connected in parallel between the other end of the power transmitting coil 131 and the power transmission unit 120. Two or more resonant capacitors 142*a* are connected in parallel to one end of the power receiving coil 141. Further, two or more resonant capacitors 142*b* are connected in parallel to the other end of the power receiving coil 141. At least one of the two or more resonant capacitors 132*a* may be a variable capacitor. At least one of the two or more resonant capacitors 132*b* may be a variable capacitor. At least one of the two or more resonant capacitors 142*a* may be a variable capacitor. Also, at least one of the two or more resonant capacitors 142*b* may be a variable capacitor.

In a modification of the embodiment of FIG. 38, only a single resonant capacitor 142*a* may be connected to one end of the power receiving coil 141, and only a single resonant capacitor 142*b* may be connected to the other end of the power receiving coil 141. In addition, only the single resonant capacitor 132*a* may be connected to one end of the power transmitting coil 131. Alternatively, only the single resonant capacitor 132*b* may be connected to the other end of the power transmitting coil 131.

In another modification of the embodiment of FIG. 38, only a single resonant capacitor 132*a* may be connected to one end of the power transmitting coil 131, and only a single resonant capacitor 132*b* may be connected to the other end of the power transmitting coil 131. In addition, only a single resonant capacitor 142*a* may be connected to one end of the power receiving coil 141. Alternatively, only a single resonant capacitor 142*b* may be connected to the other end of the power receiving coil 141.

In yet another modification of the embodiment of FIG. 38, only a single resonant capacitor 132*a* may be connected to one end of the power transmitting coil 131, and only a single resonant capacitor 142*a* may be connected to one end of the power receiving coil 141. Alternatively, only a single resonant capacitor 132*b* may be connected to the other end of the power transmitting coil 131, and only a single resonant capacitor 142*b* may be connected to the other end of the power receiving coil 141.

When at least one of the power transmitting coil unit 130 and the power receiving coil unit 140 includes at least one variable capacitor as a resonant capacitor, the capacitance of the at least one variable capacitor is changed depending on the distance between the power transmitting coil 131 and the power receiving coil 141. As a result, a circuit including the power transmitting coil 131 in the power transmitting coil unit 130 is corrected so as to form a resonant circuit for a transmission frequency. Further, a circuit including the power receiving coil 141 in the power receiving coil unit 140 is corrected so as to form a resonant circuit for the transmission frequency. The capacitance of at least one variable capacitor according to the distance between the power transmitting coil 131 and the power receiving coil 141 is set by the controller 2 via the controller 122.

[Exemplary Embodiment Regarding Countermeasures Against Conductive Noise Using Ferrite Material in Power Transmitting Coil Unit and Power Receiving Coil Unit]

Hereinafter, FIGS. 39A, 39B, 40A, 40B, 41A, 41B, 42A, and 42B are referred. FIG. 39A is a sectional view of a coil unit according to one exemplary embodiment, and FIG. 39B is a plan view illustrating a plurality of ferrite materials provided between a base plate and a thermally conductive sheet in the coil unit illustrated in FIG. 39A. FIG. 39A shows a section of the coil unit taken along line XXXIXA-XXXIXA shown in FIG. 39B. FIG. 40A is a sectional view of a coil unit according to another exemplary embodiment, and FIG. 40B is a plan view illustrating a plurality of ferrite materials provided between a base plate and a thermally conductive sheet in the coil unit illustrated in FIG. 40A. FIG. 40A shows a section of the coil unit taken along line XLA-XLA shown in FIG. 40B. FIG. 41A is a sectional view of a coil unit according to yet another exemplary embodiment, and FIG. 41B is a plan view illustrating a plurality of ferrite materials provided between a base plate and a thermally conductive sheet in the coil unit illustrated in FIG. 41A. FIG. 41A shows a section of the coil unit taken along line XLIA-XLIA shown in FIG. 41B. FIG. 42A is a sectional view of a coil unit according to yet another exemplary embodiment, and FIG. 42B is a plan view illustrating a plurality of ferrite materials provided between a base plate and a thermally conductive sheet in the coil unit illustrated in FIG. 42A. FIG. 42A shows a section of the coil unit taken along line XLIIA-XLIIA shown in FIG. 42B. The configuration of the coil unit 500 shown in these figures may be adopted as a configuration in which at least one of the power transmitting coil unit 130 and the power receiving coil unit 140 is disposed within the metal housing.

The coil unit 500 includes a coil 501, a spacer 503, a base plate 508, a plurality of ferrite materials 505, and a thermally conductive sheet 506. The coil 501 is used as the power transmitting coil 131 in the power transmitting coil unit 130 and is used as the power receiving coil 141 in the power receiving coil unit 140. The spacer 503 supports the base plate 508. The base plate 508 is, for example, a glass epoxy board. The plurality of ferrite materials 505 are provided between the base plate 508 and the coil 501. The thermally conductive sheet 506 is provided between each of the plurality of ferrite materials 505 and the coil 501. The coil unit 500 provides a hole 500*h* for leading a lead wire from the coil 501 to a space below the base plate 508.

In the embodiment shown in FIGS. 39A and 39B, the plurality of ferrite materials 505 form a single stage, and are arranged along one direction perpendicular to a main surface of the base plate 508. The plurality of ferrite materials 505 are disposed so as to avoid the hole 500*h*. In the embodiment shown in FIGS. 39A and 39B, the coil unit 500 further includes an inner ferrite material 507. The inner ferrite material 507 is disposed inside the coil 501.

In the embodiment shown in FIGS. 40A and 40B, the plurality of ferrite materials 505 form two stages. The plurality of ferrite materials 505 may form three or more stages. In each stage, the plurality of ferrite materials 505 are arranged in one direction perpendicular to the main surface of the base plate 508. The plurality of ferrite materials 505 are disposed so as to avoid the hole 500*h*. In the embodiment shown in FIGS. 40A and 40B, the inner ferrite material 507 may or may not be disposed inside the coil 501.

In the embodiment shown in FIGS. 41A and 41B, the plurality of ferrite materials 505 form a single stage, and are arranged along a first direction perpendicular to a main surface of the base plate 508. The plurality of ferrite materials 505 are disposed so as to avoid the hole 500*h*. Some of the ferrite materials 505 are disposed on both sides of the hole 500*h* in a second direction perpendicular to the main surface of the base plate 508 and perpendicular to the first direction. In the embodiment shown in FIGS. 41A and 41B, the inner ferrite material 507 may or may not be disposed inside the coil 501.

In the embodiment shown in FIGS. 42A and 42B, the plurality of ferrite materials 505 form two stages. The plurality of ferrite materials 505 may form three or more stages. In each stage, the plurality of ferrite materials 505 are arranged in the first direction perpendicular to the main surface of the base plate 508. The plurality of ferrite materials 505 are disposed so as to avoid the hole 500*h*. Some of the ferrite materials 505 are disposed on both sides of the hole 500*h* in the second direction perpendicular to the main surface of the base plate 508 and perpendicular to the first direction. In the embodiment shown in FIGS. 42A and 42B, the inner ferrite material 507 may or may not be disposed inside the coil 501.

Further, in each embodiment, each of the plurality of ferrite materials 505 and the inner ferrite material 507 may be formed of manganese zinc based ferrite, nickel zinc based ferrite, or a nanocrystalline soft magnetic material.

In each embodiment shown in FIGS. 39A, 39B, 40A, 40B, 41A, 41B, 42A, and 42B, all the ferrite materials contribute a large total volume to the coil unit 500. Thus, even if the ferrite materials generate heat due to high frequency noise, the temperature rise of the ferrite materials is small. Therefore, it is possible to use high frequency power having a large power level as the high frequency power such as a first RF signal and/or a second RF signal. The configuration of the coil unit 500 may be adopted to both the power transmitting coil unit 130 and the power receiving coil unit 140. Alternatively, the configuration of the coil unit 500 may be adopted only to the power receiving coil unit 140, which is particularly prone to heat generation due to eddy current caused by conductive noise.

[Exemplary Embodiment Regarding Inner Ferrite Material in Power Transmitting Coil Unit and Power Receiving Coil Unit]

Hereinafter, various exemplary embodiments of the inner ferrite material in the integrated power transmitting coil unit 130 and power receiving coil unit 140 will be described with reference to FIGS. 43 to 58. The inner ferrite material extends from an inner area of one of the power transmitting coil 131 and the power receiving coil 141 toward an inner area of the other coil. The inner ferrite material may be formed of manganese zinc based ferrite, nickel zinc based ferrite, or a nanocrystalline soft magnetic material.

The inner ferrite material increases the Q value of each of the power transmitting coil 131 and the power receiving coil 141, the coupling coefficient between the power transmitting coil 131 and the power receiving coil 141, and the power transmission efficiency between the power transmitting coil 131 and the power receiving coil 141. Therefore, the inner ferrite material improves the performance of wireless power supply. In addition, it is possible to increase the distance between the power transmitting coil 131 and the power receiving coil 141, and to reduce conductive noise from the power receiving coil 141 to the power transmitting coil 131. Further, it is possible to reduce the size of each of the power transmitting coil 131 and the power receiving coil 141 while ensuring a desired Q value.

FIG. 43 is a diagram illustrating a power transmitting coil unit and a power receiving coil unit according to yet another exemplary embodiment. Hereinafter, an embodiment shown in FIG. 43 will be described from the viewpoint of its differences from the embodiment shown in FIG. 30. In the embodiment shown in FIG. 43, the driving system **340*d*** is not used.

In the embodiment of FIG. 43, the heat sink 134, the rear portion 3451 (first portion) of the ferrite material 345, and the thermally conductive sheet 136 are arranged in this order within the shielded space **340*s* and between the first rear wall 340*g*1 and the power transmitting coil 131. The rear portion 3451 has a generally flat plate shape, and extends from the back side of the power transmitting coil 131**.

Further, the spacer 143, the heat sink 144, the rear portion (second portion) 3452 of the ferrite material 345, and the thermally conductive sheet 146 are arranged in this order within the shielded space **340*s* and between the second rear wall 340*g*2 and the power receiving coil 141. The rear portion 3452 has a generally flat plate shape, and extends from the back side of the power receiving coil 141**.

The ferrite material 345 is disposed within the shielded space **340*s*, and defines a closed space 345*s*. The power transmitting coil 131 and the power receiving coil 141 are disposed within the space 345*s***.

The ferrite material 345 further includes a side wall portion (third portion) 3453. The side wall portion 3453 has a tubular shape, such as a prismatic shape or a cylindrical shape, and extends from the rear portion 3451 to the rear portion 3452. The side wall portion 3453 surrounds the outer circumference of the power transmitting coil 131 and the outer circumference of the power receiving coil 141. The thermally conductive sheet 347 may be disposed between each of the power transmitting coil 131 and the power receiving coil 141 and the side wall portion 3453 to surround the outer circumference of the power transmitting coil 131 and the outer circumference of the power receiving coil 141. Further, a single member may form the rear portion 3451, the rear portion 3452, and the side wall portion 3453. Alternatively, separate members may form the rear portion 3451, the rear surface portion 3452, and the side wall portion 3453, respectively.

Further, in the embodiment of FIG. 43, a columnar inner ferrite material 348 extends from the rear portion 3451 of the ferrite material 345 to the rear portion 3452 of the ferrite material 345 through the inner area of the power transmitting coil 131 and the inner area of the power receiving coil 141.

According to the embodiment of FIG. 43, the leakage of magnetic flux is suppressed by the ferrite material 345. Therefore, high power supply efficiency between the power transmitting coil 131 and the power receiving coil 141 can be obtained without increasing the number of turns of each of the power transmitting coil 131 and the power receiving coil 141. This makes it possible to reduce the resistance value of each of the power transmitting coil 131 and the power receiving coil 141. In addition, each of the power transmitting coil 131 and the power receiving coil 141 may be made smaller.

The ferrite material 345 has a relatively large volume because it has a side wall portion. Thus, even if the ferrite material 345 generates heat due to conductive noise, the temperature rise is small. Further, since the ferrite material 345 has the relatively large volume, it has a relatively large inductance. The relatively large inductance of the ferrite material 345 and the small resistance of each of the power transmitting coil 131 and the power receiving coil 141 result in a high Q value of each of the power transmitting coil 131 and the power receiving coil 141. Therefore, high efficiency of power transmission between the power transmitting coil 131 and the power receiving coil 141 is ensured.

The ferrite material 345 may be formed of manganese zinc based ferrite, nickel zinc based ferrite, or a nanocrystalline soft magnetic material. In this case, when the transmission frequency is 1 MHz or less, a high magnetic flux confinement effect can be obtained at the transmission frequency due to high magnetic permeability, and conductive noise can be efficiently converted into heat.

FIG. 44 is a diagram illustrating a power transmitting coil unit and a power receiving coil unit according to yet another exemplary embodiment. Hereinafter, an embodiment shown in FIG. 44 will be described from the viewpoint of its differences from the embodiment of FIG. 43. In the embodiment shown in FIG. 44, the inner ferrite material 348 penetrates the rear portion 3451 of the ferrite material 345 and the rear portion 3452 of the ferrite material 345. The inner ferrite material 348 extends from the heat sink 134 to the heat sink 144 through the inner area of the power transmitting coil 131 and the inner area of the power receiving coil 141.

FIG. 45 is a diagram illustrating a power transmitting coil unit and a power receiving coil unit according to yet another exemplary embodiment. Hereinafter, an embodiment shown in FIG. 45 will be described from the viewpoint of its differences from the embodiment of FIG. 30.

In the state shown in FIG. 45, the inner ferrite material 348 extends from the rear portion 1452 through the inner area of the power receiving coil 141 to the inner area of the power transmitting coil 131.

As in the embodiment of FIG. 30, the power transmitting coil 131, heat sink 134, ferrite material 135, thermally conductive sheet 136, and thermally conductive sheet 137 of the power transmitting coil unit 130 may be moved by the driving system 340*d* in a direction toward the power receiving coil unit 140 (hereinafter referred to as the "approaching direction") and in a direction away from the power receiving coil unit 140 (hereinafter referred to as the "receding direction"). In the state shown in FIG. 45, when the power transmitting coil 131, the heat sink 134, the ferrite material 135, the thermally conductive sheet 136, and the thermally conductive sheet 137 are moved in the approaching direction by the driving system 340*d*, one end of the inner ferrite material 348 may abut against the rear portion 1351.

FIG. 46 is a diagram illustrating a power transmitting coil unit and a power receiving coil unit according to yet another exemplary embodiment. Hereinafter, an embodiment shown in FIG. 46 will be described from the viewpoint of its differences from the embodiment of FIG. 45. In the embodiment of FIG. 46, the inner ferrite material 348 extends from the rear portion 1351 through the inner area of the power transmitting coil 131 to the inner area of the power receiving coil 141. When the driving system 340*d* moves the power transmitting coil 131, the heat sink 134, the ferrite material 135, the thermally conductive sheet 136, the thermally conductive sheet 137, and the inner ferrite material 348 in the approaching direction, the other end of the inner ferrite material 348 may abut against the rear portion 1452.

FIG. 47 is a diagram illustrating a power transmitting coil unit and a power receiving coil unit according to yet another exemplary embodiment. Hereinafter, an embodiment shown in FIG. 47 will be described from the viewpoint of its differences from the embodiment of FIG. 45. In the embodiment shown in FIG. 47, the inner ferrite material 348 extends from the rear portion 1452 through the inner area of the power receiving coil 141 and the inner area of the power transmitting coil 131 to the rear portion 1351. When the driving system 340*d* moves the power transmitting coil 131, the heat sink 134, the ferrite material 135, the thermally conductive sheet 136, and the thermally conductive sheet 137 in the approaching direction, one end of the inner ferrite material 348 may abut against the heat sink 134 through a through hole of the rear portion 1351. Furthermore, by providing an inner hole in the heat sink 134, one end of the inner ferrite material 348 may abut against the interior of the heat sink 134 through a through hole in the rear portion 1351.

FIG. 48 is a diagram illustrating a power transmitting coil unit and a power receiving coil unit according to yet another exemplary embodiment. Hereinafter, an embodiment shown in FIG. 48 will be described from the viewpoint of its differences from the embodiment of FIG. 46. In the embodiment of FIG. 48, the inner ferrite material 348 extends from the rear portion 1351 through the inner area of the power transmitting coil 131 and the inner area of the power receiving coil 141 to the rear portion 1452. When the driving system 340*d* moves the power transmitting coil 131, the heat sink 134, the ferrite material 135, the thermally conductive sheet 136, the thermally conductive sheet 137, and the inner ferrite material 348 in the approaching direction, the other end of the inner ferrite material 348 may abut against the heat sink 144 through the through hole of the rear portion 1452. Furthermore, by providing an inner hole in the heat sink 144, the other end of the inner ferrite material 348 may abut against the interior of the heat sink 144 through a through hole in the rear portion 1452.

Each of FIGS. 49 and 50 is a diagram illustrating a power transmitting coil unit and a power receiving coil unit according to yet another exemplary embodiment. Hereinafter, an embodiment shown in each of FIGS. 49 and 50 will be described from the viewpoint of its differences from the embodiment of FIG. 45. In the embodiment of each of FIGS. 49 and 50, a columnar inner ferrite material 3481 and a columnar inner ferrite material 3482 are used instead of the inner ferrite material 348. Further, the length of the inner ferrite material 3481 in the embodiment of FIG. 49 is shorter than the length of the inner ferrite material 3481 in the embodiment of FIG. 50. Also, the length of the inner ferrite material 3482 in the embodiment of FIG. 49 is longer than the length of the inner ferrite material 3482 in the embodiment of FIG. 50. As shown in FIGS. 49 and 50, the length of the inner ferrite material 3481 may be shorter or longer than the length of the inner ferrite material 3482.

The inner ferrite material 3481 passes from the rear portion 1351 through the inner area of the power transmitting coil 131 and protrudes from the power transmitting coil 131 toward the power receiving coil 141. The inner ferrite material 3482 passes from the rear portion 1452 through the inner area of the power receiving coil 141 and protrudes from the power receiving coil 141 toward the power transmitting coil 131.

When the driving system 340*d* moves the power transmitting coil 131, the heat sink 134, the ferrite material 135, the thermally conductive sheet 136, the thermally conductive sheet 137, and the inner ferrite material 3481 in the approaching direction, the end of the inner ferrite material 3481 may abut against the end of the inner ferrite material 3482.

FIG. 51 is a diagram illustrating a power transmitting coil unit and a power receiving coil unit according to yet another exemplary embodiment. Hereinafter, an embodiment shown in FIG. 51 will be described from the viewpoint of its differences from the embodiment of FIG. 49. In the state shown in FIG. 51, the end of the inner ferrite material 3481 lies on a plane that includes the end of the inner ferrite material 3482. In the embodiment shown in FIG. 51, the inner ferrite material 3482 provides an inner hole that extends from an end thereof into the inner ferrite material 3482.

When the driving system 340*d* moves the power transmitting coil 131, the heat sink 134, the ferrite material 135, the thermally conductive sheet 136, the thermally conductive sheet 137, and the inner ferrite material 3481 in the approaching direction, the end portion of the inner ferrite material 3481 is accommodated in the inner hole of the inner ferrite material 3482. Further, the inner ferrite material 3481 may provide an inner hole, and an end portion of the inner ferrite material 3482 may be accommodated in the inner hole of the inner ferrite material 3481.

FIG. 52 is a diagram illustrating a power transmitting coil unit and a power receiving coil unit according to yet another exemplary embodiment. Hereinafter, an embodiment shown in FIG. 52 will be described from the viewpoint of its differences from the embodiment of FIG. 45.

In the embodiment shown in FIG. 52, the power transmitting coil unit 130 includes a base plate 138 instead of the heat sink 134. The base plate 138 is, for example, a glass epoxy board. In the power transmitting coil unit 130, the ferrite material 135 has a substantially plate-like shape, similar to that of the rear portion 1351 described above, and extends from the back side of the power transmitting coil 131. The base plate 138 may have at least one hollow portion in a surface contacting the ferrite material 135. In this case, the cooling efficiency of the ferrite material 135 can be improved.

The power receiving coil unit 140 includes a base plate 148 instead of the heat sink 144. The base plate 148 is, for example, a glass epoxy board. In the power receiving coil unit 140, the side wall portion 1454 of the ferrite material 145 extends from the rear portion 1452 to the power transmitting coil unit 130, and surrounds the outer circumference of the power transmitting coil 131, the outer circumference of the thermally conductive sheet 136, and the outer circumference of the ferrite material 135. The base plate 148 may have at least one hollow portion in a surface contacting the ferrite material 145. In this case, the cooling efficiency of the ferrite material 145 can be improved.

When the driving system 340*d* moves the power transmitting coil 131, the base plate 138, the ferrite material 135, the thermally conductive sheet 136, and the inner ferrite material 3481 in the approaching direction, the end of the inner ferrite material 348 protrudes from the base plate 138 through the through hole of the base plate 138 toward the first rear wall 340*g*1.

In the embodiment shown in FIG. 52, the fan 340*f* is disposed along the second rear wall 340*g*2. A plurality of vent holes 340*gh* are formed in the first rear wall 340*g*1 and the second rear wall 340*g*2.

Hereinafter, FIGS. 53A, 53B, and 53C are referred. Each of FIGS. 53A, 53B, and 53C is a diagram illustrating an example of a positional relationship between each of the power transmitting coil and power receiving coil and an inner ferrite material.

As shown in FIG. 53A, the inner ferrite material 348 may contact the power transmitting coil 131 and the power receiving coil 141. The inner ferrite material 3481 may contact the power transmitting coil 131, and the inner ferrite material 3482 may contact the power receiving coil 141.

As shown in FIG. 53B, the inner ferrite material 348 may extend from the inner area of the power transmitting coil 131 but not reach the inner area of the power receiving coil 141. Alternatively, the inner ferrite material 348 may extend from the inner area of the power receiving coil 141 but not reach the inner area of the power transmitting coil 131.

As shown in FIG. 53C, the inner ferrite material 348 may not contact the power transmitting coil 131 and the power receiving coil 141. Moreover, the inner ferrite material 3481 may not contact the power transmitting coil 131, and the inner ferrite material 3482 may not contact the power receiving coil 141.

Figure 54A:
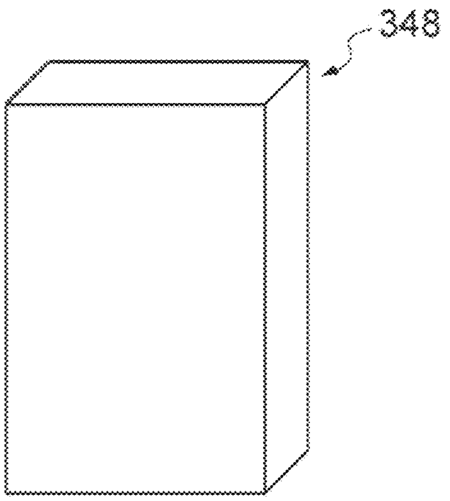

Hereinafter, FIGS. 54A to 54E are referred. FIGS. 54A to 54E are diagrams illustrating several examples of inner ferrite materials. As shown in FIG. 54A, the inner ferrite material 348 may be a single prism. Each of the inner ferrite materials 3481 and 3482 may also be a single prism.

Figure 54B:
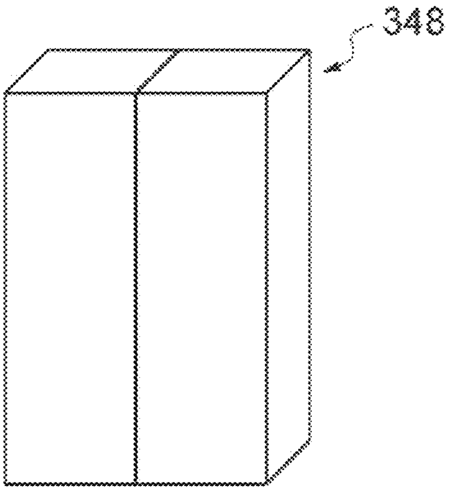

As shown in FIG. 54B, the inner ferrite material 348 may be composed of two or more prisms. Each of the inner ferrite materials 3481 and 3482 may also be composed of two or more prisms.

Figure 54C:
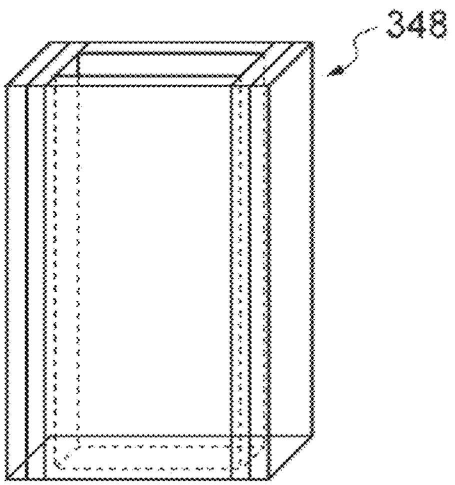

As shown in FIG. 54C, the inner ferrite material 348 may be in the shape of a rectangular parallelepiped and may have an inner hole or be hollow. The inner ferrite material 348 may be composed of several plate materials. Furthermore, each of the inner ferrite materials 3481 and 3482 may also be in the shape of a rectangular parallelepiped and may have an inner hole or be hollow. Each of the inner ferrite materials 3481 and 3482 may also be composed of several plate materials.

Figure 54D:
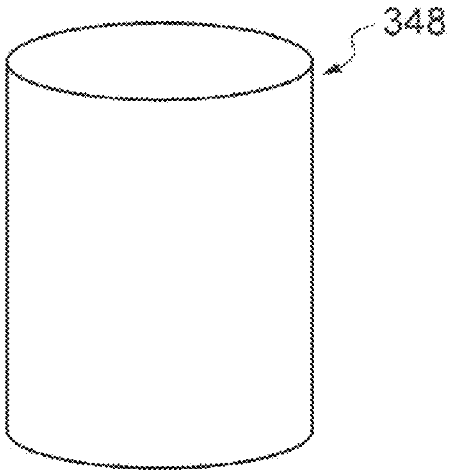
Figure 54E:
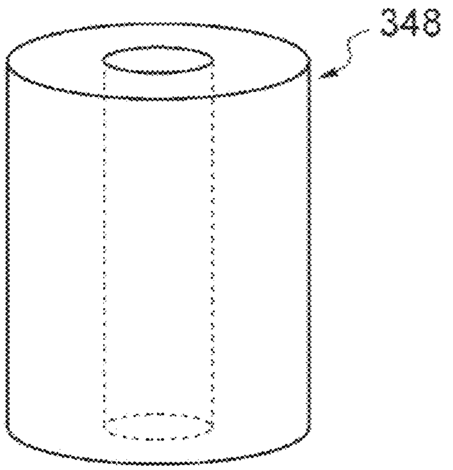

As shown in FIG. 54D, the inner ferrite material 348 may have a columnar shape. Each of the inner ferrite materials 3481 and 3482 may also have a columnar shape. As shown in FIG. 54E, the inner ferrite material 348 may have a cylindrical shape. Each of the inner ferrite materials 3481 and 3482 may also have a cylindrical shape.

Hereinafter, FIGS. 55A to 55C and FIGS. 56A and 56B are referred. FIGS. 55A to 55C and FIGS. 56A and 56B are diagrams illustrating several examples of inner ferrite materials. Each of FIGS. 55A to 55C and FIGS. 56A and 56B is a plan view illustrating an end surface of the inner ferrite material.

As shown in FIG. 55A, the inner ferrite material 348 may be in the shape of a rectangular parallelepiped. Further, as shown in FIG. 55A, the inner ferrite material 348 may have a lattice shape. The inner ferrite material 348 may be formed of a plurality of plate materials. Spaces defined within the inner ferrite material 348 may be evenly or unevenly provided. Alternatively, the inner ferrite material 348 may be configured by inserting one or more members having a different shape into one or more spaces provided therein. The different shape may be, for example, a columnar shape.

As shown in FIGS. 55B and 55C, the inner ferrite material 348 may be formed of a plurality of members. In the examples of FIG. 55B and FIG. 55C, each of the plurality of members has a columnar shape. As shown in FIG. 55B, the plurality of members may be arranged two-dimensionally to be parallel to each other. As shown in FIG. 55C, the plurality of members may be arranged to be parallel to each other and to surround a space. Each of the plurality of members may have a cylindrical shape. Alternatively, one or more of the plurality of members may have a columnar shape, and the other members may have a cylindrical shape.

The number, shape, and arrangement of the plurality of members of the inner ferrite material 348 may be appropriately selected depending on the shape of the inner area of each of the power transmitting coil 131 and the power receiving coil 141. For example, as shown in FIG. 56A, the plurality of members of the inner ferrite material 348 may have a hexagonal prism shape. Further, as shown in FIG. 56B, the inner ferrite material 348 may have any shape formed from a plurality of plate-shaped portions. Each of the inner ferrite material 3481 and the inner ferrite material 3482 may also be configured similarly to any of the various examples described above for the inner ferrite material 348.

Hereinafter, FIGS. 57A to 57C and FIGS. 58A and 58B are referred. FIGS. 57A to 57C and FIGS. 58A and 58B are diagrams illustrating several examples of ferrite materials in a power transmitting coil unit and a power receiving coil unit.

As shown in FIG. 57A, the inner ferrite material 348 may be formed integrally with the rear portion 1452 or the rear portion 3452. In addition, the inner ferrite material 3482 may be formed integrally with the rear portion 1452 or the rear portion 3452.

As shown in FIG. 57B, the inner ferrite material 348 may be formed integrally with the rear portion 1351 or the rear portion 3451. In addition, the inner ferrite material 3481 may be formed integrally with the rear portion 1351 or the rear portion 3451.

As shown in FIG. 57C, the inner ferrite material 348 may be formed integrally with the rear portion 1351 or the rear portion 1452. The inner ferrite material 348 may be formed integrally with the rear portion 3451 or the rear portion 3452.

As shown in FIG. 58A, the inner ferrite material 348 may be formed integrally with the rear portion 1452 and the side wall portion 1454. The inner ferrite material 348 may be formed integrally with the rear portion 3452 and the side wall portion 3453. Further, the inner ferrite material 3482 may be formed integrally with the rear portion 1452 and the side wall portion 1454. The inner ferrite material 3482 may be formed integrally with the rear portion 3452 and the side wall portion 3453.

As shown in FIG. 58B, the inner ferrite material 348 may be formed integrally with the rear portion 1351 and the side wall portion 1353. The inner ferrite material 348 may be formed integrally with the rear portion 3451 and the side wall portion 3453. Further, the inner ferrite material 3481 may be formed integrally with the rear portion 1351 and the side wall portion 1353. The inner ferrite material 3481 may be formed integrally with the rear portion 3451 and the side wall portion 3453.

[Exemplary Embodiment Regarding Cooling Mechanism of Power Transmitting Coil Unit and Power Receiving Coil Unit]

Hereinafter, referring to FIGS. 59 to 69, various exemplary embodiments regarding the cooling mechanism of the power transmitting coil unit 130 and the power receiving coil unit 140 will be described. The cooling mechanism cools the coils such as the power transmitting coil 131 and the power receiving coil 141 and the ferrite material. The cooling mechanism suppresses damage to components in the power transmitting coil unit 130 and the power receiving coil unit 140. In addition, since the ferrite material is cooled by the cooling mechanism, high frequency power having a high power level may be used as high frequency power such as the first RF signal and the second RF signal.

FIG. 59 is a diagram illustrating a power transmitting coil unit and a power receiving coil unit according to yet another exemplary embodiment. FIG. 60A is a diagram illustrating an example of a heat sink of the power receiving coil unit shown in FIG. 59, and FIG. 60B is a diagram illustrating an example of a heat sink of the power transmitting coil unit shown in FIG. 59. The embodiment shown in FIG. 59 is the same as the embodiment shown in FIG. 28, except that the driving system 340*d* is not used.

In various embodiments, including those shown in FIGS. 28 and 59, the heat sink 134 includes a plurality of fins 134*f* as shown in FIG. 60B. The plurality of fins 134*f* and a plurality of gaps are alternately arranged to be parallel to each other. Further, as shown in FIG. 60A, the heat sink 144 includes a plurality of fins 144*f*. The plurality of fins 144*f* and a plurality of gaps are alternately arranged to be parallel to each other.

In the embodiment shown in each of FIGS. 28 and 59, the fan 130*f* is a blower fan, and generates an airflow that passes through the fins 134*f* and the alternating gaps and reaches the outside of the power transmitting coil unit 130 from the vent holes 130*gh*, as indicated by the arrows in FIG. 59. Further, the fan 130*f* forms an airflow that passes through the space between the power transmitting coil 131 and the insulating plate 130*i* and reaches the outside of the power transmitting coil unit 130 from the plurality of vent holes 130*gh*, as indicated by the arrows in FIG. 59. This cools the power transmitting coil 131 and the ferrite material 135. The fan 130*f* may be an exhaust fan. When the fan 130*f* is the exhaust fan, an airflow is generated in the power transmitting coil unit 130 in the opposite direction to the airflow indicated by the arrows in FIG. 59.

In the embodiment shown in each of FIGS. 28 and 59, the fan 140*f* is a blower fan, and generates an airflow that passes through the fins 144*f* and the alternating gaps and reaches the outside of the power receiving coil unit 140 from the vent holes 140*gh*, as indicated by the arrows in FIG. 59. Further, the fan 140*f* forms an airflow that passes through the space between the power receiving coil 141 and the insulating plate 140*i* and reaches the outside of the power receiving coil unit 140 from the plurality of vent holes 140*gh*, as indicated by the arrows in FIG. 59. This cools the power receiving coil 141 and the ferrite material 145. The fan 140*f* may be an exhaust fan. When the fan 140*f* is the exhaust fan, an airflow is generated in the power receiving coil unit 140 in the opposite direction to the airflow indicated by the arrows in FIG. 59.

FIG. 61 is a diagram illustrating a power transmitting coil unit and a power receiving coil unit according to yet another exemplary embodiment. Hereinafter, an embodiment shown in FIG. 61 will be described from the viewpoint of its differences from the embodiment of FIG. 59.

In the embodiment shown in FIG. 61, some of the vent holes 130*gh* are formed in the rear wall 130*gb*. The fan 130*f* is provided along the rear wall 130*gb* on the outside of the metal housing 130*g*. The heat sink 134, the ferrite material 135, the thermally conductive sheet 136, and the power transmitting coil 131 provide a first gas flow path that connects space between the power transmitting coil 131 and the insulating plate 130*i* to the vent holes 130*gh* in the rear wall 130*gb*.

Further, in the embodiment shown in FIG. 61, some of the vent holes 140*gh* are formed in the rear wall 140*gb*. The fan 140*f* is provided along the rear wall 140*gb* on the outside of the metal housing 140*g*. The heat sink 144, the ferrite material 145, the thermally conductive sheet 146, and the power receiving coil 141 provide a second gas flow path that connects space between the power receiving coil 141 and the insulating plate 140*i* to the vent holes 140*gh* in the rear wall 140*gb*.

In the embodiment shown in FIG. 61, the fan 130*f* is a blower fan, and generates an airflow that passes through the fins 134*f* and the alternating gaps and reaches the outside of the power transmitting coil unit 130 from the vent holes 130*gh* in the side wall 130*gs*, as indicated by the arrows in FIG. 61. Further, the fan 130*f* forms an airflow that passes through space between the first gas flow path, the power transmitting coil 131 and the insulating plate 130*i* and reaches the outside of the power transmitting coil unit 130 from the plurality of vent holes 130*gh* in the side wall 130*gs*, as indicated by the arrows in FIG. 61. This cools the power transmitting coil 131 and the ferrite material 135. Further, the fan 130*f* may be an exhaust fan. When the fan 130*f* is the exhaust fan, an airflow is generated in the power transmitting coil unit 130 in the opposite direction to the airflow indicated by the arrows in FIG. 61.

In the embodiment shown in FIG. 61, the fan 140*f* is a blower fan, and generates an airflow that passes through the fins 144*f* and the alternating gaps and reaches the outside of the power receiving coil unit 140 from the vent holes 140*gh* in the side wall 140*gs*, as indicated by the arrows in FIG. 61. Further, the fan 140*f* forms an airflow that passes through space between the second gas flow path, the power receiving coil 141 and the insulating plate 140*i* and reaches the outside of the power receiving coil unit 140 from the plurality of vent holes 140*gh* in the side wall 140*gs*, as indicated by the arrows in FIG. 61. This cools the power receiving coil 141 and the ferrite material 145. Further, the fan 140*f* may be an exhaust fan. When the fan 140*f* is the exhaust fan, an airflow is generated in the power receiving coil unit 140 in the opposite direction to the airflow indicated by the arrows in FIG. 61.

FIG. 62 is a diagram illustrating a power transmitting coil unit and a power receiving coil unit according to yet another exemplary embodiment. Hereinafter, an embodiment shown in FIG. 62 will be described from the viewpoint of its differences from the embodiment shown in FIG. 29. In the embodiment shown in FIG. 62, the driving system 340*d* is not used. In addition, in the embodiment shown in FIG. 62, the end of the side wall portion 1353 extends to the insulating plate 34*i*, and the end of the side wall portion 1353 faces the end of the side wall portion 1454 with the insulating plate 34*i* interposed therebetween. Other configurations of the embodiment shown in FIG. 62 are similar to the corresponding configurations of the embodiment shown in FIG. 29.

In the embodiment shown in FIG. 62, a plurality of vent holes are formed in the side wall portion 1353 of the ferrite material 135 and the thermally conductive sheet 137 to form the airflow indicated by the arrows. Further, a plurality of vent holes are formed in the side wall portion 1454 of the ferrite material 145 and the thermally conductive sheet 147 to form the airflow as indicated by arrows. The vent holes in each of the side wall portion 1353 and the side wall portion 1454 have a small size to ensure the effect of confining the magnetic flux in each of the side wall portion 1353 and the side wall portion 1454.

In the embodiment shown in FIG. 62, the fan 130*f* is a blower fan, and generates an airflow that passes through the fins 134*f* and the alternating gaps and reaches the outside of the power transmitting coil unit 130 from the vent holes 130*gh*, as indicated by the arrows in FIG. 62. Further, the fan 130*f* forms an airflow that passes through space between the side wall portion 1353, the vent holes of the thermally conductive sheet 137, the power transmitting coil 131, and the insulating plate 34*i* and reaches the outside of the power transmitting coil unit 130 from the vent holes 130*gh*, as indicated by the arrows in FIG. 62. This cools the power transmitting coil 131 and the ferrite material 135. Further, the fan 130*f* may be an exhaust fan. When the fan 130*f* is the exhaust fan, an airflow is generated in the power transmitting coil unit 130 in the opposite direction to the airflow indicated by the arrows in FIG. 62.

In the embodiment shown in FIG. 62, the fan 140*f* is a blower fan, and generates an airflow that passes through the fins 144*f* and the alternating gaps and reaches the outside of the power receiving coil unit 140 from the vent holes 140*gh*, as indicated by the arrows in FIG. 62. Further, the fan 140*f* forms an airflow that passes through space between the side wall portion 1454, the vent holes of the thermally conductive sheet 147, the power receiving coil 141, and the insulating plate 34*i* and reaches the outside of the power receiving coil unit 140 from the vent holes 140*gh*, as indicated by the arrows in FIG. 62. This cools the power receiving coil 141 and the ferrite material 145. Further, the fan 140*f* may be an exhaust fan. When the fan 140*f* is the exhaust fan, an airflow is generated in the power receiving coil unit 140 in the opposite direction to the airflow indicated by the arrows in FIG. 62.

FIG. 63 is a diagram illustrating a power transmitting coil unit and a power receiving coil unit according to yet another exemplary embodiment. Hereinafter, an embodiment shown in FIG. 63 will be described from the viewpoint of its differences from the embodiment shown in FIG. 62.

In the embodiment shown in FIG. 63, some of the vent holes 130*gh* are formed in the rear wall 130*gb*. The fan 130*f* is provided along the rear wall 130*gb* on the outside of the metal housing 130*g*. The heat sink 134, the ferrite material 135, the thermally conductive sheet 136, and the power transmitting coil 131 provide a first gas flow path that connects space between the power transmitting coil 131 and the insulating plate 34*i* to the vent holes 130*gh* in the rear wall 130*gb*.

Further, in the embodiment shown in FIG. 63, some of the vent holes 140*gh* are formed in the rear wall 140*gb*. The fan 140*f* is provided along the rear wall 140*gb* on the outside of the metal housing 140*g*. The heat sink 144, the ferrite material 145, the thermally conductive sheet 146, and the power receiving coil 141 provide a second gas flow path that connects space between the power receiving coil 141 and the insulating plate 34*i* to the vent holes 140*gh* in the rear wall 140*gb*.

In the embodiment shown in FIG. 63, the fan 130*f* is a blower fan, and generates an airflow that passes through the fins 134*f* and the alternating gaps and reaches the outside of the power transmitting coil unit 130 from the vent holes 130*gh* in the side wall 130*gs*, as indicated by the arrows in FIG. 63. Further, the fan 130*f* forms an airflow that passes through space between the first gas flow path, the power transmitting coil 131 and the insulating plate 34*i*, the side wall portion 1353, and the vent holes of the thermally conductive sheet 137, and reaches the outside of the power transmitting coil unit 130 from the plurality of vent holes 130*gh* in the side wall 130*gs*, as indicated by the arrows in FIG. 63. This cools the power transmitting coil 131 and the ferrite material 135. Further, the fan 130*f* may be an exhaust fan. When the fan 130*f* is the exhaust fan, an airflow is generated in the power transmitting coil unit 130 in the opposite direction to the airflow indicated by the arrows in FIG. 63.

In the embodiment shown in FIG. 63, the fan 140*f* is a blower fan, and generates an airflow that passes through the fins 144*f* and the alternating gaps and reaches the outside of the power receiving coil unit 140 from the vent holes 140*gh* in the side wall 140*gs*, as indicated by the arrows in FIG. 63. Further, the fan 140*f* forms an airflow that passes through space between the second gas flow path, the power receiving coil 141 and the insulating plate 140*i*, the side wall portion 1454, and the vent holes of the thermally conductive sheet 147, and reaches the outside of the power receiving coil unit 140 from the plurality of vent holes 140*gh* in the side wall 140*gs*, as indicated by the arrows in FIG. 63. This cools the power receiving coil 141 and the ferrite material 145. Further, the fan 140*f* may be an exhaust fan. When the fan 140*f* is the exhaust fan, an airflow is generated in the power receiving coil unit 140 in the opposite direction to the airflow indicated by the arrows in FIG. 63.

FIG. 64 is a diagram illustrating a power transmitting coil unit and a power receiving coil unit according to yet another exemplary embodiment. The embodiment shown in FIG. 64 is the same as the embodiment shown in FIG. 43, except that the inner ferrite material 348 is not used. In the embodiment shown in FIG. 64, a plurality of vent holes are formed in the side wall portion 3453 of the ferrite material 345 and the thermally conductive sheet 347 to form the airflow indicated by the arrows. The vent holes in the side wall portion 3453 have a small size to ensure the effect of confining the magnetic flux in each of the side wall portion 3453.

In the embodiment shown in FIG. 64, the fan 340*f* is a blower fan, and generates an airflow that passes through the fins 134*f* of the heat sink 134 and the alternating gaps and reaches the outside of the power transmitting coil unit 130 from the vent holes 340*gh*, as indicated by the arrows in FIG. 64. Further, the fan 340*f* generates an airflow that passes through the fins 144*f* of the heat sink 144 and the alternating gaps and reaches the outside of the power receiving coil unit 140 from the vent holes 340*gh*, as indicated by the arrows in FIG. 64. Further, the fan 340*f* forms an airflow that passes through space between the side wall portion 3453, the vent holes of the thermally conductive sheet 347, the power transmitting coil 131, and the power receiving coil 141 and reaches the outside of the power transmitting coil unit 130 and the power receiving coil unit 140 from the vent holes 340*gh*, as indicated by the arrows in FIG. 64. This cools the power transmitting coil 131, the ferrite material 345, and the power receiving coil 141. Further, the fan 340*f* may be an exhaust fan. When the fan 340*f* is the exhaust fan, an airflow is generated in the power transmitting coil unit 130 and the power receiving coil unit 140 in the opposite direction to the airflow indicated by the arrows in FIG. 64.

FIG. 65 is a diagram illustrating a power transmitting coil unit and a power receiving coil unit according to yet another exemplary embodiment. Hereinafter, an embodiment shown in FIG. 65 will be described from the viewpoint of its differences from the embodiment shown in FIG. 64.

In the embodiment shown in FIG. 65, some of the vent holes 340*gh* are formed in the first rear wall 340*g*1 and the second rear wall 340*g*2. In the embodiment shown in FIG. 65, the fan 130*f* is provided along the first rear wall 340*g*1 on the outside of the metal housing 340*g*. Further, the fan 140*f* is provided along the second rear wall 340*g*2 on the outside of the metal housing 340*g*.

In the embodiment of FIG. 65, the heat sink 134, the rear portion 3451 of the ferrite material 345, the thermally conductive sheet 136, and the power transmitting coil 131 provide a first gas flow path that connects space between the power transmitting coil 131 and the power receiving coil 141 to the vent holes 340*gh* in the first rear wall 340*g*1. Further, the heat sink 144, the rear portion 3452 of the ferrite material 345, the thermally conductive sheet 146, and the power receiving coil 141 provide a second gas flow path that connects space between the power transmitting coil 131 and the power receiving coil 141 to the vent holes 340*gh* in the second rear wall 340*g*2.

In the embodiment of FIG. 65, the fan 130*f* is a blower fan, and generates an airflow that passes through the fins 134*f* and the alternating gaps and reaches the outside of the power transmitting coil unit 130 from the vent holes 130*gh* in the side wall 340*g*3, as indicated by the arrows in FIG. 65. Further, the fan 130*f* forms an airflow that passes through the first gas flow path, space between the power transmitting coil 131 and the power receiving coil 141, the side wall portion 3453, and the vent holes of the thermally conductive sheet 347 and reaches the outside of the power transmitting coil unit 130 from the vent holes 340*gh* in the side wall 340*g*3, as indicated by the arrows in FIG. 65. This cools the power transmitting coil 131 and the ferrite material 345. Further, the fan 130*f* may be an exhaust fan. When the fan 130*f* is the exhaust fan, an airflow is generated in the power transmitting coil unit 130 in the opposite direction to the airflow indicated by the arrows in FIG. 65.

In the embodiment of FIG. 65, the fan 140*f* is a blower fan, and generates an airflow that passes through the fins 144*f* and the alternating gaps and reaches the outside of the power receiving coil unit 140 from the vent holes 340*gh* in the side wall 340*g*3, as indicated by the arrows in FIG. 65. Further, the fan 140*f* forms an airflow that passes through the second gas flow path, space between the power receiving coil 141 and the power transmitting coil 131, the side wall portion 3453, and the vent holes of the thermally conductive sheet 347 and reaches the outside of the power receiving coil unit 140 from the vent holes 340*gh* in the side wall 340*g*3, as indicated by the arrows in FIG. 65. This cools the power receiving coil 141 and the ferrite material 345. Further, the fan 140*f* may be an exhaust fan. When the fan 140*f* is the exhaust fan, an airflow is generated in the power receiving coil unit 140 in the opposite direction to the airflow indicated by the arrows in FIG. 65.

FIG. 66A is a sectional view of a coil unit according to another exemplary embodiment, and FIG. 66B is a plan view illustrating a cooling plate in the coil unit shown in FIG. 66A. The coil unit 500 shown in FIG. 66A may be used as at least one of the power transmitting coil unit 130 and the power receiving coil unit 140.

As shown in FIG. 66A, the coil unit 500 includes a metal housing 500*g*, a fan 500*f*, a coil 501, a heat sink 504, a ferrite material 505, and a cooling plate 509. The metal housing 500*g* is used as the metal housing 130*g*, the metal housing 140*g*, or the metal housing 340*g*. An opening in the end of the side wall of the metal housing 500*g* may be closed by the insulating plate 500*i*. A plurality of vent holes 500*gh* such as the vent holes 130*gh*, 140*gh*, or 340*gh* are formed in the metal housing 500*g*. Also, the fan 500*f* is used as the fan 130*f*, 140*f*, or 340*f*.

The coil 501 is used as the power transmitting coil 131 in the power transmitting coil unit 130 and used as the power receiving coil 141 in the power receiving coil unit 140. The heat sink 504 is used as the heat sink 134 in the power transmitting coil unit 130 and used as the heat sink 144 in the power receiving coil unit 140. The ferrite material 505 is provided between the heat sink 504 and the coil 501.

The cooling plate 509 is provided between the ferrite material 505 and the coil 501. The cooling plate 509 may contact one or both of the ferrite material 505 and the coil 501. The cooling plate 509 is a hollow plate, and contains a refrigerant in an internal space 509*h*. The cooling plate 509 cools the coil 501 and the ferrite material 505. In the example of FIG. 66A, the outer diameter of the cooling plate 509 is the same as the outer diameter of the coil 501, but the outer diameter of the space 509*h* may be the same as the outer diameter of the coil 501. In this case, the outer diameter of the cooling plate 509 is larger than the outer diameter of the coil 501. The cooling plate 509 may be made of an insulating material such as ceramic. The refrigerant may be a fluid and may be a dielectric. The refrigerant may include at least one selected from water, brine, and air.

FIG. 67 is a sectional view of a coil unit according to yet another exemplary embodiment. FIG. 68 is a diagram illustrating two cooling plates in the coil unit shown in FIG. 67. Hereinafter, a coil unit shown in FIG. 67 will be described from the viewpoint of its differences from the coil unit shown in FIG. 66A.

The coil unit 500 shown in FIG. 67 includes two cooling plates 509*a* and 509*b* in place of the cooling plate 509. The cooling plate 509*a* and the cooling plate 509*b* are provided on the back side of the coil 501. The ferrite material 505 is provided between the cooling plate 509*b* and the coil 501. The cooling plate 509*b* may contact the ferrite material 505. The cooling plate 509*a* is provided between the ferrite material 505 and the coil 501. The cooling plate 509*a* may contact one or both of the ferrite material 505 and the coil 501.

As shown in FIG. 68, the cooling plate 509*a* has a refrigerant flow path 509*af* therein. Further, the cooling plate 509*b* has a refrigerant flow path 509*bf* therein.

A chiller unit 500*c* is provided outside the coil unit 500. The chiller unit 500*c* supplies the refrigerant to refrigerant flow paths 509*af* and 509*bf* and collects the refrigerant from the refrigerant flow paths 509*af* and 509*bf*. The coil 501 and the ferrite material 505 are cooled by the cooling plates 509*a* and 509*b*. The refrigerant may be a fluid and may be a dielectric. The refrigerant may include at least one selected from water, brine, and air. In an embodiment, the chiller unit 500*c* may be connected to an inlet of the refrigerant flow path 509*af*. Further, an outlet of the refrigerant flow path 509*af* may be connected to the inlet of the refrigerant flow path 509*bf*. An outlet of the refrigerant flow path 509*bf* may be connected to the chiller unit 500*c*.

FIG. 69 is a diagram illustrating a power transmitting coil unit and a power receiving coil unit according to yet another exemplary embodiment. Hereinafter, an exemplary embodiment of FIG. 69 will be described from the viewpoint of its differences from the embodiment of FIG. 64.

In the exemplary embodiment of FIG. 69, instead of the thermally conductive sheet 136, the cooling plate 509*b* is provided with the power transmitting coil 131 and the rear portion 3451 of the ferrite material 345. The cooling plate 509*b* may contact one or both of the power transmitting coil 131 and the rear portion 3451 of the ferrite material 345. Further, instead of the thermally conductive sheet 146, the cooling plate 509*a* is provided with the power receiving coil 141 and the rear portion 3452 of the ferrite material 345. The cooling plate 509*a* may contact one or both of the power receiving coil 141 and the rear portion 3452 of the ferrite material 345.

The cooling plate 509*a* has the refrigerant flow path 509*af* therein (see FIG. 68). Further, the cooling plate 509*b* has the refrigerant flow path 509*bf* therein (see FIG. 68).

A chiller unit 500*c* is provided outside the power transmitting coil unit 130 and the power receiving coil unit 140. The chiller unit 500*c* supplies the refrigerant to refrigerant flow paths 509*af* and 509*bf* and collects the refrigerant from the refrigerant flow paths 509*af* and 509*bf*. The power transmitting coil 131, the ferrite material 345, and the power receiving coil 141 are cooled by the cooling plates 509*a* and 509*b*. The refrigerant may be a fluid and may be a dielectric. The refrigerant may include at least one selected from water, brine, and air. In an embodiment, the chiller unit 500*c* may be connected to an inlet of the refrigerant flow path 509*af*. Further, an outlet of the refrigerant flow path 509*af* may be connected to the inlet of the refrigerant flow path 509*bf*. An outlet of the refrigerant flow path 509*bf* may be connected to the chiller unit 500*c*.

[Exemplary Embodiment Regarding Power Transmitting Coil and Power Receiving Coil]

Hereinafter, various exemplary embodiments of the coil 501 that may be used as each of the power transmitting coil 131 and the power receiving coil 141 will be described with reference to FIGS. 70A to 81B. The inner diameter of each of the coils 501 according to the various exemplary embodiments may be less than 150 mm, and the outer diameter thereof may be less than 350 mm. The winding directions of the power transmitting coil 131 and the power receiving coil 141 may be opposite to each other to achieve a high coupling coefficient.

FIG. 70A is a sectional view of a coil according to one exemplary embodiment, and FIG. 70B is a sectional view of a coil wire according to one exemplary embodiment. A wire 521 of a coil 501 shown in FIGS. 70A and 70B is wound from the inside to the outside around the central axis of the coil 501 to form a single layer. The wire 521 is formed by stacking a plurality of strands 522, and has a rectangular cross-sectional shape. Each of the strands 522 is a trapezoid wire. The strands 522 are bundled in layers in a direction from the inside to the outside of the coil 501. Each of the strands 522 may be covered with an insulating coating such as polyurethane.

FIG. 71A is a sectional view of a coil according to another exemplary embodiment, and FIG. 71B is a sectional view of a coil wire according to another exemplary embodiment. Hereinafter, the coil 501 shown in FIGS. 71A and 71B will be described from the viewpoint of its differences from the coil 501 shown in FIGS. 70A and 70B. Each of the plurality of strands 522 forming the wire 521 in the coil 501 shown in FIGS. 71A and 71B is a trapezoid wire. The strands 522 forming the wire 521 in the coil 501 shown in FIGS. 71A and 71B are bundled in layers along the thickness direction of the coil 501.

FIG. 72A is a sectional view of a coil according to yet another exemplary embodiment, and FIG. 72B is a sectional view of a coil wire according to yet another exemplary embodiment. Hereinafter, the coil 501 shown in FIGS. 72A and 72B will be described from the viewpoint of its differences from the coil 501 shown in FIGS. 70A and 70B. Each of the plurality of strands 522 forming the wire 521 in the coil 501 shown in FIGS. 72A and 72B has a rectangular cross-sectional shape. The wires 522 are arranged two-dimensionally in a direction from the inside to the outside of the coil 501 and along the thickness direction of the coil 501 so as to be in close contact with each another.

In each of the various coils 501 shown in FIGS. 70A to 72B, the wire 521 is composed of the plurality of strands 522 and has a larger cross-sectional area than a single wire having a circular cross-sectional shape. Thus, each of the coils 501 has a high inductance. Since the wire 521 is composed of the plurality of strands 522, the AC resistance component of the coil 501 is smaller than the AC resistance component of the coil formed of the single wire.

FIG. 73A is a sectional view of a coil according to yet another exemplary embodiment, and FIG. 73B is a sectional view of a coil wire according to yet another exemplary embodiment. Hereinafter, the coil 501 shown in FIGS. 73A and 73B will be described from the viewpoint of its differences from the coil 501 shown in FIGS. 70A and 70B.

In the coil 501 shown in FIGS. 73A and 73B, the wire 521 is a Litz wire and has a plurality of strands 522. Each of the strands 522 constituting the wire 521 has a rectangular cross-sectional shape. The strands 522 are arranged two-dimensionally in a direction from the inside to the outside of the coil 501 and along the thickness direction of the coil 501 to be in close contact with each other. The insulating coating of the wire material 521 is formed of, for example, Tetron fiber.

In the coil 501 shown in FIGS. 73A and 73B, the wire 521 is composed of the plurality of strands 522 and has a larger cross-sectional area than a typical Litz wire. Therefore, each coil 501 has a high inductance. Further, the typical Litz wire has a circular cross-sectional shape, and the plurality of strands that make up the wire also have a circular cross-sectional shape. Since the coil 501 shown in FIGS. 73A and 73B has a cross-sectional area larger than that of the typical Litz wire, the coil may have a larger number of strands than that of the typical Litz wire. Therefore, the AC resistance component of the coil 501 is smaller than that of the coil made of the typical Litz wire.

In the coil 501 shown in FIG. 73(*a*) and FIG. 73(*b*), even if the wire 521 is pulled so that adjacent turns of the wire 521 are wound while being in close contact with each other, the amount of deformation occurring in the wire 521 may be made smaller than the amount of deformation occurring in the typical Litz wire. Furthermore, in the coil 501 shown in FIG. 73(*a*) and FIG. 73(*b*), it is possible to prevent some of the multiple turns of the wire 521 from floating in the thickness direction of the coil 501 relative to the other turns.

Each of FIGS. 74A and 74B is a plan view of a coil according to yet another exemplary embodiment. Each of FIGS. 75A and 74B is a plan view of a coil according to yet another exemplary embodiment. The planar shape of the coil 501 is not limited, and may be selected from a variety of shapes as shown in these figures.

As shown in FIG. 74A, the coil 501 may have a planar shape of a circular ring, and the wire 521 may be wound in a spiral shape around the central axis of the coil 501. As shown in FIG. 74B, the coil 501 may have a planar shape of a angular ring, and the wire 521 may be wound from the inside to the outside around the central axis of the coil 501.

As shown in FIG. 75A, the planar shape of the coil 501 may be a combination of an angular ring shape and a circular ring shape. The wire 521 is wound from the inside to the outside around the central axis of the coil 501 to provide a circular ring portion inside an angular ring portion of the coil 501. Also, as shown in FIG. 75B, the planar shape of the coil 501 may be C-shaped or horseshoe-shaped.

Figure 76A:
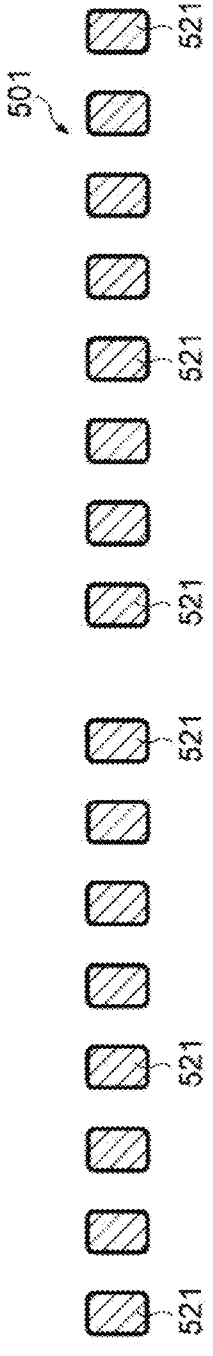
Figure 76B:
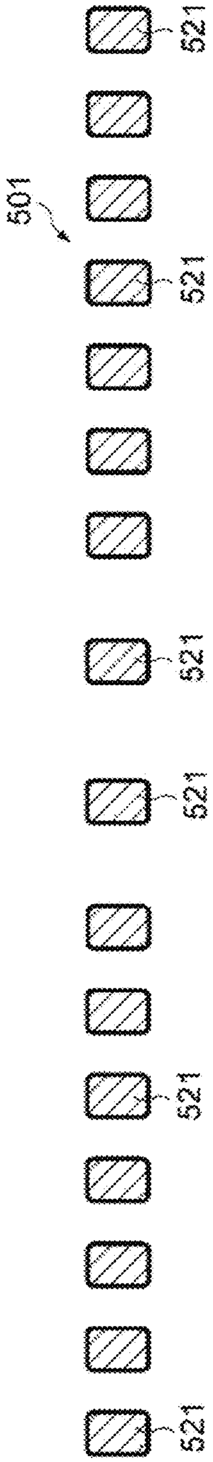
Figure 76C:
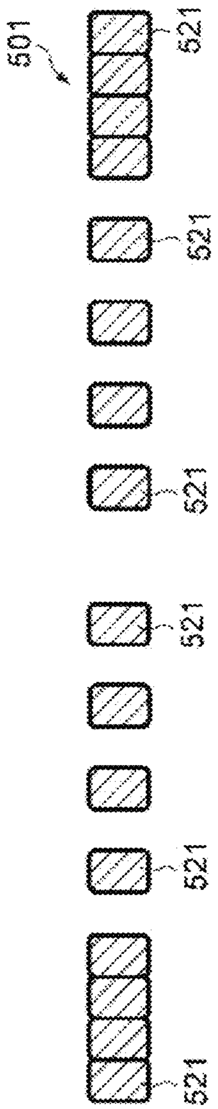
Figure 76D:
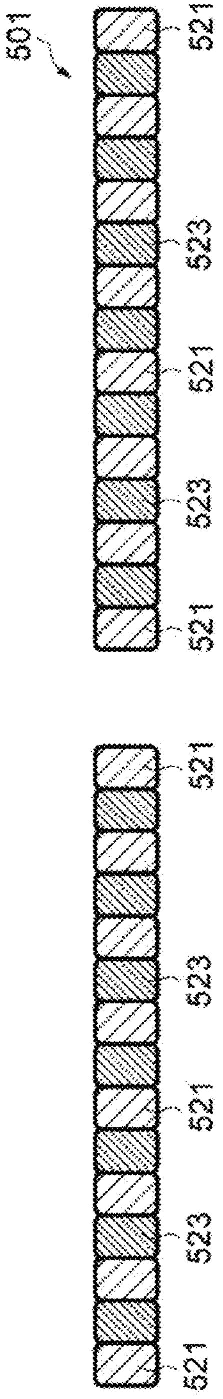

Each of FIGS. 76A to 76D is a sectional view of a coil according to yet another exemplary embodiment. As shown in FIG. 76A, the wire 521 of the coil 501 may be wound such that a pitch between the turns of the wire 521 in the coil 501 is equal. As shown in FIG. 76B, the wire 521 of the coil 501 may be wound such that the pitch between the turns is unequal. Further, as shown in FIG. 76C, adjacent turns of the wire 521 of the coil 501 may be in close contact with each other. As shown in FIG. 76D, the wire 521 of the coil 501 may be wound such that a member 523 is interposed between the turns. The member 523 may be formed of a magnetic material or a dielectric. The height of the member 523 may be the same as or different from the height of the wire 521. The width of the member 523 may be the same as or different from the width of the wire 521.

Each of FIGS. 77A and 78B is a sectional view of a coil according to yet another exemplary embodiment. As shown in FIGS. 77A and 77B, in the coil 501, the wire 521 may be wound to form a plurality of layers. The layers may be spaced apart from each other as shown in FIG. 77A or may be in close contact with each other as shown in FIG. 77B.

Each of FIGS. 78A and 78B is a sectional view of a coil according to yet another exemplary embodiment. As shown in FIGS. 78A and 78B, the cross-sectional shape of the coil 501 may be convex or concave. For example, the cross-sectional shape of the coil 501 may be conical or dome-shaped.

FIG. 79 is a sectional view of a coil according to yet another exemplary embodiment. As shown in FIG. 79, in the coil 501, the wire 521 may be wound to form a plurality of layers. In at least one of the layers, the wire 521 may be wound such that a member 523 is interposed between the turns. The member 523 may be formed of a magnetic material or a dielectric. The height of the member 523 may be the same as or different from the height of the wire material 521. The width of the member 523 may be the same as or different from the width of the wire 521.

FIG. 80 is a sectional view of a coil according to yet another exemplary embodiment. Each of FIGS. 81A and 81B is a sectional view of a coil according to yet another exemplary embodiment. As shown in these figures, in the coil 501, the wire 521 may be wound in a spiral shape. A pitch between the turns of the wire 521 may be equal or unequal. As shown in FIG. 80, adjacent turns of the wire 521 may be in close contact with each other. As shown in FIG. 81A and FIG. 81B, adjacent turns of the wire 521 may be spaced apart from each other. Also, as shown in FIG. 81B, the wire 521 may be fixed by a comb-shaped member 524. The member 524 may be made of an insulating material, for example, resin such as PEEK or PPS. Alternatively, the member 524 may be formed of a magnetic material. The member 524 may comprise a single member or a plurality of members.

Although various exemplary embodiments have been described above, various additions, omissions, substitutions, and modifications may be made without being limited to the above-described exemplary embodiments. In addition, elements from different embodiments may be combined to form other embodiments.

Herein, various exemplary embodiments included in the present disclosure are described in [E1] to [E12] below.

[E1]

A plasma processing apparatus comprising:

a plasma processing chamber;

a substrate support disposed within the plasma processing chamber;

a high frequency power supply configured to generate high frequency power;

an electrode or an antenna electrically connected to the high frequency power supply to receive the high frequency power so as to generate plasma from gas within the plasma processing chamber;

a power consuming member disposed within the plasma processing chamber or the substrate support;

an electricity storage unit electrically connected to the power consuming member;

a power transmitting coil provided outside the plasma processing chamber;

a power receiving coil electrically connected to the electricity storage unit and capable of receiving power from the power transmitting coil by electromagnetic induction coupling; and at least one driving system configured to change a distance between the power transmitting coil and the power receiving coil by moving at least one of the power transmitting coil and the power receiving coil.

[E2]

The plasma processing apparatus of E1, further comprising:

at least one metal housing defining a shielded space, and accommodating the power transmitting coil and the power receiving coil within the shielded space; and at least one ferrite material disposed within the shielded space and provided to close the space in which the power transmitting coil and the power receiving coil are disposed.

[E3]

The plasma processing apparatus of E2, wherein the at least one metal housing comprises:

a first metal housing extending from a back side of the power transmitting coil with respect to the power receiving coil, and surrounding an outer circumference of the power transmitting coil; and a second metal housing extending from a back side of the power receiving coil with respect to the power transmitting coil, and surrounding an outer circumference of the power receiving coil.

[E4]

The plasma processing apparatus of E2, wherein the at least one metal housing is a single housing that provides the shielded space, extends from a back side of the power transmitting coil with respect to the power receiving coil, extends from a back side of the power receiving coil with respect to the power transmitting coil, and surrounds an outer circumference of the power transmitting coil and an outer circumference of the power receiving coil.

[E5]

The plasma processing apparatus of E3, wherein:

the at least one ferrite material comprises:

a first rear portion provided on the back side of the power transmitting coil;

a first side wall portion extending from the first rear portion to surround the outer circumference of the power transmitting coil;

a second rear portion provided on the back side of the power receiving coil; and a second side wall portion extending from the second rear portion to surround the outer circumference of the power receiving coil, one of the first side wall portion and the second side wall portion extends from an outer side of the other of the first side wall portion and the second side wall portion, the power transmitting coil, the first rear portion, and the first side wall portion form a power transmitting coil assembly, the power receiving coil, the second rear portion, and the second side wall portion form a power receiving coil assembly, and the at least one driving system is configured to move at least one of the power transmitting coil assembly and the power receiving coil assembly.

[E6]

The plasma processing apparatus of E5, wherein the at least one driving system moves at least one of the power transmitting coil assembly and the power receiving coil assembly so that one of the first side wall portion and the second side wall portion moves along an outer circumferential surface of the other of the first side wall portion and the second side wall portion.

[E7]

The plasma processing apparatus of E4, wherein:

the at least one ferrite material comprises:

a first rear portion provided on the back side of the power transmitting coil;

a first side wall portion extending from the first rear portion to surround the outer circumference of the power transmitting coil;

a second rear portion provided on the back side of the power receiving coil; and a second side wall portion extending from the second rear portion to surround the outer circumference of the power receiving coil, one of the first side wall portion and the second side wall portion extends from an outer side of the other of the first side wall portion and the second side wall portion, the power transmitting coil, the first rear portion, and the first side wall portion form a power transmitting coil assembly, the power receiving coil, the second rear portion, and the second side wall portion form a power receiving coil assembly, and the at least one driving system is configured to move at least one of the power transmitting coil assembly and the power receiving coil assembly.

[E8]

The plasma processing apparatus of E7, wherein the at least one driving system moves at least one of the power transmitting coil assembly and the power receiving coil assembly so that one of the first side wall portion and the second side wall portion moves along an outer circumferential surface of the other of the first side wall portion and the second side wall portion.

[E9]

The plasma processing apparatus of E4, wherein:

the at least one ferrite material comprises:

a first rear portion provided on the back side of the power transmitting coil;

a second rear portion provided on the back side of the power receiving coil;

a side wall portion extending from one of the first rear portion and the second rear portion to surround the power transmitting coil, the power receiving coil, and the other of the first rear portion and the second rear portion, the power transmitting coil and the first rear portion form a power transmitting coil assembly, the power receiving coil and the second rear portion form a power receiving coil assembly, and the at least one driving system is configured to move at least one of the power transmitting coil assembly and the power receiving coil assembly.

[E10]

The plasma processing apparatus of E4, wherein:

the at least one ferrite material comprises:

a first rear portion provided on the back side of the power transmitting coil;

a second rear portion provided on the back side of the power receiving coil;

a side wall portion surrounding the power transmitting coil, the power receiving coil, the first rear portion, and the second rear portion, the power transmitting coil and the first rear portion form a power transmitting coil assembly, the power receiving coil and the second rear portion form a power receiving coil assembly, and the at least one driving system is configured to move at least one of the power transmitting coil assembly and the power receiving coil assembly within an area surrounded by the side wall portion.

[E11]

The plasma processing apparatus of any one of E2 to E10, wherein the at least one ferrite material comprises at least one inner ferrite material extending from an inner area of the power receiving coil to an inner area of the power transmitting coil.

[E12]

The plasma processing apparatus of any one of E1 to E11, further comprising:

at least one variable capacitor connected to the power transmitting coil to form a resonant circuit together with the power transmitting coil at a transmission frequency of power transmitted between the power transmitting coil and the power receiving coil; and at least one variable capacitor connected to the power receiving coil to form a resonant circuit together with the power receiving coil at the transmission frequency.

From the foregoing, it will be understood that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A plasma processing apparatus comprising:

a plasma processing chamber;

a substrate support located within the plasma processing chamber;

a high frequency power supply configured to generate high frequency power;

an electrode or an antenna electrically connected to the high frequency power supply to receive the high frequency power so as to generate plasma from gas within the plasma processing chamber;

a power consuming load located within the plasma processing chamber or the substrate support;

an electricity storage electrically connected to the power consuming load;

a power transmitting coil located outside the plasma processing chamber;

a power receiving coil electrically connected to the electricity storage and capable of receiving power from the power transmitting coil by electromagnetic induction coupling;

at least one driving system to change a distance between the power transmitting coil and the power receiving coil by moving at least one of the power transmitting coil and the power receiving coil;

at least one metal housing defining a shielded space, and accommodating the power transmitting coil and the power receiving coil within the shielded space; and at least one ferrite material located within the shielded space and to close the space in which the power transmitting coil and the power receiving coil are located.

2. The plasma processing apparatus of claim 1, wherein the at least one metal housing comprises:

a first metal housing extending from a back side of the power transmitting coil with respect to the power receiving coil, and surrounding an outer circumference of the power transmitting coil; and a second metal housing extending from a back side of the power receiving coil with respect to the power transmitting coil, and surrounding an outer circumference of the power receiving coil.

3. The plasma processing apparatus of claim 1, wherein the at least one metal housing is a single housing that provides the shielded space, extends from a back side of the power transmitting coil with respect to the power receiving coil, extends from a back side of the power receiving coil with respect to the power transmitting coil, and surrounds an outer circumference of the power transmitting coil and an outer circumference of the power receiving coil.

4. The plasma processing apparatus of claim 2, wherein:

the at least one ferrite material comprises:

a first rear portion located on the back side of the power transmitting coil;

a first side wall portion extending from the first rear portion to surround the outer circumference of the power transmitting coil;

a second rear portion located on the back side of the power receiving coil; and a second side wall portion extending from the second rear portion to surround the outer circumference of the power receiving coil, one of the first side wall portion and the second side wall portion extends from an outer side of the other of the first side wall portion and the second side wall portion, the power transmitting coil, the first rear portion, and the first side wall portion form a power transmitting coil assembly, the power receiving coil, the second rear portion, and the second side wall portion form a power receiving coil assembly, and the at least one driving system is configured to move at least one of the power transmitting coil assembly and the power receiving coil assembly.

5. The plasma processing apparatus of claim 4, wherein the at least one driving system moves at least one of the power transmitting coil assembly and the power receiving coil assembly so that one of the first side wall portion and the second side wall portion moves along an outer circumferential surface of the other of the first side wall portion and the second side wall portion.

6. The plasma processing apparatus of claim 3, wherein:

the at least one ferrite material comprises:

a first rear portion located on the back side of the power transmitting coil;

a first side wall portion extending from the first rear portion to surround the outer circumference of the power transmitting coil;

a second rear portion located on the back side of the power receiving coil; and a second side wall portion extending from the second rear portion to surround the outer circumference of the power receiving coil, one of the first side wall portion and the second side wall portion extends from an outer side of the other of the first side wall portion and the second side wall portion, the power transmitting coil, the first rear portion, and the first side wall portion form a power transmitting coil assembly, the power receiving coil, the second rear portion, and the second side wall portion form a power receiving coil assembly, and the at least one driving system to move at least one of the power transmitting coil assembly and the power receiving coil assembly.

7. The plasma processing apparatus of claim 6, wherein the at least one driving system moves at least one of the power transmitting coil assembly and the power receiving coil assembly so that one of the first side wall portion and the second side wall portion moves along an outer circumferential surface of the other of the first side wall portion and the second side wall portion.

8. The plasma processing apparatus of claim 3, wherein:

the at least one ferrite material comprises:

a first rear portion located on the back side of the power transmitting coil;

a second rear portion located on the back side of the power receiving coil;

a side wall portion extending from one of the first rear portion and the second rear portion to surround the power transmitting coil, the power receiving coil, and the other of the first rear portion and the second rear portion, the power transmitting coil and the first rear portion form a power transmitting coil assembly, the power receiving coil and the second rear portion form a power receiving coil assembly, and the at least one driving system to move at least one of the power transmitting coil assembly and the power receiving coil assembly.

9. The plasma processing apparatus of claim 3, wherein:

the at least one ferrite material comprises:

a first rear portion located on the back side of the power transmitting coil;

a second rear portion located on the back side of the power receiving coil;

a side wall portion surrounding the power transmitting coil, the power receiving coil, the first rear portion, and the second rear portion, the power transmitting coil and the first rear portion form a power transmitting coil assembly, the power receiving coil and the second rear portion form a power receiving coil assembly, and the at least one driving system to move at least one of the power transmitting coil assembly and the power receiving coil assembly within an area surrounded by the side wall portion.

10. The plasma processing apparatus of claim 1, wherein the at least one ferrite material comprises at least one inner ferrite material extending from an inner area of the power receiving coil to an inner area of the power transmitting coil.

11. The plasma processing apparatus of claim 1, further comprising:

at least one variable capacitor connected to the power transmitting coil to form a resonant circuit together with the power transmitting coil at a transmission frequency of power transmitted between the power transmitting coil and the power receiving coil; and at least one variable capacitor connected to the power receiving coil to form a resonant circuit together with the power receiving coil at the transmission frequency.

12. The plasma processing apparatus of claim 1, wherein the at least one metal housing comprises:

a first metal housing extending from a back side of the power transmitting coil with respect to the power receiving coil, and surrounding an outer circumference of the power transmitting coil.

13. The plasma processing apparatus of claim 1, wherein the at least one metal housing comprises:

a first metal housing extending from a back side of the power transmitting coil with respect to the power receiving coil, and surrounding an outer circumference of the power transmitting coil; and a second metal housing extending from a back side of the power receiving coil with respect to the power transmitting coil.

14. The plasma processing apparatus of claim 1, wherein the at least one metal housing is a single housing that provides the shielded space.

15. The plasma processing apparatus of claim 1, wherein the at least one metal housing is a single housing that provides the shielded space, and extends from a back side of the power transmitting coil with respect to the power receiving coil.

16. The plasma processing apparatus of claim 1, wherein the at least one metal housing is a single housing that provides the shielded space, extends from a back side of the power transmitting coil with respect to the power receiving coil, and extends from a back side of the power receiving coil with respect to the power transmitting coil.

17. The plasma processing apparatus of claim 2, wherein:

the at least one ferrite material comprises:

a first rear portion located on the back side of the power transmitting coil.

18. The plasma processing apparatus of claim 2, wherein:

the at least one ferrite material comprises:

a first rear portion located on the back side of the power transmitting coil; and a first side wall portion extending from the first rear portion to surround the outer circumference of the power transmitting coil.

19. The plasma processing apparatus of claim 2, wherein:

the at least one ferrite material comprises:

a first rear portion located on the back side of the power transmitting coil;

a first side wall portion extending from the first rear portion to surround the outer circumference of the power transmitting coil; and a second rear portion located on the back side of the power receiving coil.

* * * * *